United States Patent
Hayashi et al.

(10) Patent No.: US 9,412,748 B2
(45) Date of Patent: Aug. 9, 2016

(54) METHOD OF MANUFACTURING SEMICONDUCTOR DEVICE HAVING AN IMPLANTING FROM A SECOND DIRECTION INCLINED RELATIVE TO A FIRST DIRECTION

(71) Applicant: Renesas Electronics Corporation, Koutou-ku, Tokyo (JP)

(72) Inventors: Tomohiro Hayashi, Tokyo (JP); Yoshiyuki Kawashima, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/829,605

(22) Filed: Aug. 18, 2015

(65) Prior Publication Data
US 2016/0064397 A1 Mar. 3, 2016

(30) Foreign Application Priority Data

Aug. 28, 2014 (JP) .................................. 2014-174573

(51) Int. Cl.
| | |
|---|---|
| H01L 21/8238 | (2006.01) |
| H01L 27/115 | (2006.01) |
| H01L 21/266 | (2006.01) |
| H01L 21/265 | (2006.01) |
| H01L 21/3213 | (2006.01) |
| H01L 29/66 | (2006.01) |
| H01L 21/02 | (2006.01) |
| H01L 21/28 | (2006.01) |
| H01L 29/423 | (2006.01) |

(52) U.S. Cl.
CPC .... *H01L 27/11521* (2013.01); *H01L 21/02164* (2013.01); *H01L 21/266* (2013.01); *H01L 21/26513* (2013.01); *H01L 21/28273* (2013.01); *H01L 21/28282* (2013.01); *H01L 21/32133* (2013.01); *H01L 27/11526* (2013.01); *H01L 27/11568* (2013.01); *H01L 27/11573* (2013.01); *H01L 29/4234* (2013.01); *H01L 29/42324* (2013.01); *H01L 29/6656* (2013.01)

(58) Field of Classification Search
CPC ................ H01L 21/105; H01L 21/115; H01L 21/11521; H01L 21/11526
USPC .................................. 438/201, 211
See application file for complete search history.

(56) References Cited

U.S. PATENT DOCUMENTS

2016/0020219 A1* 1/2016 Chuang ............ H01L 27/11573 257/324

FOREIGN PATENT DOCUMENTS

JP 2010-010475 A 1/2010

\* cited by examiner

*Primary Examiner* — Hoai V Pham
(74) *Attorney, Agent, or Firm* — Shapiro, Gabor and Rosenberger, PLLC

(57) ABSTRACT

An improvement is achieved in the performance of a semiconductor device. In a method of manufacturing the semiconductor device, using a control gate electrode and a memory gate electrode which are formed over a semiconductor substrate as a mask, n-type impurity ions are implanted from a direction perpendicular to a main surface of the semiconductor substrate. Then, using the control gate electrode, the memory gate electrode, and first and second sidewall spacers as a mask, other n-type impurity ions are implanted from a direction inclined relative to the direction perpendicular to the main surface of the semiconductor substrate.

15 Claims, 34 Drawing Sheets

| APPLIED VOLTAGES / OPERATIONS | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

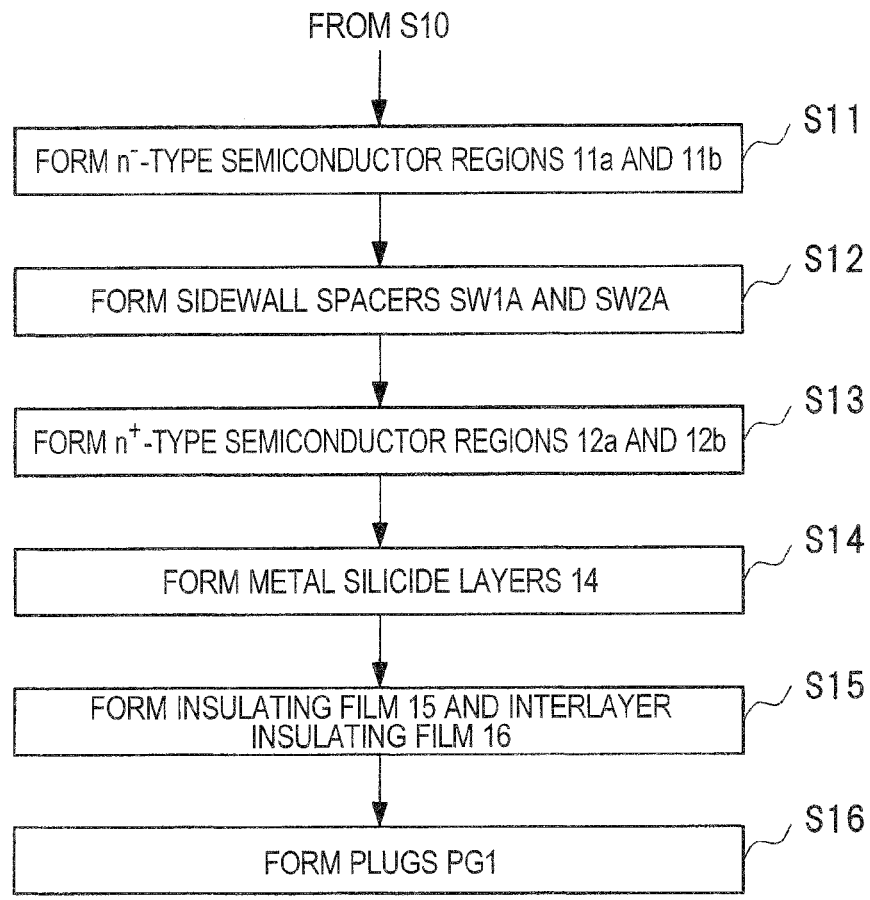
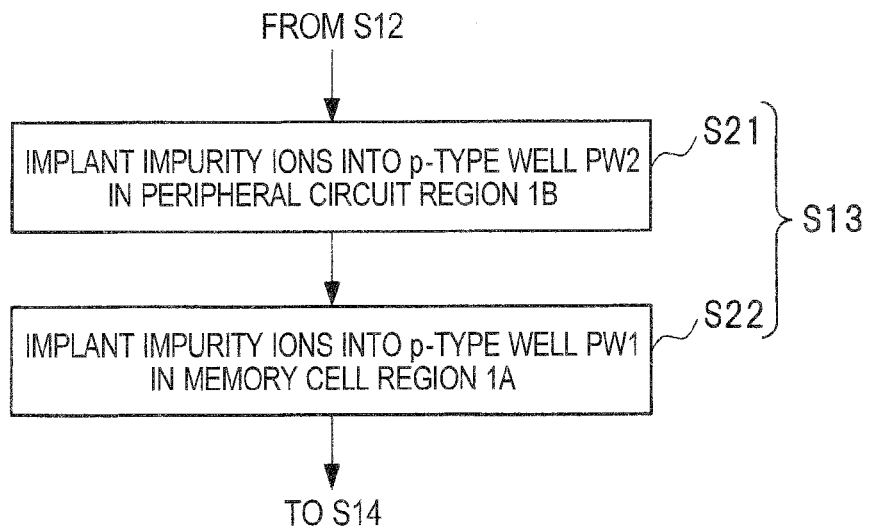

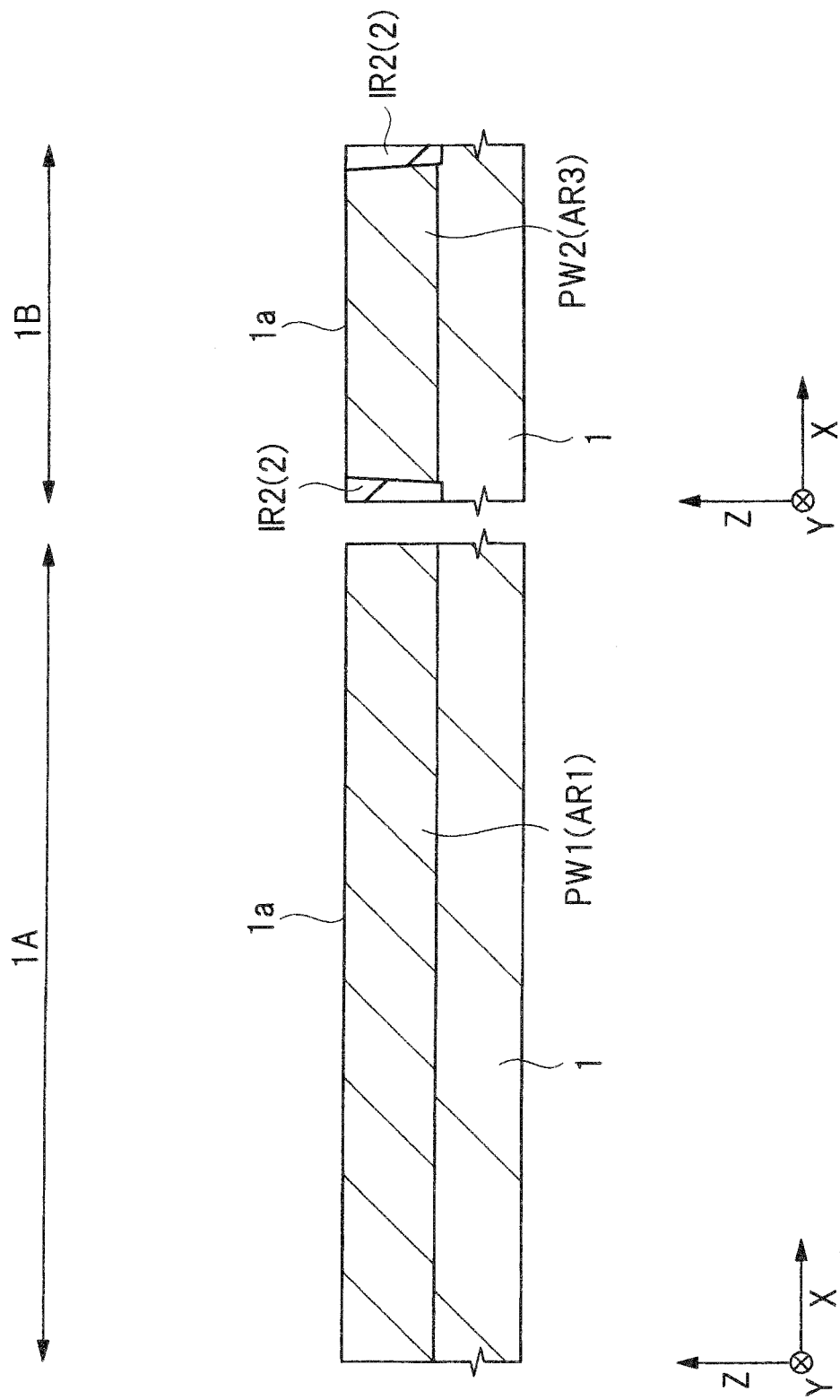

FIG. 25
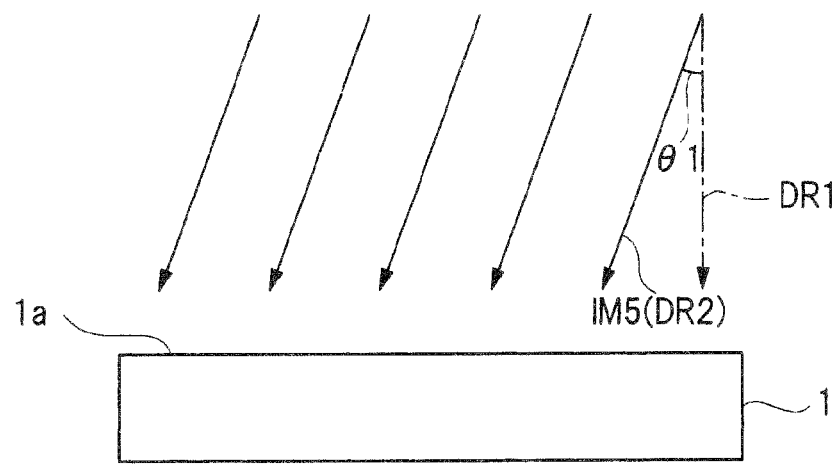
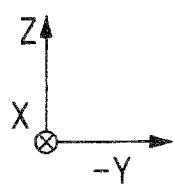
FIG. 26
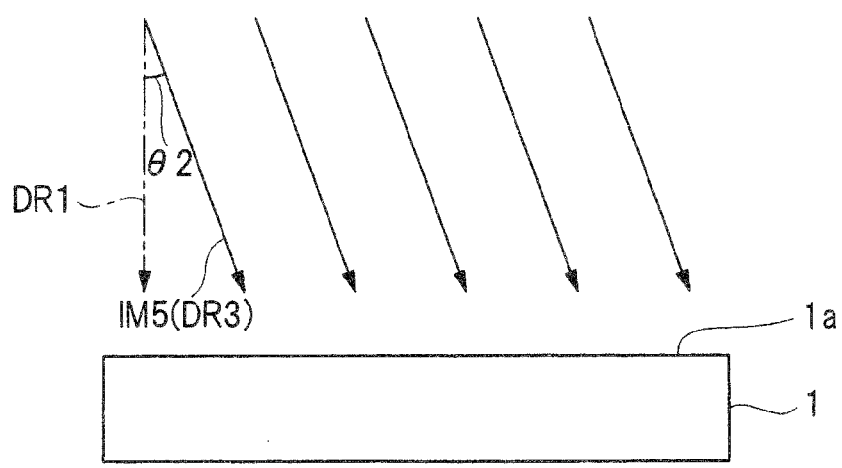
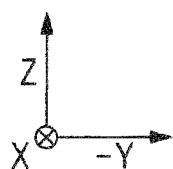

METHOD OF MANUFACTURING SEMICONDUCTOR DEVICE HAVING AN IMPLANTING FROM A SECOND DIRECTION INCLINED RELATIVE TO A FIRST DIRECTION

CROSS-REFERENCE TO RELATED APPLICATIONS

The disclosure of Japanese Patent Application No. 2014-174573 filed on Aug. 28, 2014 including the specification, drawings and abstract is incorporated herein by reference in its entirety.

BACKGROUND

The present invention relates to a method of manufacturing a semiconductor device, which can be used appropriately as, e.g., a method of manufacturing a semiconductor device including a semiconductor element formed in a semiconductor substrate.

A semiconductor device having a memory cell region, and a peripheral circuit region is widely used. In the memory cell region, a memory cell such as, e.g., a nonvolatile memory or the like is formed over a semiconductor substrate. In the peripheral circuit region, a peripheral circuit made of, e.g., a MISFET (Metal Insulator Semiconductor Field Effect Transistor) or the like is formed over the semiconductor substrate.

For example, there is a case where, as a nonvolatile memory, a split-gate memory cell using a MONOS (Metal-Oxide-Nitride-Oxide-Semiconductor) film is formed. At this time, the memory cell is formed of two MISFETs which are a control transistor having a control gate electrode and a memory transistor having a memory gate electrode.

When the gate electrodes of such MISFETs are formed by dry etching, the surface roughness of the side surfaces of the gate electrode may increase to locally vary the gate length.

Japanese Unexamined Patent Publication No. 2010-10475 (Patent Document 1) discloses a technique in which, in a method of manufacturing a semiconductor device, a gate electrode having line edge roughness is formed over an active region and, by oblique ion implantation from two directions inclined in the gate electrode width direction relative to the direction of a normal to a substrate, parts of the recessed portions of the roughness are kept from being subjected to the ion implantation.

RELATED ART DOCUMENT

Patent Document

[Patent Document 1]
Japanese Unexamined Patent Publication No. 2010-10475

SUMMARY

In a split-gate memory cell, one of a source region and a drain region is formed by self-alignment with a sidewall spacer formed over a side surface of a control gate electrode. The other of the source region and the drain region is formed by self-alignment with a sidewall spacer formed over a side surface of a memory gate electrode.

When the distance between the source region and the drain region is reduced by local variations in the gate length described above, the implantation depth of impurity ions is deep in each of the source region and the drain region. As a result, a punch-through due to the diffusion of the impurity ions is likely to occur. That is, the distance between the source region and the drain region is equal to an effective gate length. Consequently, a so-called short-channel effect becomes conspicuous in which a punch-through is more likely to occur in a region where the distance between the source region and the drain region, i.e., effective gate length has locally been reduced due to the reduced effective gate length.

Accordingly, variations in threshold voltage among the plurality of control transistors individually included in a plurality of memory cells increase to increase variations in threshold voltage among the plurality of memory transistors individually included in the plurality of memory cells. As a result, in a semiconductor device having the plurality of memory cells, a failure occurs when data is written to degrade the performance of the semiconductor device.

Other problems and novel features of the present invention will become apparent from a statement in the present specification and the accompanying drawings.

According to an embodiment, in a method of manufacturing a semiconductor device, using a control gate electrode and a memory gate electrode which are formed over a semiconductor substrate as a mask, n-type first impurity ions are implanted from a first direction perpendicular to a main surface of the semiconductor substrate. Next, over a side surface of the control gate electrode opposite to a side surface thereof closer to the memory gate electrode, a first sidewall spacer is formed. Over a side surface of the memory gate electrode opposite to a side surface thereof closer to the control gate electrode, a second sidewall spacer is formed. Next, using the control gate electrode, the memory gate electrode, and the first and second sidewall spacers as a mask, n-type second impurity ions are implanted from a second direction inclined relative to the first direction.

According to the embodiment, the performance of the semiconductor device can be improved.

BRIEF DESCRIPTION OF THE DRAWINGS

FIG. 9 is a process flow chart showing a part of the manufacturing process of the semiconductor device in Embodiment 1;

FIG. 10 is a process flow chart showing a part of the manufacturing process of the semiconductor device in Embodiment 1;

FIG. 11 is a main-portion cross-sectional view of the semiconductor device in Embodiment 1 during the manufacturing process thereof;

FIG. 25 is a view for illustrating the direction in which impurity ions are implanted;

FIG. 26 is a view for illustrating the direction in which impurity ions are implanted;

DETAILED DESCRIPTION

Figure 1:
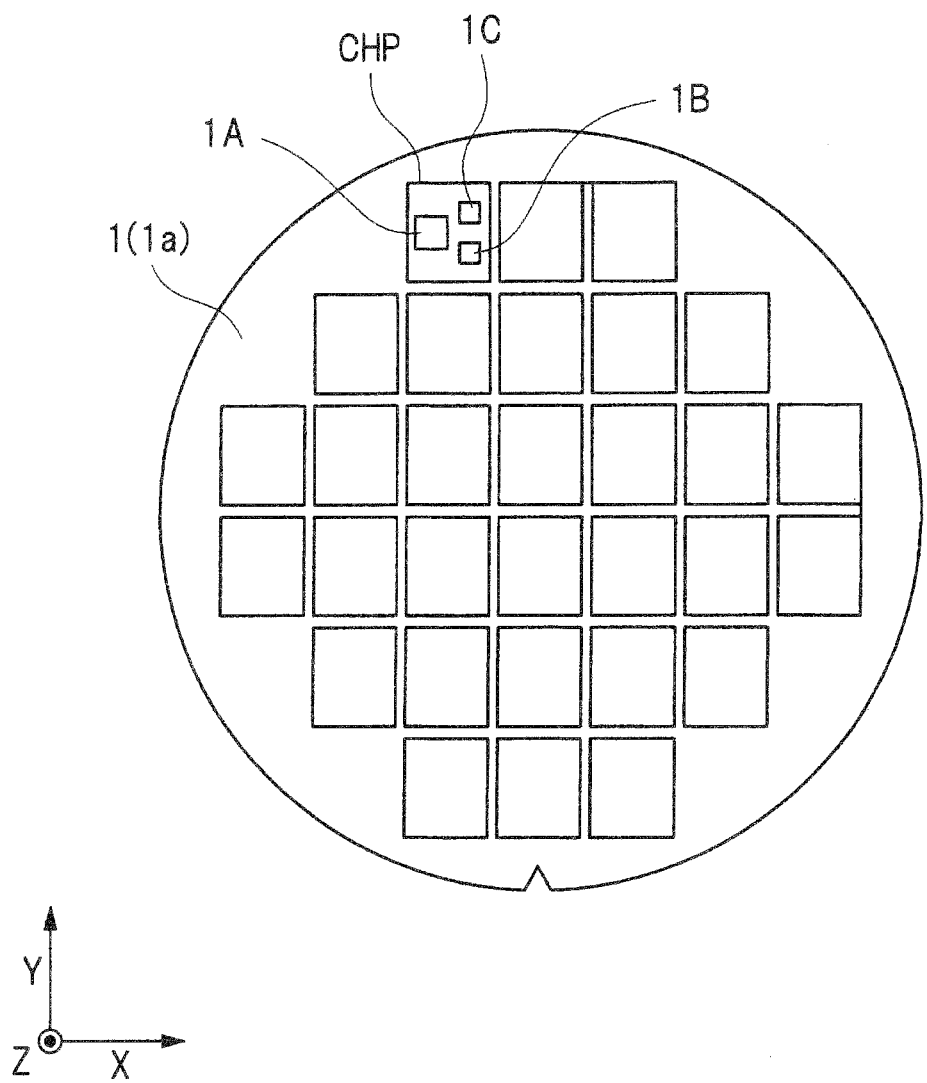
FIG. 1 is a plan view showing a semiconductor substrate and element regions thereof where a semiconductor device in Embodiment 1 is formed.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are mentioned, they are not limited to specific numbers unless particularly explicitly described otherwise or unless they are obviously limited to the specific numbers in principle. The number and the like of the elements may be not less than or not more than specific numbers.

Also in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

The following will describe representative embodiments in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration.

Embodiment 1

Structure of Semiconductor Device

Next, a structure of a semiconductor device in Embodiment 1 will be described with reference to the drawings. FIG.

Figure 2:
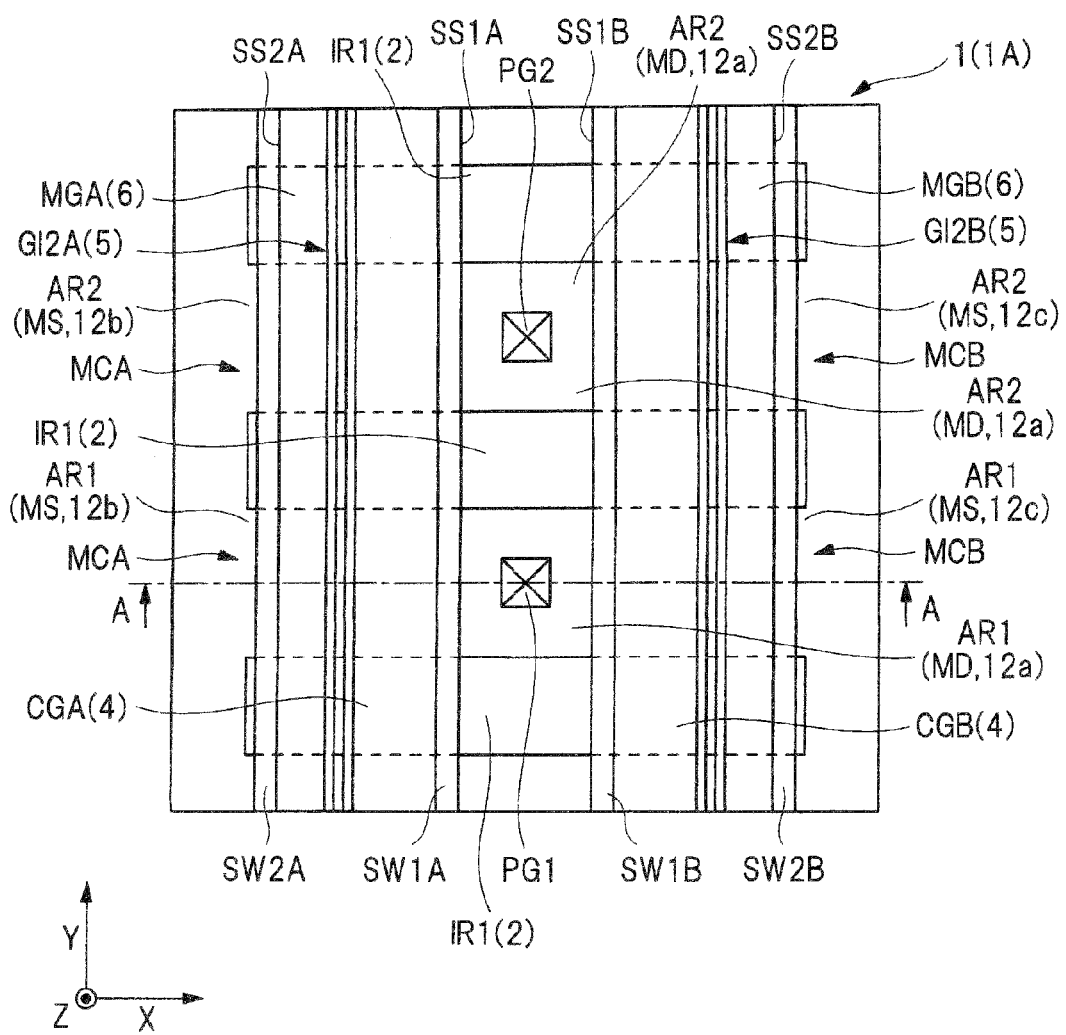
FIG. 2 is a main-portion plan view of the semiconductor device in Embodiment 1.
Figure 3:
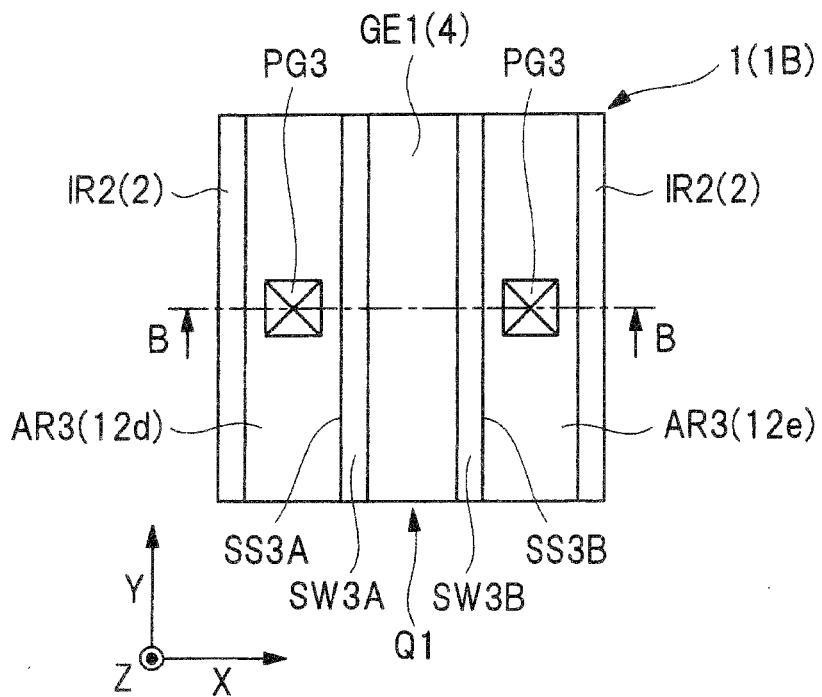
FIG. 3 is a main-portion plan view of the semiconductor device in Embodiment 1.
Figure 4:
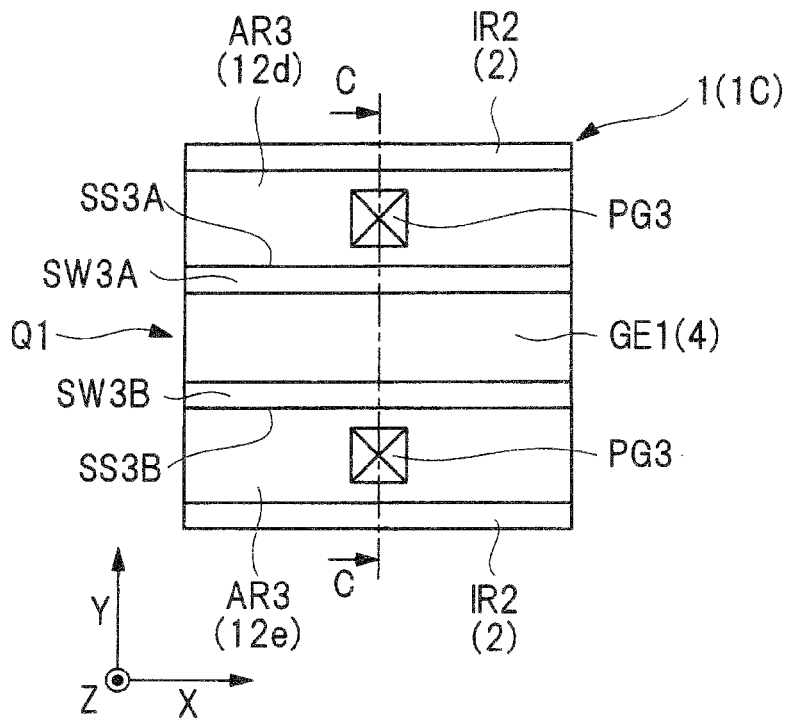
FIG. 4 is a main-portion plan view of the semiconductor device in Embodiment 1.
Figure 5:
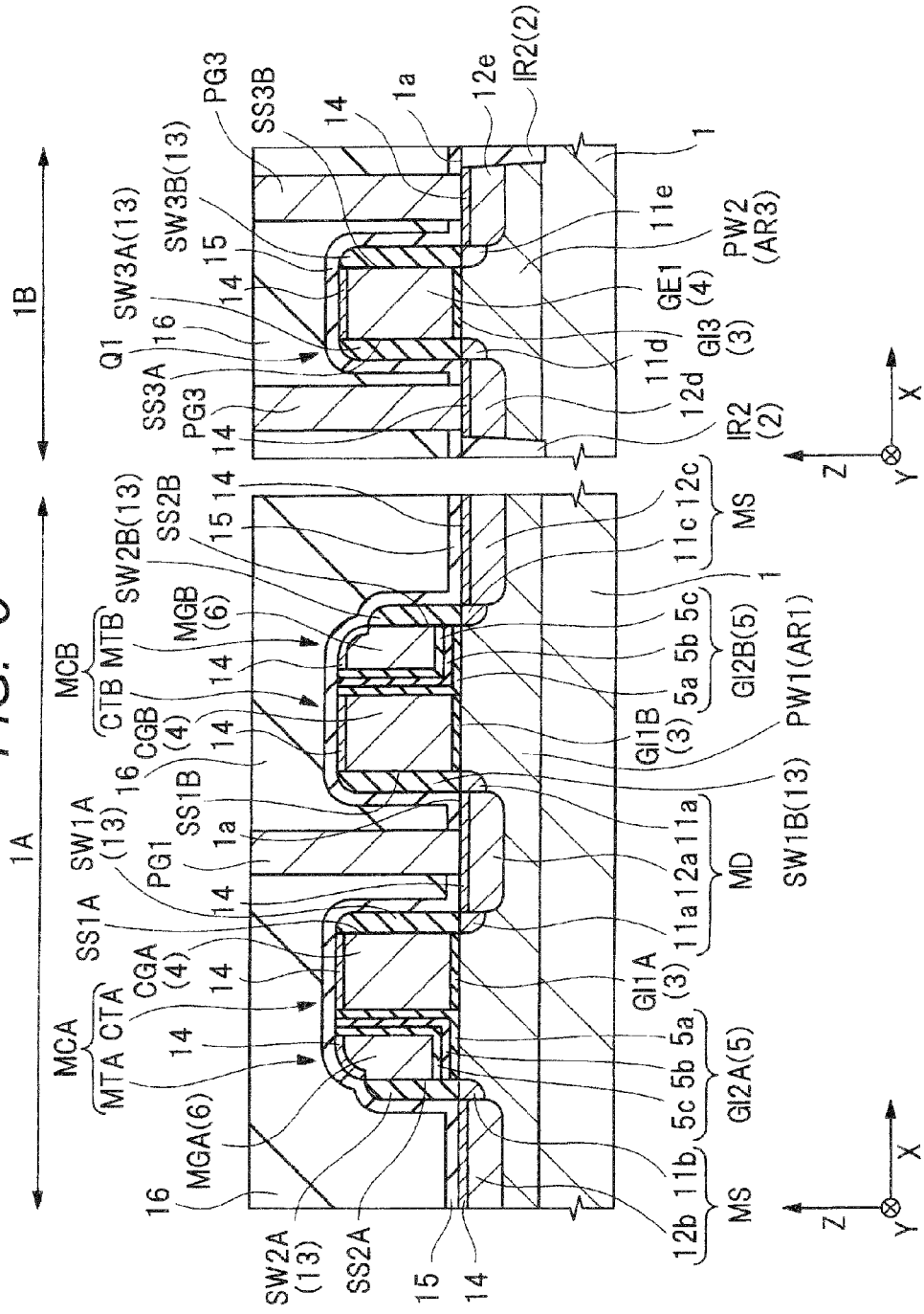
FIG. 5 is a main-portion cross-sectional view of the semiconductor device in Embodiment 1.
Figures 6, 7:
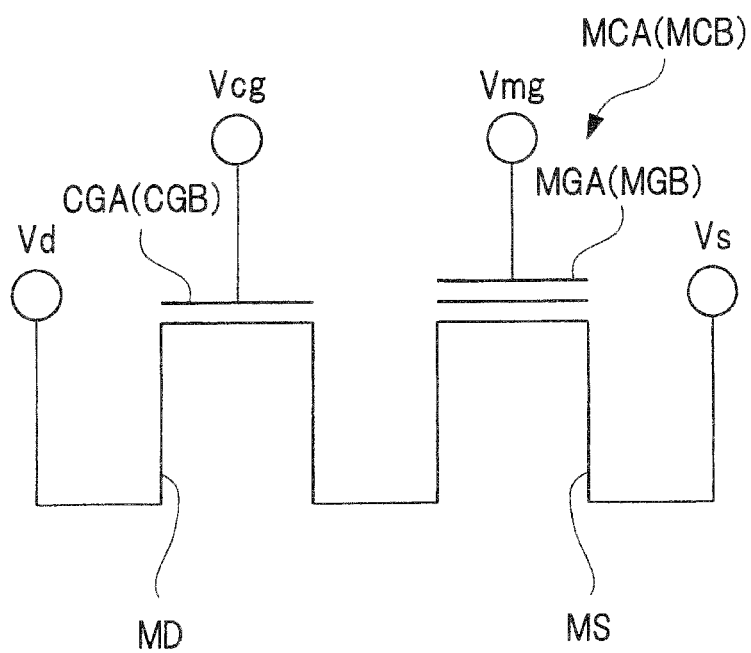
FIG. 6 is an equivalent circuit diagram of a memory cell in the semiconductor device in Embodiment 1.
FIG. 7 is a table showing an example of conditions for the application of voltages to the individual parts of the memory cell during "write", "erase", and "read" operations.

1 is a plan view showing a semiconductor substrate and element regions thereof where the semiconductor device in Embodiment 1 is formed. FIGS. 2 to 4 are main-portion plan views of the semiconductor device in Embodiment 1. FIG. 5 is a main-portion cross-sectional view of the semiconductor device in Embodiment 1. FIG. 6 an equivalent circuit diagram of a memory cell in the semiconductor device in Embodiment 1.

Note that each of FIGS. 2 to 4 shows the semiconductor device in Embodiment 1 in a see-through state where metal silicide layers 14, an insulating film 15, and an interlayer insulating film 16 have been removed. FIG. 5 shows an element structure in a memory cell region 1A which corresponds to a cross section along the line A-A in FIG. 2 and an element structure in a peripheral circuit region 1C which corresponds to a cross section along the line B-B in FIG. 3 in combination. An element structure in a peripheral circuit region 1C which corresponds to a cross section along the line C-C in FIG. 4 is the same as the element structure in the peripheral circuit region 1B which corresponds to the cross section along the line B-B in FIG. 3 except that, in plan view, the element structure in FIG. 4 is at a position after a 90° rotation from the position of the element structure in FIG. 3. Therefore, in FIG. 5, the illustration of the element structure in the peripheral circuit region 1C which corresponds to the line C-C in FIG. 4 is omitted.

As shown in FIG. 1, the semiconductor device includes a semiconductor substrate 1. The semiconductor substrate 1 is a semiconductor wafer made of p-type monocrystalline silicon having a specific resistance of, e.g., about 1 to 10 Ωcm. The semiconductor substrate 1 has, as partial areas of a main surface 1a of the semiconductor substrate 1, a plurality of element regions CHP. It is assumed that two directions each parallel with the main surface 1a of the semiconductor substrate 1 and crossing, preferably orthogonal to, each other are an X-axis direction and a Y-axis direction.

As shown in FIG. 1, in each of the element regions CHP, the semiconductor device has, as a partial area of the main surface 1a of the semiconductor substrate 1, the memory cell region 1A and the peripheral circuit regions 1B and 1C. As shown in FIG. 2, in the memory cell region 1A, memory cells MCA and MCB are formed. As shown in FIGS. 3 and 4, in each of the peripheral circuit regions 1B and 1C, a MISFET Q1 is formed. Here, the peripheral circuits are circuits other than the nonvolatile memory such as, e.g., a processor such as a CPU (Central Processing Unit), a control circuit, a sense amplifier, a column decoder, a row decoder, and an input/output circuit. The MISFET Q1 formed in each of the peripheral circuit regions 1B and 1C is a peripheral circuit MISFET.

Note that, as shown in FIGS. 1, 3, and 4, in the peripheral circuit region 1B, a gate electrode GE1 extends in the Y-axis direction in plan view while, in the peripheral circuit region 1C, the gate electrode GE1 extends in the X-axis direction in plan view.

Next, referring to FIGS. 2 and 5, a configuration of the memory cells MCA and MCB formed in the memory cell region 1A will specifically be described.

In the memory cell region 1A, the semiconductor device has active regions AR1 and AR2, and isolation regions IR1. The active regions AR1 and AR2 are each formed in the main surface 1a of the semiconductor substrate 1 to extend in the X-axis direction in the main surface 1a of the semiconductor substrate 1. The active regions AR1 and AR2 are disposed in the main surface 1a of the semiconductor substrate 1 to be spaced apart from each other along the Y-axis direction.

On the main surface 1a side of the semiconductor substrate and between the active regions AR1 and AR2, the isolation region IR1 is formed. The isolation region IR1 is formed between the active regions AR1 and AR2 to extend in the X-axis direction in the main surface 1a of the semiconductor substrate 1. The isolation region IR1 is for isolating elements. In the isolation region IR1, an isolation film 2 is formed.

As shown in FIG. 2, along the Y-axis direction, the active regions AR1 and AR2 are disposed to be spaced apart from each other along the Y-axis direction. However, the active regions AR1 and AR2 may also be connected to each other to provide one whole active region. That is, it may also be possible that, in a local area of one active region in the main surface 1a of the semiconductor substrate 1, the isolation region IR1 is formed to extend in the X-axis direction, and consequently the active regions AR1 and AR2 are disposed to be spaced apart from each other along the Y-axis direction.

The active regions AR1 and AR2 are defined, i.e., demarcated by the isolation regions IR1. As shown in FIG. 5, in the active region AR1, a p-type well PW1 is formed and, in the active region AR2 also, in the same manner as in the active region AR1, the p-type well PW1 is formed, though the illustration thereof is omitted. That is, the active regions AR1 and AR2 are regions in each of which the p-type well PW1 is formed. The p-type well PW1 has a p-type conductivity type.

Thus, in the Y-axis direction in FIG. 2, the plurality of active regions and the plurality of isolation regions are alternately arranged to form rows of the active regions. The plurality of rows of the active regions are disposed in the X-axis direction in FIG. 2.

In the active region AR1, the two memory cells MCA and MCB each as the nonvolatile memory are formed in the p-type well PW1. Each of the memory cells MCA and MCB is a split-gate memory cell.

As shown in FIG. 5, the memory cell MCA includes a control transistor CTA having a control gate electrode CGA, and a memory transistor MTA having a memory gate electrode MGA and coupled to the control transistor CTA. The memory cell MCB includes a control transistor CTB having a control gate electrode CGB, and a memory transistor MTB having a memory gate electrode MGB and coupled to the control transistor CTB. The two memory cells MCA and MCB share a semiconductor region MD functioning as a drain region.

As shown in FIG. 2, over the active region AR2 also, in the same manner as over the active region AR1, the two memory cells MCA and MCB are formed. In the active region AR2 also, in the same manner as in the active region AR1, the two memory cells MCA and MCB share the semiconductor region MD functioning as the drain region, though the illustration thereof is omitted. Thus, the plurality of memory cells MCA and the plurality of memory cells MCB are arranged in the Y-axis direction to form memory cell rows. The plurality of memory cell rows including the plurality of memory cells MCA and the plurality of memory cells MCB which are arranged in the Y-axis direction are disposed in the X-axis direction in FIG. 2. Thus, in plan view, the plurality of memory cells are formed to be arranged in the X-axis direction and in the Y-axis direction in an array configuration.

Note that, in the present specification, the wording "in plan view" means that an object is viewed from a direction perpendicular to the main surface 1a of the semiconductor substrate 1. Note that the wording "in the main surface 1a of the semiconductor substrate 1" used above also means that an object is viewed from a direction perpendicular to the main surface 1a of the semiconductor substrate 1.

As shown in FIGS. 2 and 5, the memory cells MCA and MCB are disposed substantially symmetrically relative to the semiconductor region MD interposed therebetween and functioning as the drain region. The memory cells MCA and MCB are disposed to be arranged along the X-axis direction in FIG. 2.

The memory cell MCA has an n-type semiconductor region MS, the n-type semiconductor region MD, the control gate electrode CGA, and the memory gate electrode MGA. Each of the n-type semiconductor region MS and the n-type semiconductor region MD has an n-type conductivity type opposite to the p-type conductivity type. The memory cell MCA also includes a gate insulating film GI1A formed between the control gate electrode CGA and the semiconductor substrate 1, and a gate insulating film GI2A formed between the memory gate electrode MGA and the semiconductor substrate 1 and between the memory gate electrode MGA and the control gate electrode CGA. That is, the memory cell MCA is formed of the gate insulating film GI1A, the control gate electrode CGA, the memory gate electrode MGA, and the gate insulating film GI2A.

Note that the memory cell MCA may also have a cap insulating film formed over the control gate electrode CGA.

The memory cell MCB includes the n-type semiconductor region MS, the n-type semiconductor region MD, the control gate electrode CGB, and the memory gate electrode MGB. Each of the n-type semiconductor region MS and the n-type semiconductor region MD has the n-type conductivity type opposite to the p-type conductivity type. The memory cell MCB also includes a gate insulating film GI1B formed between the control gate electrode CGB and the semiconductor substrate 1, and a gate insulating film GI2B formed between the memory gate electrode MGB and the semiconductor substrate 1 and between the memory gate electrode MGB and the control gate electrode CGB. That is, the memory cell MCB is formed of the gate insulating film GI1B, the control gate electrode CGB, the memory gate electrode MGB, and the gate insulating film GI2B.

Note that the memory cell MCB may also have a cap insulating film formed over the control gate electrode CGB.

In the memory cell MCA, the control gate electrode CGA and the memory gate electrode MGA are juxtaposed to extend along the main surface 1a of the semiconductor substrate 1 in a state where the gate insulating film GI2A is interposed between the side surfaces, i.e., side walls thereof facing each other. The direction in which each of the control gate electrode CGA and the memory gate electrode MGA extends is a Y-axis direction in FIG. 2.

In the memory cell MCB, the control gate electrode CGB and the memory gate electrode MGB are juxtaposed to extend along the main surface 1a of the semiconductor substrate 1 in a state where the gate insulating film GI2B is interposed between the side surfaces, i.e., side walls thereof facing each other. The direction in which each of the control gate electrode CGB and the memory gate electrode MGB extends is the Y-axis direction in FIG. 2.

The control gate electrode CGA, the memory gate electrode MGA, and the gate insulating film GI2A are formed so as to extend over the active region AR1, the isolation region IR1, and the active region AR2 along the Y-axis direction. The control gate electrode CGB, the memory gate electrode MGB, and the gate insulating film GI2B are formed so as to extend over the active region AR1, the isolation region IR1, and the active region AR2 along the Y-axis direction.

Note that the X-axis direction in FIG. 2 is the gate length direction of each of the control gate electrode CGA, the memory gate electrode MGA, the control gate electrode CGB, and the memory gate electrode MGB. On the other hand, the Y-axis direction in FIG. 2 is also the gate width direction of each of the control gate electrode CGA, the memory gate electrode MGA, the control gate electrode CGB, and the memory gate electrode MGB.

The control gate electrode CGA is formed over the p-type well PW1 between the semiconductor regions MD and MS, i.e., over the semiconductor substrate 1 via the gate insulating film GI1A. The memory gate electrode MGA is formed over the p-type well PW1 between the semiconductor regions MD and MS, i.e., over the semiconductor substrate 1 via the gate insulating film GI2A. The memory gate electrode MGA is disposed closer to the semiconductor region MS, while the control gate electrode CGA is disposed closer to the semiconductor region MD. The control gate electrode CGA and the memory gate electrode MGA are gate electrodes included in the memory cell MCA, i.e., the nonvolatile memory.

The control gate electrode CGB is formed over the p-type well PW1 between the semiconductor regions MD and MS, i.e., over the semiconductor substrate 1 via the gate insulating film GI1B. The memory gate electrode MGB is formed over the p-type well PW1 between the semiconductor regions MD and MS, i.e., over the semiconductor substrate 1 via the gate insulating film GI2B. The memory gate electrode MGB is disposed closer to the semiconductor region MS, while the control gate electrode CGB is disposed closer to the semiconductor region MD. The control gate electrode CGB and the memory gate electrode MGB are gate electrodes included in the memory cell MCB, i.e., the nonvolatile memory.

The control gate electrode CGA and the memory gate electrode MGA are adjacent to each other with the gate insulating film GI2A being interposed therebetween. The memory gate electrode MGA is formed in a sidewall spacer shape over the side surface of the control gate electrode CGA via the gate insulating film GI2A. The gate insulating film GI2A is formed to extend over two regions which are the region between the memory gate electrode MGA and the p-type well PW1 of the semiconductor substrate 1 and the region between the memory gate electrode MGA and the control gate electrode CGA.

The control gate electrode CGB and the memory gate electrode MGB are adjacent to each other with the gate insulating film GI2B being interposed therebetween. The memory gate electrode MGB is formed in a sidewall spacer shape over the side surface of the control gate electrode CGB via the gate insulating film GI2B. The gate insulating film GI2B is formed to extend over two regions which are the region between the memory gate electrode MGB and the p-type well PW1 of the semiconductor substrate 1 and the region between the memory gate electrode MGB and the control gate electrode CGB.

Note that the wording "something is formed over a side surface of an electrode" means that something is formed outwardly and laterally of the side surface of the electrode.

The memory gate electrode MGA is disposed over the main surface 1a of the semiconductor substrate 1 to be opposite to the control gate electrode CGB relative to the control gate electrode CGA interposed therebetween. On the other hand, the memory gate electrode MGB is disposed over the main surface 1a of the semiconductor substrate 1 to be opposite to the control gate electrode CGA relative to the control gate electrode CGB interposed therebetween.

The gate insulating film GI1A formed between the control gate electrode CGA and the p-type well PW1 functions as the gate insulating film of the control transistor CTA. The gate insulating film GI2A between the memory gate electrode MGA and the p-type well PW1 functions as the gate insulating film of the memory transistor MTA.

The gate insulating film GI1B formed between the control gate electrode CGB and the p-type well PW1 functions as the gate insulating film of the control transistor CTB. The gate insulating film GI2B between the memory gate electrode MGB and the p-type well PW1 functions as the gate insulating film of the memory transistor MTB.

Each of the gate insulating films GI1A and GI1B is made of an insulating film 3. The insulating film 3 is made of an insulating film such as a silicon dioxide film, a silicon nitride film, or a silicon oxynitride film. Preferably, the insulating film 3 is made of a high-dielectric-constant film, i.e., so-called High-k film having a specific permittivity higher than that of a silicon nitride film. Note that, when a High-k film or high-dielectric-constant film is mentioned in the present application, the film means a film having a dielectric constant (specific permittivity) higher than that of a silicon nitride film. When the insulating film 3 is a high-dielectric-constant film, as the insulating film 3, a metal oxide film such as, e.g., a hafnium oxide film, a zirconium oxide film, an aluminum oxide film, a tantalum oxide film, or a lanthanum oxide film can be used.

The gate insulating film GI2A between the memory gate electrode MGA and the p-type well PW1 and the gate insulating film GI2B between the memory gate electrode MGB and the p-type well PW1 functions as the gate insulating films of memory transistors. On the other hand, the gate insulating film GI2A between the memory gate electrode MGA and the control gate electrode CGA functions as an insulating film for providing insulation, i.e., electrical isolation between the memory gate electrode MGA and the control gate electrode CGA. The gate insulating film GI2B between the memory gate electrode MGB and the control gate electrode CGB functions as an insulating film for providing insulation, i.e., electrical isolation between the memory gate electrode MGB and the control gate electrode CGB.

Each of the gate insulating films GI2A and GI2B is made of an insulating film 5. The insulating film 5 is a laminated film including, e.g., a silicon dioxide film 5a, a silicon nitride film 5b as a charge storage portion over the silicon dioxide film 5a, and a silicon dioxide film 5c over the silicon nitride film 5b.

Of the insulating film 5, the silicon nitride film 5b is an insulating film for storing charges and functions as the charge storage portion. That is, the silicon nitride film 5b is a trapping insulating film formed in the insulating film 5. Therefore, the insulating film 5 can be regarded as an insulating film having an internal charge storage portion.

The silicon dioxide films 5c and 5a located over and under the silicon nitride film 5b function as charge blocking layers which confine charges thereto. By providing a structure in which the silicon nitride film 5b is interposed between the silicon dioxide films 5c and 5a, charges can be stored in the silicon nitride film 5b. The silicon dioxide film 5a, the silicon nitride film 5b, and the silicon dioxide film 5c can be regarded as an ONO (Oxide-Nitride-Oxide) film as a part of a MONOS film.

Each of the control gate electrodes CGA and CGB is made of a conductive film 4 such as an n-type polysilicon film which is, e.g., a polycrystalline silicon film into which an n-type impurity has been introduced. Each of the memory gate electrodes MGA and MGB is made of a conductive film 6 such as an n-type polysilicon film which is, e.g., a polycrystalline silicon film into which an n-type impurity has been introduced.

The memory gate electrode MGA is formed by anisotropically etching, i.e., etching back the conductive film 6 made of, e.g., a silicon film formed over the semiconductor substrate 1 so as to cover the control gate electrode CGA. The memory gate electrode MGA is formed by leaving the conductive film 6 over a side surface SS0A of the control gate electrode CGA opposite to the side surface thereof closer to the control gate electrode CGB via the gate insulating film GI2A. Consequently, the memory gate electrode MGA is formed in a sidewall spacer shape over the side surface SS0A of the control gate electrode CGA via the gate insulating film GI2A.

The memory gate electrode MGB is formed by anisotropically etching, i.e., etching back the conductive film 6 made of, e.g., a silicon film formed over the semiconductor substrate 1 so as to cover the control gate electrode CGB. The memory gate electrode MGB is formed by leaving the conductive film 6 over a side surface SS0B of the control gate electrode CGB opposite to the side surface thereof closer to the control gate electrode CGA via the gate insulating film GI2B. Consequently, the memory gate electrode MGB is formed in a sidewall spacer shape over the side surface SS0B of the control gate electrode CGB via the gate insulating film GI2B.

Over a side surface SS1A of the control gate electrode CGA opposite to the side surface thereof closer to the memory gate electrode MGA, a sidewall spacer SW1A is formed. Over a side surface SS2A of the memory gate electrode MGA opposite to the side surface thereof closer to the control gate electrode CGA, a sidewall spacer SW2A is formed. Over a side surface SS1B of the control gate electrode CGB opposite to the side surface thereof closer to the memory gate electrode MGB, a sidewall spacer SW1B is formed. Over a side surface SS2B of the memory gate electrode MGB opposite to the side surface thereof closer to the control gate electrode CGB, a sidewall spacer SW2B is formed. Each of the sidewall spacers SW1A, SW1B, SW2A, and SW2B is made of an insulating film 13 such as a silicon dioxide film, a silicon nitride film, or a laminated film thereof.

Note that, between the control gate electrode CGA and the sidewall spacer SW1A and between the memory gate electrode MGA and the sidewall spacer SW2A, side-wall insulating films not shown may also be interposed. Also, between the control gate electrode CGB and the sidewall spacer SW1B and between the memory gate electrode MGB and the sidewall spacer SW2B, side-wall insulating films not shown may also be interposed.

The semiconductor region MS functions as one of a source region and a drain region. The semiconductor region MD functions as the other of the source region and the drain region. Here, the semiconductor region MS functions as, e.g., the source region, while the semiconductor region MD functions as, e.g., the drain region. Each of the semiconductor regions MS and MD is made of a semiconductor region into which an n-type impurity has been introduced and has an LDD (Lightly doped drain) structure.

The drain semiconductor region MD includes $n^-$-type semiconductor regions 11a each as a lower-concentration diffusion layer, and an $n^+$-type semiconductor region 12a as a higher-concentration diffusion layer having an impurity concentration higher than those of the $n^-$-type semiconductor regions 11a. The source semiconductor region MS of the memory cell MCA includes an $n^-$-type semiconductor region 11b as a lower-concentration diffusion layer, and an $n^+$-type semiconductor region 12b as a higher-concentration diffusion layer having an impurity concentration higher than that of the $n^-$-type semiconductor region 11b. On the other hand, the source semiconductor region MS of the memory cell MCB includes an $n^-$-type semiconductor region 11c each as a lower-concentration diffusion layer, and an $n^+$-type semiconductor region 12c as a higher-concentration diffusion layer having an impurity concentration higher than that of the $n^-$-type semiconductor region 11c. The $n^+$-type semiconductor region 12a has a junction depth deeper than those of the n⁻-type semiconductor regions 11a and the impurity concentration higher than those thereof. The n⁺-type semiconductor region 12b has a junction depth deeper than that of the n⁻-type semiconductor region 11b and the impurity concentration higher than that thereof. The n⁺-type semiconductor region 12c has a junction depth deeper than that of the n⁻-type semiconductor region 11c and the impurity concentration higher than that thereof.

Of the two n⁻-type semiconductor regions 11a each as the drain region, one is formed by self-alignment with the side surface SS1A of the control gate electrode CGA opposite to the side surface thereof closer to the memory gate electrode MGA and the other is formed by self-alignment with the side surface SS1B of the control gate electrode CGB opposite to the side surface thereof closer to the memory gate electrode MGB. That is, of the two n⁻-type semiconductor regions 11a, one is formed in the upper-layer portion of the part of the p-type well PW1 which is located opposite to the memory gate electrode MGA relative to the control gate electrode CGA interposed therebetween and the other is formed in the upper-layer portion of the part of the p-type well PW1 which is located opposite to the memory gate electrode MGB relative to the control gate electrode CGB interposed therebetween.

The n⁺-type semiconductor region 12a as the drain region is formed by self-alignment with the side surface of the sidewall spacer SW1A formed over the side surface SS1A of the control gate electrode CGA and also formed by self-alignment with the side surface of the sidewall spacer SW1B formed over the side surface SS1B of the control gate electrode CGB. That is, the n⁺-type semiconductor region 12a is formed in the upper-layer portion of the part of the p-type well PW1 which is located opposite to the control gate electrode CGA relative to the sidewall spacer SW1A interposed therebetween and also located opposite to the control gate electrode CGB relative to the sidewall spacer SW1B interposed therebetween.

As a result, of the two lower-concentration n⁻-type semiconductor regions 11a, one is formed under the sidewall spacer SW1A formed over the side surface SS1A of the control gate electrode CGA and the other is formed under the sidewall spacer SW1B formed over the side surface SS1B of the control gate electrode CGB. The higher-concentration n⁺-type semiconductor region 12a is formed between the two lower-concentration n⁻-type semiconductor regions 11a formed closer to the respective control gate electrodes CGA and CGB. That is, the control transistor CTA of the memory cell MCA and the control transistor CTB of the memory cell MCB share the higher-concentration n⁺-type semiconductor region 12a.

Under the gate insulating film GI2A under the memory gate electrode MGA, the channel region of the memory transistor MTA is formed. Under the gate insulating film GI1A under the control gate electrode CGA, the channel region of the control transistor CTA is formed. Under the gate insulating film GI2B under the memory gate electrode MGB, the channel region of the memory transistor MTB is formed. Under the gate insulating film GI1B under the control gate electrode CGB, the channel region of the control transistor CTB is formed.

Thus, of the two lower-concentration n⁻-type semiconductor regions 11a, one is formed so as to be adjacent to the channel region of the control transistor CTA and the other is formed so as to be adjacent to the channel region of the control transistor CTB. On the other hand, the higher-concentration n⁺-type semiconductor region 12a is formed so as to be in contact with each of the two lower-concentration n⁻-type semiconductor regions 11a and spaced apart from the channel region of the control transistor CTA by the distance corresponding to the n⁻-type semiconductor region 11a. The higher-concentration n⁺-type semiconductor region 12a is also formed so as to be spaced apart from the channel region of the control transistor CTB by the distance corresponding to the n⁻-type semiconductor region 11a.

In the memory cell MCA, the n⁻-type semiconductor region 11b as the source region is formed by self-alignment with the side surface SS2A of the memory gate electrode MGA opposite to the side surface thereof closer to the control gate electrode CGA. On the other hand, in the memory cell MCB, the n⁻-type semiconductor region 11c as the source region is formed by self-alignment with the side surface SS2B of the memory gate electrode MGB opposite to the side surface thereof closer to the control gate electrode CGB. That is, the n⁻-type semiconductor region 11b is formed in the upper-layer portion of the part of the p-type well PW1 which is located opposite to the control gate electrode CGA relative to the memory gate electrode MGA interposed therebetween. On the other hand, the n⁻-type semiconductor region 11c is formed in the upper-layer portion of the part of the p-type well PW1 which is located opposite to the control gate electrode CGB relative to the memory gate electrode MGB interposed therebetween.

In the memory cell MCA, the n⁺-type semiconductor region 12b as the source region is formed by self-alignment with the side surface of the sidewall spacer SW2A formed over the side surface SS2A of the memory gate electrode MGA. On the other hand, in the memory cell MCB, the n⁺-type semiconductor region 12c as the source region is formed by self-alignment with the side surface of the sidewall spacer SW2B formed over the side surface SS2B of the memory gate electrode MGB. That is, the n⁺-type semiconductor region 12b is formed in the upper-layer portion of the part of the p-type well PW1 which is located opposite to the memory gate electrode MGA relative to the sidewall spacer SW2A interposed therebetween. On the other hand, the n⁺-type semiconductor region 12c is formed in the upper-layer portion of the part of the p-type well PW1 which is located opposite to the memory gate electrode MGB relative to the sidewall spacer SW2B interposed therebetween.

Consequently, the lower-concentration n⁻-type semiconductor region 11b is formed under the sidewall spacer SW2A formed over the side surface SS2A of the memory gate electrode MGA, while the lower-concentration n⁻-type semiconductor region 11c is formed under the sidewall spacer SW2B formed over the side surface SS2B of the memory gate electrode MGB. Also, the higher-concentration n⁺-type semiconductor region 12b is formed outside the lower-concentration n⁻-type semiconductor region 11b, while the higher-concentration n⁺-type semiconductor region 12c is formed outside the lower-concentration n⁻-type semiconductor region 11c.

Thus, the lower-concentration n⁻-type semiconductor region 11b is formed so as to be adjacent to the channel region of the memory transistor MTA, while the higher-concentration n⁺-type semiconductor region 12b is formed so as to be in contact with the lower-concentration n⁻-type semiconductor region 11b and spaced apart from the channel region of the memory transistor MTA by the distance corresponding to the n⁻-type semiconductor region 11b. Also, the lower-concentration n⁻-type semiconductor region 11c is formed so as to be adjacent to the channel region of the memory transistor MTB, while the higher-concentration n⁺-type semiconductor region 12c is formed so as to be in contact with the lower-concentration n⁻-type semiconductor region 11c and spaced apart from the channel region of the memory transistor MTB by the distance corresponding to the n⁻-type semiconductor region 11c.

Over each of the n⁺-type semiconductor regions 12a, 12b, and 12c, i.e., over the upper surface of each of the n⁺-type semiconductor regions 12a, 12b, and 12c, the metal silicide layer 14 is formed using a salicide (Self Aligned Silicide) technique or the like. The metal silicide layer 14 is made of, e.g., a cobalt silicide layer, a nickel silicide layer, a platinum-added nickel silicide layer, or the like. The metal silicide layer 14 allows reductions in diffusion resistance and contact resistance.

The metal silicide layer 14 may also be formed entirely or partially over the upper surface of any of the control gate electrodes CGA and CGB and the memory gate electrodes MGA and MGB.

Next, referring to FIGS. 3 and 5, a configuration of the MISFET Q1 formed in the peripheral circuit region 1B will specifically be described.

In the peripheral circuit region 1B, the semiconductor device has an active region AR3 and an isolation region IR2. The isolation region IR2 is for isolating an element. In the isolation region IR2, the isolation film 2 is formed. The active region AR3 is defined, i.e., demarcated by the isolation region IR2 and electrically isolated from another active region by the isolation region IR2. In the active region AR3, a p-type well PW2 is formed. That is, the active region AR3 is the region where the p-type well PW2 is formed. The p-type well PW2 has the p-type conductivity type.

As shown in FIG. 5, in the p-type well PW2 in the peripheral circuit region 1B, the MISFET Q1 is formed. In the peripheral circuit region 1B, a plurality of the MISFETs Q1 are actually formed. FIG. 5 shows a cross section of one of the MISFETs Q1 perpendicular to the gate width direction.

As shown in FIG. 5, the MISFET Q1 has a semiconductor region including an n⁻-type semiconductor region 11d and an n⁺-type semiconductor region 12d, a semiconductor region including an n⁻-type semiconductor region 11e and an n⁺-type semiconductor region 12e, a gate insulating film GI3 formed over the p-type well PW2, and the gate electrode GE1 formed over the gate insulating film GI3. Each of the n⁻-type semiconductor regions 11d and 11e and the n⁺-type semiconductor regions 12d and 12e has the n-type conductivity type opposite to the p-type conductivity type.

The gate insulating film GI3 is made of the insulating film 3. The gate insulating film GI3 functions as the gate insulating film of the MISFET Q1. As the insulating film 3, the insulating film formed in the same layer as that of the insulating film 3 of each of the memory cells MCA and MCB can be used.

The gate electrode GE1 is made of the conductive film 4. As the conductive film 4, the conductive film formed in the same layer as that of the conductive film 4 of each of the memory cells MCA and MCB can be used.

Over a side surface SS3A of the gate electrode GE1 which is located on one side thereof in the X-axis direction, a sidewall spacer SW3A is formed. Over a side surface SS3B of the gate electrode GE1 which is located on a side thereof opposite to the one side in the X-axis direction, a sidewall spacer SW3B is formed. Each of the sidewall spacers SW3A and SW3B is made of the insulating film 13 such as a silicon dioxide film, a silicon nitride film, or a laminated film thereof.

The semiconductor region including the n⁻-type semiconductor region 11d and the n⁺-type semiconductor region 12d functions as one of a source region and a drain region. The semiconductor region including n⁻-type semiconductor region 11e and the n⁺-type semiconductor region 12e functions as the other of the source region and the drain region.

Each of the semiconductor region including the n⁻-type semiconductor region 11d and the n⁺-type semiconductor region 12d and the semiconductor region including n⁻-type semiconductor region 11e and the n⁺-type semiconductor region 12e includes an LDD structure, similarly to the semiconductor regions MS and MD of the memory cells MCA and MCB. The n⁺-type semiconductor region 12d has a junction depth larger than that of the n⁻-type semiconductor region 11d and an impurity concentration higher than that thereof. The n⁺-type semiconductor region 12e has a junction depth larger than that of the n⁻-type semiconductor region 11e and an impurity concentration higher than that thereof.

The n⁻-type semiconductor region 11d is formed by self-alignment with the side surface SS3A of the gate electrode GE1 which is located on one side thereof. The n⁻-type semiconductor region 11e is formed by self-alignment with the side surface SS3B of the gate electrode GE1 which is located on a side thereof opposite to the one side. That is, the n⁻-type semiconductor region 11d is formed in the upper-layer portion of the part of the p-type well PW2 which is located on the one side of the gate electrode GE1 in the X-axis direction. The n⁻-type semiconductor region 11e is formed in the upper-layer portion of the part of the p-type well PW2 which is located on the side of the gate electrode GE1 opposite to the one side in the X-axis direction.

The n⁺-type semiconductor region 12d is formed by self-alignment with the side surface of the sidewall spacer SW3A formed over the side surface SS3A of the gate electrode GE1. The n⁺-type semiconductor region 12e is formed by self-alignment with the side surface of the sidewall spacer SW3B formed over the side surface SS3B of the gate electrode GE1. That is, the n⁺-type semiconductor region 12d is formed in the upper-layer portion of the part of the p-type well PW2 which is located opposite to the gate electrode GE1 relative to the sidewall spacer SW3A interposed therebetween. The n⁺-type semiconductor region 12e is formed in the upper-layer portion of the part of the p-type well PW2 which is located opposite to the gate electrode GE1 relative to the sidewall spacer SW3B interposed therebetween.

As a result, the lower-concentration n⁻-type semiconductor region 11d is formed under the sidewall spacer SW3A formed over the side surface SS3A of the gate electrode GE1. The lower-concentration n⁻-type semiconductor region 11e is formed under the sidewall spacer SW3B formed over the side surface SS3B of the gate electrode GE1. On the other hand, the higher-concentration n⁺-type semiconductor region 12d is formed outside the lower-concentration n⁻-type semiconductor region 11d. The higher-concentration n⁺-type semiconductor region 12e is formed outside the lower-concentration n⁻-type semiconductor region 11e.

Under the gate electrode GE1, the channel region of the MISFET Q1 is formed. Thus, the lower-concentration n⁻-type semiconductor region 11d is formed so as to be adjacent to the channel region of the MISFET Q1. The higher-concentration n⁺-type semiconductor region 12d is formed so as to be in contact with the lower-concentration n⁻-type semiconductor region 11d and spaced apart from the channel region of the MISFET Q1 by the distance corresponding to the n⁻-type semiconductor region 11d. On the other hand, the lower-concentration n⁻-type semiconductor region 11e is formed so as to be adjacent to the channel region of the MISFET Q1. The higher-concentration n⁺-type semiconductor region 12e is formed so as to be in contact with the lower-concentration n⁻-type semiconductor region 11e and spaced apart from the channel region of the MISFET Q1 by the distance corresponding to the n⁻-type semiconductor region 11e.

Over each of the n+-type semiconductor regions 12*d* and 12*e*, i.e., over the upper surface of each of the n+-type semiconductor regions 12*d* and 12*e*, the metal silicide layer 14 is formed using a salicide technique or the like in the same manner as over each of the n+-type semiconductor regions 12*a*, 12*b*, and 12*c* in the memory cells MCA and MCB. Note that the metal silicide layer 14 may also be formed over the gate electrode GE1.

Next, a configuration over each of the memory cells MCA and MCB formed in the memory cell region 1A and a configuration over each of the MISFETs Q1 formed in the peripheral circuit region 1B will specifically be described.

Over the semiconductor substrate 1, the insulating film 15 is formed so as to cover the control gate electrodes CGA and CGB, the memory gate electrodes MGA and MGB, the gate electrode GE1, and the sidewall spacers SW1A, SW1B, SW2A, SW2B, SW3A, and SW3B. The insulating film 15 is made of, e.g., a silicon nitride film or the like.

Over the insulating film 15, the interlayer insulating film 16 is formed. The interlayer insulating film 16 is made of a single-layer silicon dioxide film, a laminated film including a silicon nitride film and a silicon dioxide film, or the like. The upper surface of the interlayer insulating film 16 has been planarized.

In the memory cell region 1A, contact holes are formed in the interlayer insulating film 16. In the contact holes, plugs PG1 each made of a conductor film are embedded. In the peripheral circuit region 1B, contact holes are formed in the interlayer insulating film 16. In the contact holes, plugs PG3 each made of a conductor film are embedded. Note that, as shown in FIG. 2, over the active region AR2, a plug PG2 is formed.

Each of the plugs PG1 and PG3 is formed of a thin barrier conductor film formed over the bottom portion of the contact hole and the side wall, i.e., side surface thereof, and a main conductor film formed over the barrier conductor film so as to be embedded in the contact hole. In FIG. 5, for simpler illustration, the barrier conductor film and the main conductor film which are included in each of the plugs PG1 and PG3 are integrally shown. Note that the barrier conductor film included in each of the plugs PG1 and PG3 can be made of, e.g., a titanium (Ti) film, a titanium nitride film (TiN) film, or a laminated film thereof. The main conductor film included in each of the plugs PG1 and PG3 can be made of a tungsten (W) film.

The plugs PG1 are formed individually over the n+-type semiconductor regions 12*a*, 12*b*, and 12*c*, the control gate electrodes CGA and CGB, and the memory gate electrodes MGA and MGB. The plugs PG1 are electrically coupled individually to the n+-type semiconductor regions 12*a*, 12*b*, and 12*c*, the control gate electrodes CGA and CGB, and the memory gate electrodes MGA and MGB. The plugs PG3 are formed individually over the n+-type semiconductor regions 12*d* and 12*e* and the gate electrodes GE1 and electrically coupled individually to the n+-type semiconductor regions 12*d* and 12*e* and the gate electrodes GE1.

Over the interlayer insulating film 16 in which the plugs PG1 and PG3 are embedded, first-layer wires are formed as damascene wires as embedded wires using, e.g., copper (Cu) as a main conductive material. Above the first-layer wires, upper-layer wires are also formed as damascene wires, but the illustration and description thereof is omitted herein. The first-layer wires and the wires in the layers located thereabove are not limited to the damascene wires and can also be formed by patterning conductive films for wires. For example, tungsten (W) wires, aluminum (Al) wires, or the like can also be used.

Next, operations to the memory cell MCA as a representative of the memory cells MCA and MCB formed in the memory cell region 1A will be described. However, since the memory cell MCB has the same circuit configuration as the circuit configuration of the memory cell MCA, the operation of the memory cell MCB is the same as the operation of the memory cell MCA.

FIG. 7 is a table showing an example of conditions for the application of voltages to the individual parts of a memory cell during "write", "erase", and "read" operations. The table in FIG. 7 shows voltages Vmg applied to the memory gate electrode MGA, voltages Vs applied to the semiconductor region MS, voltages Vcg applied to the control gate electrode CGA, and voltages Vd applied to the semiconductor region MD during the "write", "erase", and "read" operations. The table in FIG. 7 also shows voltages Vb applied to the p-type well PW1 during the "write", "erase", and "read" operations. Note that the example shown in the table in FIG. 7 is a preferred example of the conditions for the application of the voltages. The conditions for the application of the voltages are not limited thereto, and can variously be changed as necessary.

In Embodiment 1, the injection of electrons into the silicon nitride film 5*b* as the internal charge storage portion of the insulating film 5 of the memory transistor is defined as a "write operation". Also, the injection of holes, i.e., positive holes into the silicon nitride film 5*b* is defined as an "erase operation". It is also assumed that a power source voltage Vdd is 1.5 V.

As a write method, hot electron writing referred to as a so-called source-side injection (SSI) method can be used. For example, such voltages as shown in the "Write" row in FIG. 7 are applied to the individual parts of the memory cell MCA to which a write operation is performed to inject electrons into the silicon nitride film 5*b* in the gate insulating film GI2A of the memory cell MCA. Hot electrons are generated mainly in the channel region in the portion located under the memory gate electrode MGA via the gate insulating film GI2A and injected into the silicon nitride film 5*b* as the internal charge storage portion of the gate insulating film GI2A. The injected hot electrons are trapped by a trap level in the silicon nitride film 5*b* in the gate insulating film GI2A. As a result, the threshold voltage (Vth) of the memory transistor rises.

As an erase method, a hot-hole-injection erase method using a band-to-band tunneling (BTBT) phenomenon can be used. That is, by injecting holes, i.e., positive holes generated using the BTBT phenomenon into the charge storage portion, i.e., into the silicon nitride film 5*b* in the gate insulating film GI2A, an erase operation is performed. For example, such voltages as shown in the "Erase" row in FIG. 7 are applied to the individual parts of the memory cell MCA to which an erase operation is performed to generate holes using the BTBT phenomenon and subject the holes to high-gradient acceleration. In this manner, the holes are injected into the silicon nitride film 5*b* in the gate insulating film GI2A of the memory cell MCA to thus reduce the threshold voltage of the memory transistor.

As the erase method, an erase method based on hole injection using a direct tunneling phenomenon can also be used. That is, an erase operation is performed by injecting holes into the charge storage portion, i.e., the silicon nitride film 5*b* in the gate insulating film GI2A using the direct tunneling phenomenon. It is assumed that the voltage Vmg applied to the memory gate electrode MGA is set to, e.g., 12 V as a positive voltage and the voltage Vb applied to the p-type well PW1 is set to, e.g., 0 V, though the illustration thereof is omitted in the "Erase" row in FIG. 7. As a result, due to the direct tunneling phenomenon, holes are injected from the memory gate electrode MGA into the charge storage portion, i.e., the silicon nitride film 5b via the silicon dioxide film 5c to cancel out the electrons in the silicon nitride film 5b so that an erase operation is performed. Alternatively, the holes injected into the silicon nitride film 5b are trapped by the trap level in the silicon nitride film 5b so that an erase operation is performed. This reduces the threshold voltage of the memory transistor to provide an erased state. When such an erase method is used, a larger reduction can be achieved in consumed current than when the erase method based on the BTBT phenomenon is used.

During a read operation, such voltages as shown in, e.g., the "Read" row in FIG. 7 are applied to the individual parts of the memory cells MCA to which the read operation is performed. By setting the voltage Vmg applied to the memory gate electrode MGA during the read operation to a value between the threshold voltage of the memory transistor in a written state and the threshold voltage of the memory transistor in the erased state, it is possible to discriminate the written state from the erased state.

<Method of Manufacturing Semiconductor Device>

Figure 8:
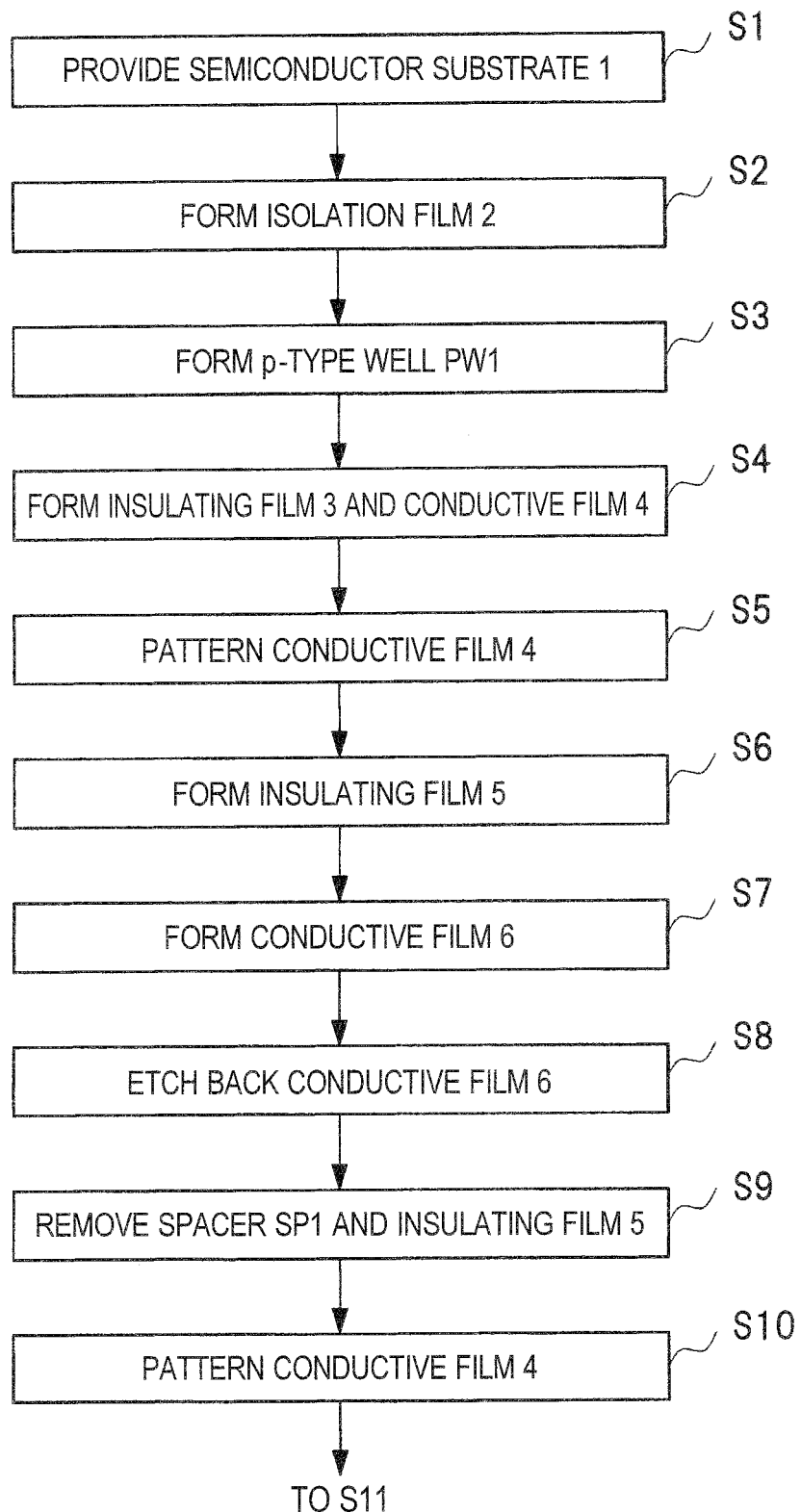
FIG. 8 is a process flow chart showing a part of the manufacturing process of the semiconductor device in Embodiment 1.

Next, a description will be given of a method of manufacturing the semiconductor device in Embodiment 1. FIGS. 8 to 10 are process flow charts each showing a part of the manufacturing process of the semiconductor device in Embodiment 1. FIGS. 11 to 23 and 27 are main-portion cross-sectional views of the semiconductor device in Embodiment 1 during the manufacturing process thereof. FIG. 24 is a main-portion plan view of the semiconductor device in Embodiment 1 during the manufacturing process thereof. FIGS. 25 and 26 are views for illustrating the direction in which impurity ions are implanted.

FIG. 10 shows the process shown in Step S13 in FIG. 9. FIGS. 11 to 23 and 27 show an element structure corresponding to a cross section along the line A-A in FIG. 2 in the memory cell region 1A and an element structure corresponding to a cross section along the line B-B in FIG. 3 in the peripheral circuit region 1B in combination. An element structure corresponding to a cross section along the line C-C in FIG. 4 in the peripheral circuit region 1C is the same as the element structure corresponding to the cross section along the line B-B in FIG. 3 in the peripheral circuit region 1B except that, in plan view, the element structure in FIG. 4 is at a position after a 90° rotation from the position of the element structure in FIG. 3. Therefore, in FIGS. 11 to 23 and 27, the illustration of the element structure corresponding to a cross section along the line C-C in FIG. 4 in the peripheral circuit region 1C is omitted.

In Embodiment 1, a description will be given of the case where, in the memory cell region 1A, the n-channel control transistors CTA and CTB and the n-channel memory transistors MTA and MTB are formed. However, it is also possible to invert the conductivity type and form the p-channel control transistors CTA and CTB and the p-channel memory transistors MTA and MTB in the memory cell region 1A. Likewise, in Embodiment 1, a description will be given of the case where the n-channel MISFETs Q1 are formed in the peripheral circuit region 1B. However, it is also possible to invert the conductivity type and form the p-channel MISFETs Q1 in the peripheral circuit region 1B. It is also possible to form a CMISFET (Complementary MISFET) or the like in the peripheral circuit region 1B.

As shown in FIG. 11, first, the semiconductor substrate 1 as a semiconductor wafer made of p-type monocrystalline silicon having a specific resistance of, e.g., about 1 to 10 Ωcm is provided, i.e., prepared (Step S1 in FIG. 8).

Next, as shown in FIG. 11, the isolation film 2 is formed to serve as the isolation region IR1 defining the active region AR1 in the memory cell region 1A of the main surface 1a of the semiconductor substrate 1 and as the isolation region IR2 defining the active region AR3 in the peripheral circuit region 1B on the main surface 1a side of the semiconductor substrate 1 (Step S2 in FIG. 8). The isolation film 2 is made of an insulator such as silicon dioxide and can be formed by, e.g., a STI (Shallow Trench Isolation) method, a LOCOS (Local Oxidization of Silicon) method, or the like. For example, after isolation trenches are formed in the element isolation regions IR1 and IR2, an insulating film made of, e.g., silicon dioxide is embedded in each of the isolation trenches to thus allow the isolation films 2 to be formed.

Note that, in FIG. 11, the illustration of the isolation region IR1 and the isolation film 2 in the memory cell region 1A is omitted. However, the isolation region IR1 and the isolation film 2 in the memory cell region 1A can be formed as shown in FIG. 2.

Next, as shown in FIG. 11, in the memory cell region 1A, the p-type well PW1 is formed in the active region AR1 while, in the peripheral circuit region 1B, the p-type well PW2 is formed in the active region AR3 (Step S3 in FIG. 8). The p-type wells PW1 and PW2 can be formed by introducing a p-type impurity such as, e.g., boron (B) into the semiconductor substrate 1 by an ion implantation method or the like. The p-type wells PW1 and PW2 are formed to extend from the main surface 1a of the semiconductor substrate 1 over predetermined depths.

Note that, when the p-type well PW2 is formed in the peripheral circuit region 1B, the p-type well PW2 is formed also in the peripheral circuit region 1C. As a result, by performing Steps S1 to S3, the semiconductor substrate 1 is provided which has the p-type well PW1 formed in the main surface 1a in the memory cell region 1A, the p-type well PW2 formed in the main surface 1a in the peripheral circuit region 1B, and the p-type well PW2 formed in the main surface 1a in the peripheral circuit region 1C.

Next, a natural oxide film over the top surface of the semiconductor substrate 1 is removed by wet etching using, e.g., an aqueous hydrofluoric acid (HF) solution or the like. The top surface of the semiconductor substrate 1 is washed to be cleaned. This exposes the top surface of the semiconductor substrate 1, i.e., the top surfaces of the p-type wells PW1 and PW2.

Figure 12:
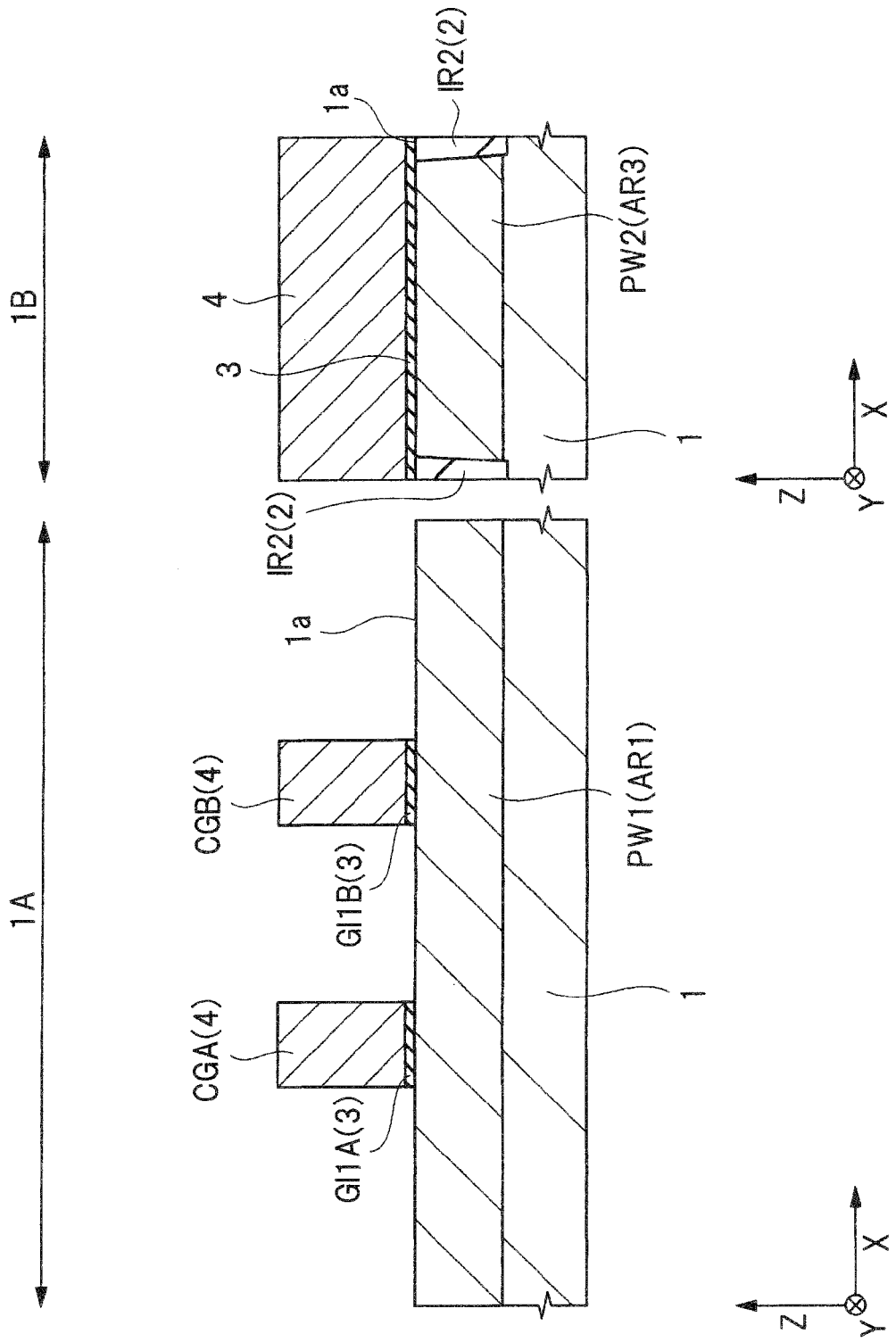
FIG. 12 is a main-portion cross-sectional view of the semiconductor device in Embodiment 1 during the manufacturing process thereof.

Next, as shown in FIG. 12, over the entire main surface 1a of the semiconductor substrate 1, the insulating film 3 and the conductive film 4 are formed (Step S4 in FIG. 4).

In Step S4, first, as shown in FIG. 12, in each of the memory cell region 1A and the peripheral circuit region 1B, over the main surface 1a of the semiconductor substrate 1, the insulating film 3 is formed. As described above, as the insulating film 3, a silicon dioxide film, a silicon nitride film, a silicon oxynitride film, or a High-k film, i.e., high-dielectric-constant film can be used. Examples of the material that can be used for the insulating film 3 are as described above. The insulating film 3 can be formed using a thermal oxidation method, a sputtering method, an atomic layer deposition (ALD) method, a chemical vapor deposition (CVD) method, or the like.

In Step S4, next, as shown in FIG. 12, over the insulating film 3 in each of the memory cell region 1A and the peripheral circuit region 1B, the conductive film 4 made of silicon is formed.

Preferably, the conductive film 4 is made of a polycrystalline silicon film, i.e., polysilicon film. The conductive film 4 can be formed using a CVD method or the like. The conductive film 4 is allowed to have a sufficient thickness to cover the insulating films 3. It is also possible to deposit an amorphous silicon film as the conductive film 4 and then change the amorphous silicon film to a polycrystalline silicon film by subsequent heat treatment.

As the conductive film 4, a conductive film having a low resistivity due to, e.g., an n-type impurity such as phosphorus (P) or arsenic (As) or a p-type impurity such as boron (B) introduced therein is preferably used. The impurity can be introduced during or after the deposition of the conductive film 4. When the impurity is introduced during the deposition of the conductive film 4, by causing a gas for depositing the conductive film 4 to include a doping gas, the conductive film 4 into which the impurity has been introduced can be deposited. On the other hand, when the impurity is introduced after the deposition of the silicon film, the silicon film is deposited without intentional introduction of an impurity. Then, an impurity is introduced into the silicon film by an ion implantation method or the like to allow the conductive film 4 into which the impurity has been introduced to be formed.

Note that, after the conductive film 4 is formed and before the conductive film 4 is patterned (Step S5 in FIG. 8 described later), an insulating film for the cap insulating film may also be formed over the conductive film 4.

Next, as shown in FIG. 12, the conductive film 4 is patterned (Step S5 in FIG. 8). In Step S5, using, e.g., photolithography and etching, the conductive film 4 is patterned.

First, over the conductive film 4, a resist film (not shown) is formed. Then, in the area of the memory cell region 1A other than the areas thereof where the control gate electrodes CGA and CGB are to be formed, an opening is formed to extend through the resist film and reach the conductive film 4. Thus, a resist pattern (not shown) made of the resist film formed with the opening is formed. At this time, the portions of the conductive film 4 which are located in the areas of the memory cell region 1A where the control gate electrodes CGA and CGB are to be formed and the portion of the conductive film 4 which is located in the peripheral circuit region 1B are covered with the resist film.

Then, using the resist pattern as an etching mask, the conductive film 4 is etched by, e.g., dry etching or the like to be patterned.

As a result, in the memory cell region 1A, the control gate electrode CGA made of the conductive film 4 is formed and the gate insulating film GI1A made of the insulating film 3 located between the control gate electrode CGA and the p-type well PW1 of the semiconductor substrate 1 is formed. In other words, in the memory cell region 1A, the control gate electrode CGA is formed over the p-type well PW1, i.e., over the main surface 1a of the semiconductor substrate 1 via the gate insulating film GI1A.

Also, in the memory cell region 1A, the control gate electrode CGB made of the conductive film 4 is formed and the gate insulating film GI1B made of the insulating film 3 located between the control gate electrode CGB and the p-type well PW1 of the semiconductor substrate 1 is formed. In other words, in the memory cell region 1A, the control gate electrode CGB is formed over the p-type well PW1, i.e., over the main surface 1a of the semiconductor substrate 1 via the gate insulating film GI1B.

On the other hand, in the peripheral circuit region 1B, the conductive film 4 is left. Then, the resist pattern, i.e., the resist film is removed.

At this time, as shown in FIG. 2, each of the control gate electrodes CGA and CGB extends over the active region AR1, the isolation region IR1, and the active region AR in the Y-axis direction in plan view.

Note that the portion of the insulating film 3 which is covered with neither the control gate electrode CGA nor the control gate electrode CGB in the memory cell region 1A can be removed by performing dry etching in Step S5 or by performing wet etching after the dry etching in Step S5. As a result, in the portion of the memory cell region 1A where neither the control gate electrode CGA nor the control gate electrode CGB is formed, the p-type well PW1 of the semiconductor substrate 1 is exposed.

Figure 13:
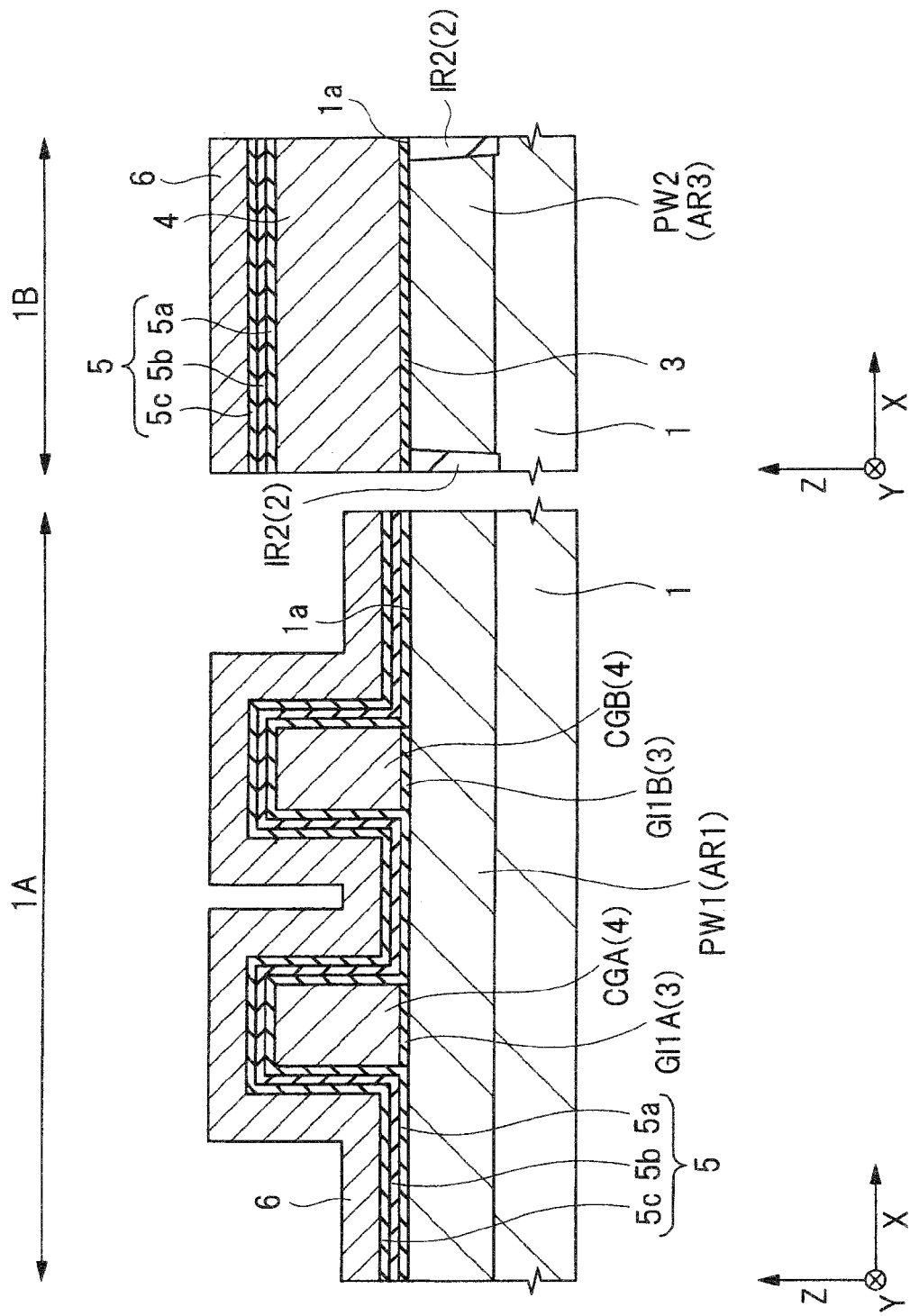
FIG. 13 is a main-portion cross-sectional view of the semiconductor device in Embodiment 1 during the manufacturing process thereof.

Next, as shown in FIG. 13, over the entire main surface 1a of the semiconductor substrate 1, the insulating film 5 for the gate insulating film GI2A (see FIG. 15 described later) of the memory transistor MTA and for the gate insulating film GI2B (see FIG. 15 described later) of the memory transistor MTB is formed (Step S6 in FIG. 8).

In Step S6, in the memory cell region 1A, over the main surface 1a of the exposed portion of the semiconductor substrate 1, the upper and side surfaces of the control gate electrode CGA, and the upper and side surfaces of the control gate electrode CGB, the insulating film 5 is formed. Also, over the upper surface of the portion of the conductive film 4 which is left in the peripheral circuit region 1B, the insulating film 5 is formed. That is, in Step S6, the insulating film 5 is formed so as to cover the main surface 1a of the semiconductor substrate 1, the top surfaces of the control gate electrodes CGA and CGB, and the top surface of the portion of the conductive film 4 which is left in the peripheral circuit region 1B.

As described above, the insulating film 5 has the internal charge storage portion. The insulating film 5 is made of a laminated film including the silicon dioxide film 5a, the silicon nitride film 5b, and the silicon dioxide film 5c which are formed successively as insulating films in an ascending order.

Of the insulating film 5, the silicon dioxide film 5a can be formed by, e.g., a thermal oxidation method, an ISSG oxidation method, or the like. Also, of the insulating film 5, the silicon nitride film 5b can be formed by, e.g., a CVD method. Also, of the insulating film 5, the silicon dioxide film 5c can be formed by, e.g., a CVD method or an ISSG (In Situ Steam Generation) oxidation method.

First, over the main surface 1a of the exposed portion of the semiconductor substrate 1, the upper and side surfaces of the control gate electrode CGA, the upper and side surfaces of the control gate electrode CGB, and the upper and side surfaces of the portion of the conductive film 4 which is left in the peripheral circuit region 1B, the silicon dioxide film 5a is formed by, e.g., a thermal oxidation method or an ISSG oxidation method. At this time, the main surface 1a of the exposed portion of the semiconductor substrate 1, the upper and side surfaces of the control gate electrode CGA, the upper and side surfaces of the control gate electrode CGB, and the upper surface of the portion of the conductive film 4 which is left in the peripheral circuit region 1B are oxidized. The thickness of the silicon dioxide film 5a can be adjusted to, e.g., about 4 nm.

In another form, the silicon dioxide film 5a can also be formed by an ALD (Atomic Layer Deposition) method. At this time, over the main surface 1a of the exposed portion of the semiconductor substrate 1, the upper and side surfaces of the control gate electrode CGA, the upper and side surfaces of the control gate electrode CGB, and the upper surface of the portion of the conductive film 4 which is left in the peripheral circuit region 1B, silicon dioxide is grown.

Next, over the silicon dioxide film 5a, the silicon nitride film 5b is formed by, e.g., a CVD method. Over the silicon nitride film 5b, the silicon dioxide film 5c is further formed by, e.g., a CVD method, an ISSG oxidation method, or both of the methods. Thus, the insulating film 5 made of the laminated film including the silicon dioxide film 5a, the silicon nitride film 5b, and the silicon dioxide film 5c can be formed.

The insulating film 5 formed in the memory cell region 1A functions as the gate insulating film of each of the memory gate electrodes MGA and MGB (see FIG. 14 described later) and has a charge retaining function. The insulating film 5 has a structure in which the silicon nitride film 5b as the charge storage portion is interposed between the silicon dioxide films 5a and 5c each as the charge blocking layer. A potential barrier height in the charge blocking layer including the silicon dioxide films 5a and 5c is higher than a potential barrier height in the charge storage portion made of the silicon nitride film 5b.

Note that, in Embodiment 1, as the insulating film having the trap level, the silicon nitride film 5b is used. The use of the silicon nitride film 5b is preferable in terms of reliability. However, the insulating film having the trap level is not limited to the silicon nitride film, and a high-dielectric-constant film having a dielectric constant higher than that of a silicon nitride film such as, e.g., an aluminum oxide (alumina) film, a hafnium oxide film, or a tantalum oxide film can be used.

Next, as shown in FIG. 13, over the entire main surface 1a of the semiconductor substrate 1, i.e., over the insulating film 5, the conductive film 6 made of silicon is formed (Step S7 in FIG. 8).

Preferably, the conductive film 6 is made of, e.g., a polycrystalline silicon film, i.e., polysilicon film. The conductive film 6 can be formed using a CVD method or the like. It is also possible to deposit an amorphous silicon film as the conductive film 6 and change the amorphous silicon film to a polycrystalline silicon film by subsequent heat treatment.

As the conductive film 6, a conductive film having a low resistivity due to, e.g., an n-type impurity such as phosphorus (P) or arsenic (As) or a p-type impurity such as boron (B) introduced therein is preferably used. The impurity can be introduced during or after the deposition of the conductive film 6. The impurity can be introduced into the conductive film 6 by ion implantation after the deposition thereof, but the impurity can also be introduced into the conductive film 6 during the deposition thereof. When the impurity is introduced during the deposition of the conductive film 6, by causing a gas for depositing the conductive film 6 to include a doping gas, the conductive film 6 into which the impurity has been introduced can be deposited.

Figure 14:
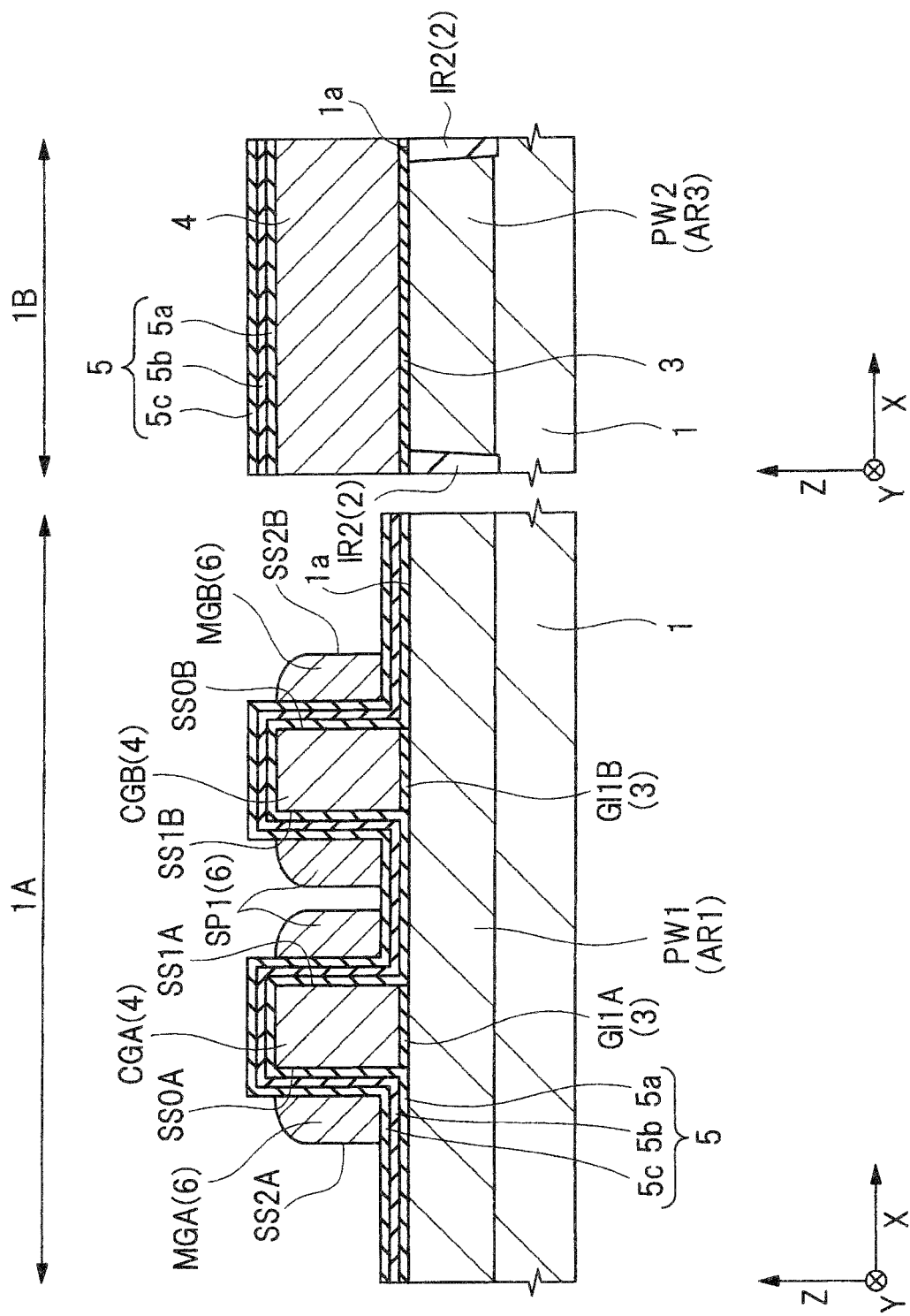
FIG. 14 is a main-portion cross-sectional view of the semiconductor device in Embodiment 1 during the manufacturing process thereof.

Next, as shown in FIG. 14, the conductive film 6 is etched back using an anisotropic etching technique to form the memory gate electrodes MGA and MGB (Step S8 in FIG. 8).

In Step S8, the conductive film 6 is etched back over the thickness thereof to be left in a sidewall spacer shape over each of the both side surfaces of the control gate electrode CGA via the insulating film 5 and left in a sidewall spacer shape over each of the both side surfaces of the control gate electrode CGB via the insulating film 5. On the other hand, the conductive film 6 is removed from the other region.

Thus, as shown in FIG. 14, in the memory cell region 1A, on one side of the control gate electrode CGA in the X-axis direction, i.e., over the side surface SS0A of the control gate electrode CGA opposite to the side surface thereof closer to the control gate electrode CGB, the memory gate electrode MGA made of the conductive film 6 left in the sidewall spacer shape is formed via the insulating film 5. On the other hand, over the side surface SS1A of the control gate electrode CGA closer to the control gate electrode CGB, a spacer SP1 made of the conductive film 6 left in the sidewall spacer shape is formed via the insulating film 5.

Also, in the memory cell region 1A, on one side of the control gate electrode CGB in the X-axis direction, i.e., over the side surface SS0B of the control gate electrode CGB opposite to the side surface thereof closer to the control gate electrode CGA, the memory gate electrode MGB made of the conductive film 6 left in the sidewall spacer shape is formed via the insulating film 5. On the other hand, over the side surface SS1B of the control gate electrode CGB closer to the control gate electrode CGA, the spacer SP1 made of the conductive film 6 left in the sidewall spacer shape is formed via the insulating film 5.

The memory gate electrode MGA is formed over the insulating film 5 so as to be adjacent to the control gate electrode CGA via the insulating film 5. The memory gate electrode MGA and the spacer SP1 have substantially symmetric structures relative to the control gate electrode CGA interposed therebetween. Between the memory gate electrode MGA and the p-type well PW1 of the semiconductor substrate 1 and between the memory gate electrode MGA and the control gate electrode CGA, the insulating film 5 is interposed. The memory gate electrode MGA is made of the conductive film 6 in contact with the insulating film 5.

The memory gate electrode MGB is formed over the insulating film 5 so as to be adjacent to the control gate electrode CGB via the insulating film 5. The memory gate electrode MGB and the spacer SP1 have substantially symmetric structures relative to the control gate electrode CGB interposed therebetween. Between the memory gate electrode MGB and the p-type well PW1 of the semiconductor substrate 1 and between the memory gate electrode MGB and the control gate electrode CGB, the insulating film 5 is interposed. The memory gate electrode MGB is made of the conductive film 6 in contact with the insulating film 5.

At the stage where the etch-back step in Step S8 is performed, the portion of the insulating film 5 which is covered with neither the memory gate electrodes MGA and MGB nor the spacer SP1 is exposed. That is, the portion of the insulating film 5 which is uncovered with each of the memory gate electrodes MGA and MGB and the spacer SP1 is exposed. The insulating film 5 under the memory gate electrode MGA serves as the gate insulating film GI2A (see FIG. 15 described later) of the memory transistor MTA. The insulating film 5 under the memory transistor MGB serves as the gate insulating film GI2B (see FIG. 15 described later) of the memory transistor MTB. By adjusting the thickness of the conductive film 6 formed in Step S7, the memory gate length can be adjusted.

Figure 15:
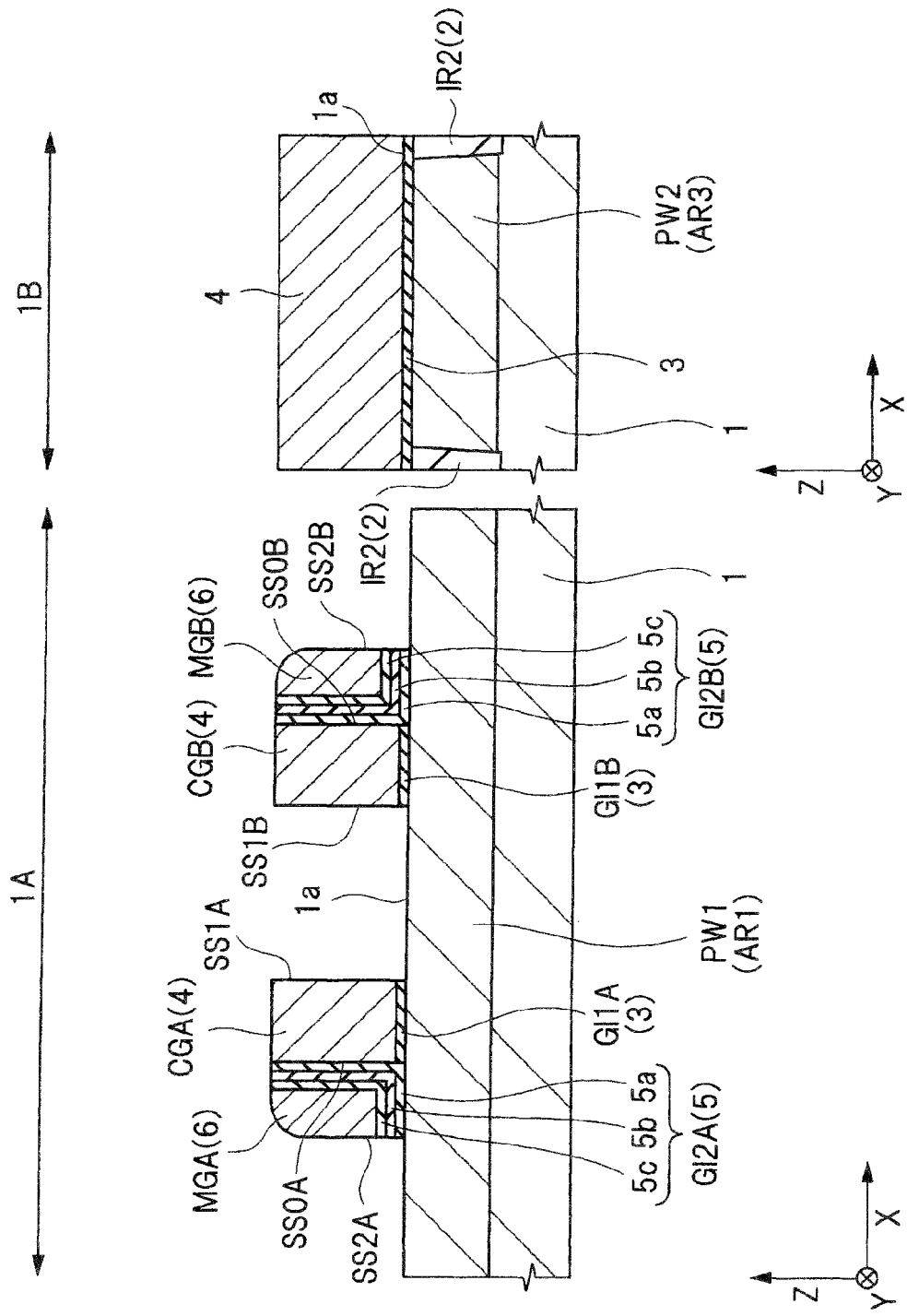
FIG. 15 is a main-portion cross-sectional view of the semiconductor device in Embodiment 1 during the manufacturing process thereof.

Next, as shown in FIG. 15, the spacer SP1 and the insulating film 5 are removed (Step S9 in FIG. 8).

In Step S9, first, using photolithography, a resist pattern (not shown) is formed over the semiconductor substrate 1 to cover the memory gate electrodes MGA and MGB and expose the spacer SP1. Then, by dry etching using the formed resist pattern as an etching mask, the spacer SP1 is removed. On the other hand, the memory gate electrodes MGA and MGB that have been covered with the resist pattern remain without being etched. Then, the resist pattern is removed.

In Step S9, next, the portion of the insulating film 5 which is covered with neither the memory gate electrode MGA nor the memory gate electrode MGB is removed by etching such as, e.g., wet etching. At this time, in the memory cell region 1A, the insulating film 5 located between the memory gate electrode MGA and the p-type well PW1 and between the memory gate electrode MGA and the control gate electrode CGA is not removed but is left. Also, in the memory cell region 1A, the insulating film 5 located between the memory gate electrode MGB and the p-type well PW1 and between the memory gate electrode MGB and the control gate electrode CGB is not removed but is left. On the other hand, the insulating film 5 located in the other region is removed.

As a result, in the memory cell region 1A, the gate insulating film GI2A including the portion of the insulating film 5 which is left between the memory gate electrode MGA and the p-type well PW1, and the portion of the insulating film 5 which is left between the memory gate electrode MGA and the control gate electrode CGA is formed. Also, in the memory cell region 1A, the gate insulating film GI2B including the portion of the insulating film 5 which is left between the memory gate electrode MGB and the p-type well PW1, and the portion of the insulating film 5 which is left between the memory gate electrode MGB and the control gate electrode CGB is formed.

Note that, in Step S9, etching can also be performed such that, of the insulating film 5, the silicon dioxide film 5c and the silicon nitride film 5b are removed and the silicon dioxide film 5a is not removed but is left.

Figure 16:
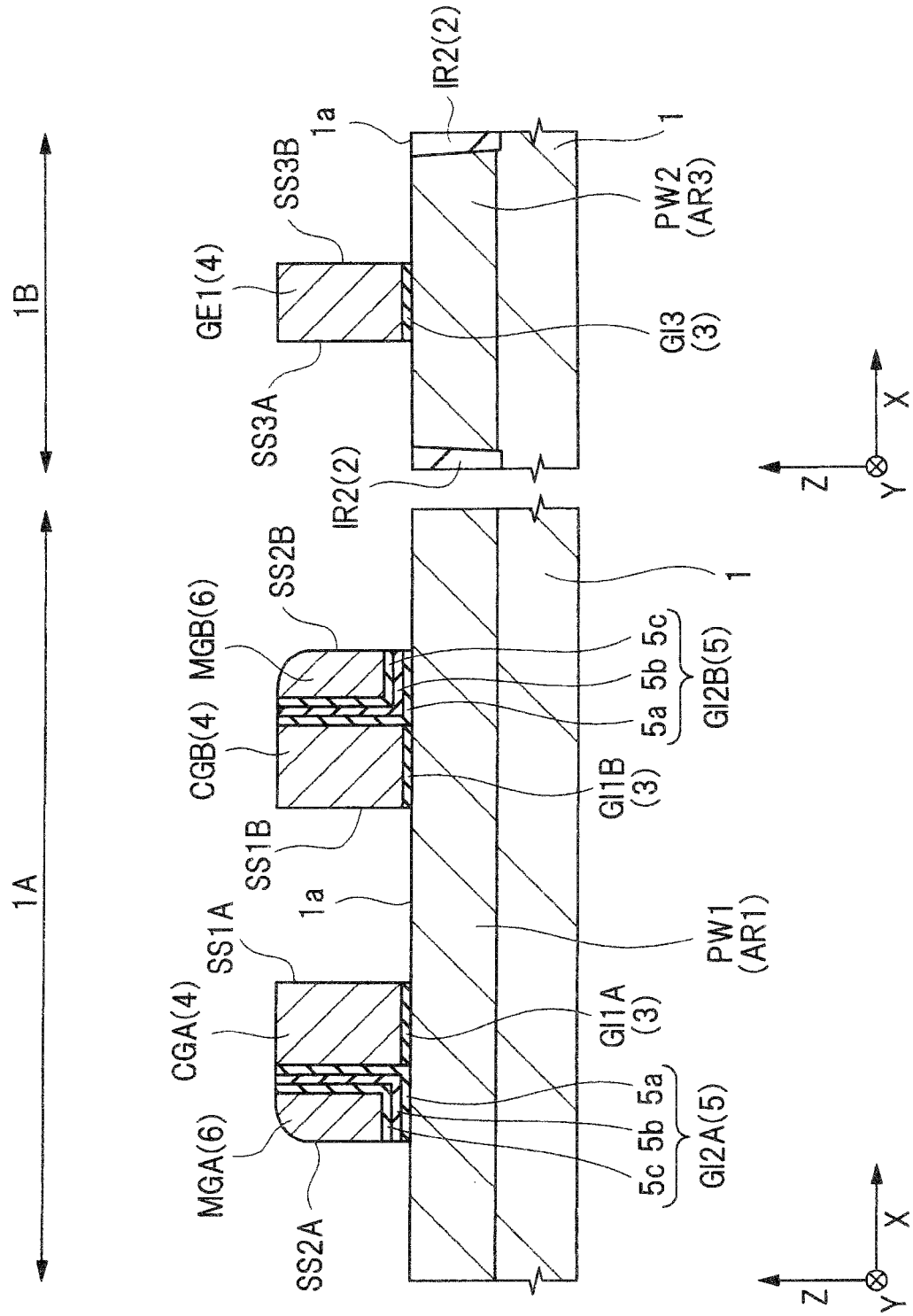
FIG. 16 is a main-portion cross-sectional view of the semiconductor device in Embodiment 1 during the manufacturing process thereof.

Next, as shown in FIG. 16, in the peripheral circuit region 1B, the conductive film 4 is patterned (Step S10 in FIG. 8). In Step S10, using, e.g., photolithography and etching, the conductive film 4 is patterned in the peripheral circuit region 1B.

First, over the entire main surface 1a of the semiconductor substrate 1, a resist film (not shown) is formed. Then, in the area of the peripheral circuit region 1B other than the area thereof where the gate electrode GE1 is to be formed, an opening is formed to extend through the resist film and reach the conductive film 4. Thus, a resist pattern (not shown) made of the resist film formed with the opening is formed. At this time, the portion of the conductive film 4 which is located in the area of the peripheral circuit region 1B where the gate electrode GE1 is to be formed and the main surface 1a of the semiconductor substrate 1 located in the memory cell region 1A are covered with the resist film.

Then, using the resist pattern as an etching mask, the conductive film 4 is etched by, e.g., dry etching or the like to be patterned.

As a result, in the peripheral circuit region 1B, the gate electrode GE1 made of the conductive film 4 is formed and the gate insulating film GI3 made of the insulating film 3 located between the gate electrode GE1 and the p-type well PW2 is formed. In other words, in the peripheral circuit region 1B, the gate electrode GE1 is formed over the p-type well PW2, i.e., over the main surface 1a of the semiconductor substrate 1 via the gate insulating film GI3.

On the other hand, in the memory cell region 1A, the memory gate electrodes MGA and MGB and the control gate electrodes CGA and CGB are covered with the resist pattern. Accordingly, the memory gate electrodes MGA and MGB and the control gate electrodes CGA and CGB are not etched. Then, the resist pattern, i.e., the resist film is removed.

At this time, as shown in FIG. 3, in the peripheral circuit region 1B, the gate electrode GE1 extends over the active region AR3 in the Y-axis direction in plan view.

Note that, in the peripheral circuit region 1B, the portion of the insulating film 3 uncovered with the gate electrode GE1 can be removed by performing dry etching in Step S10 or performing wet etching after the dry etching in Step S10.

Figure 17:
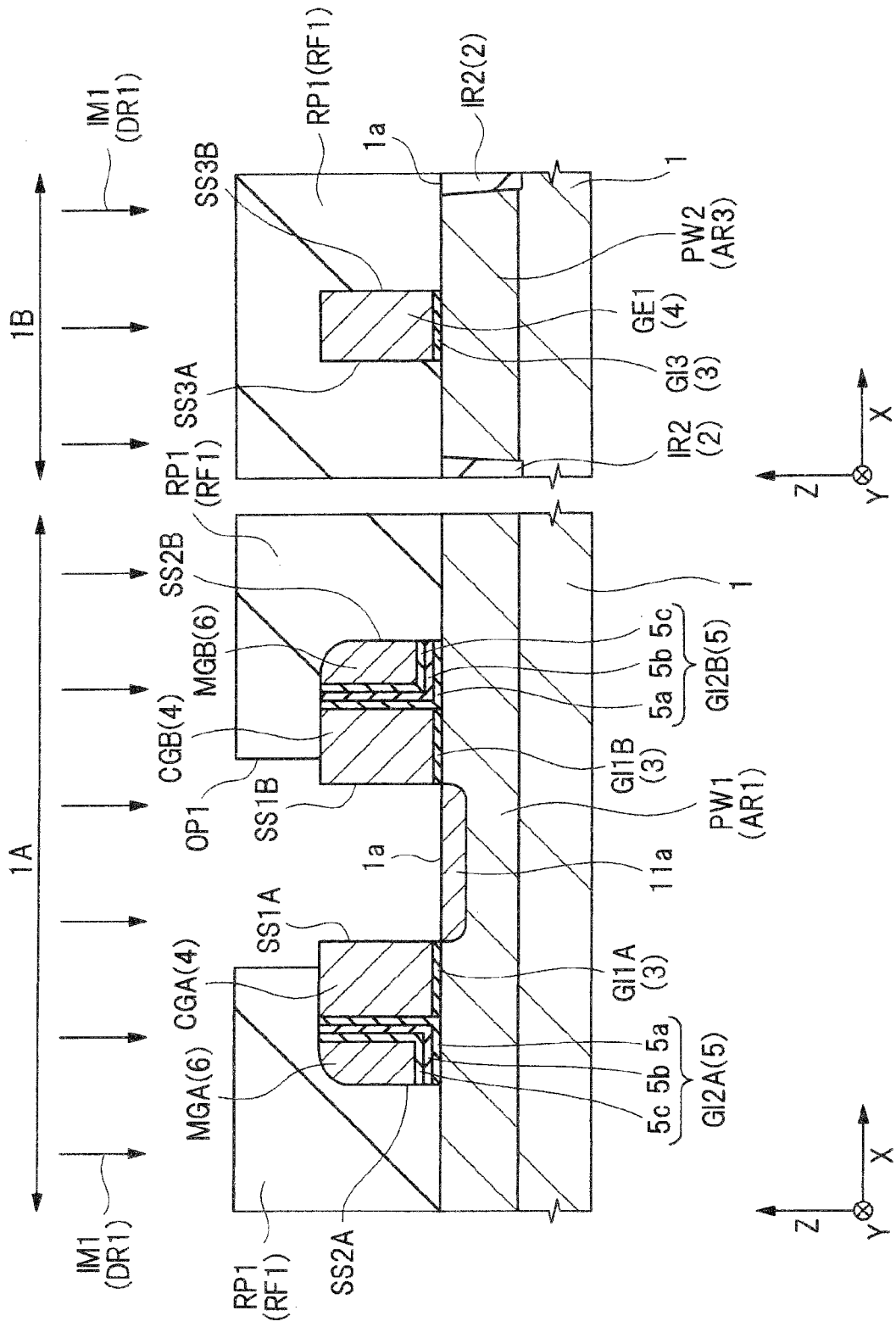
FIG. 17 is a main-portion cross-sectional view of the semiconductor device in Embodiment 1 during the manufacturing process thereof.
Figure 18:
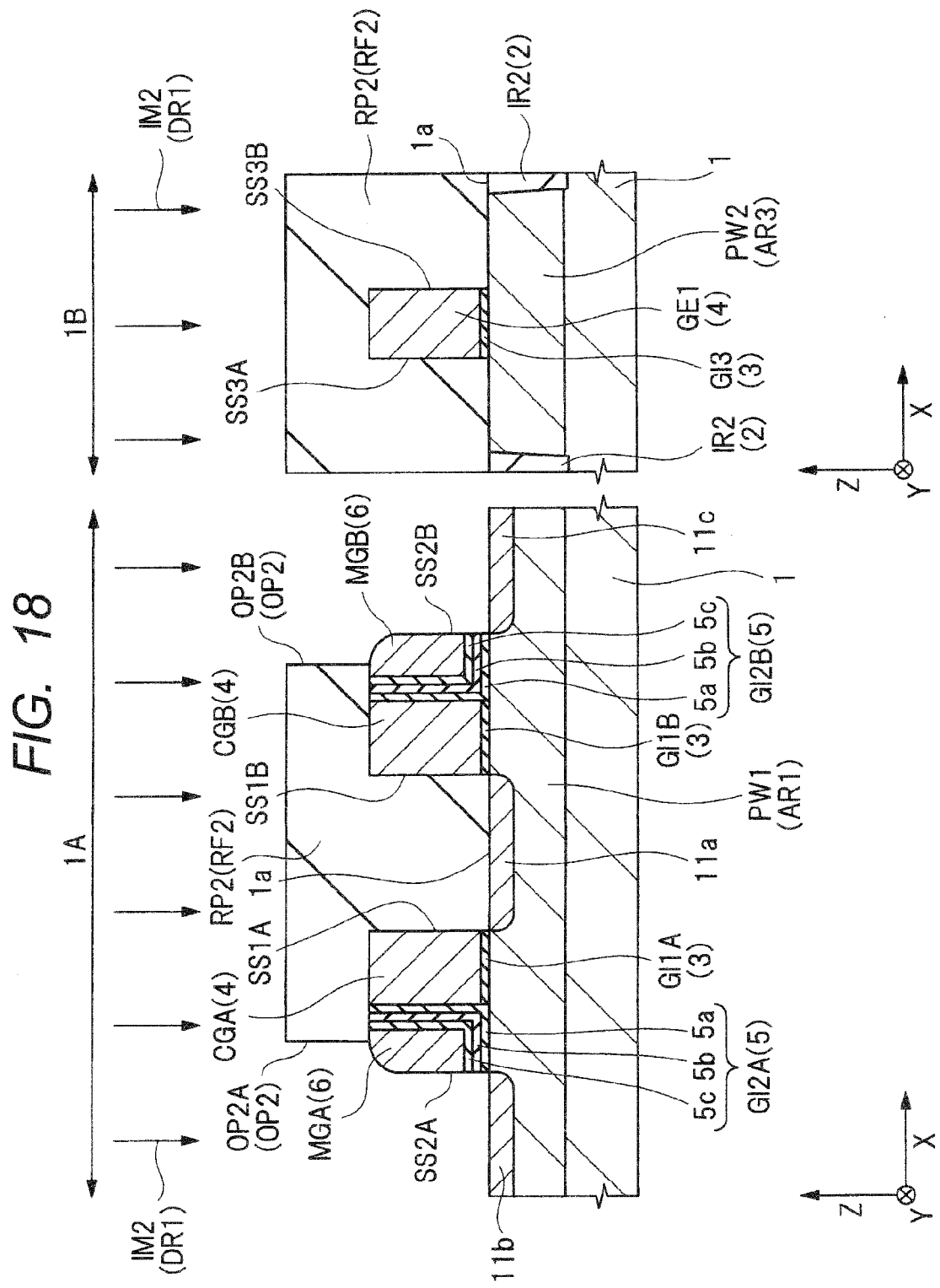
FIG. 18 is a main-portion cross-sectional view of the semiconductor device in Embodiment 1 during the manufacturing process thereof.
Figure 19:
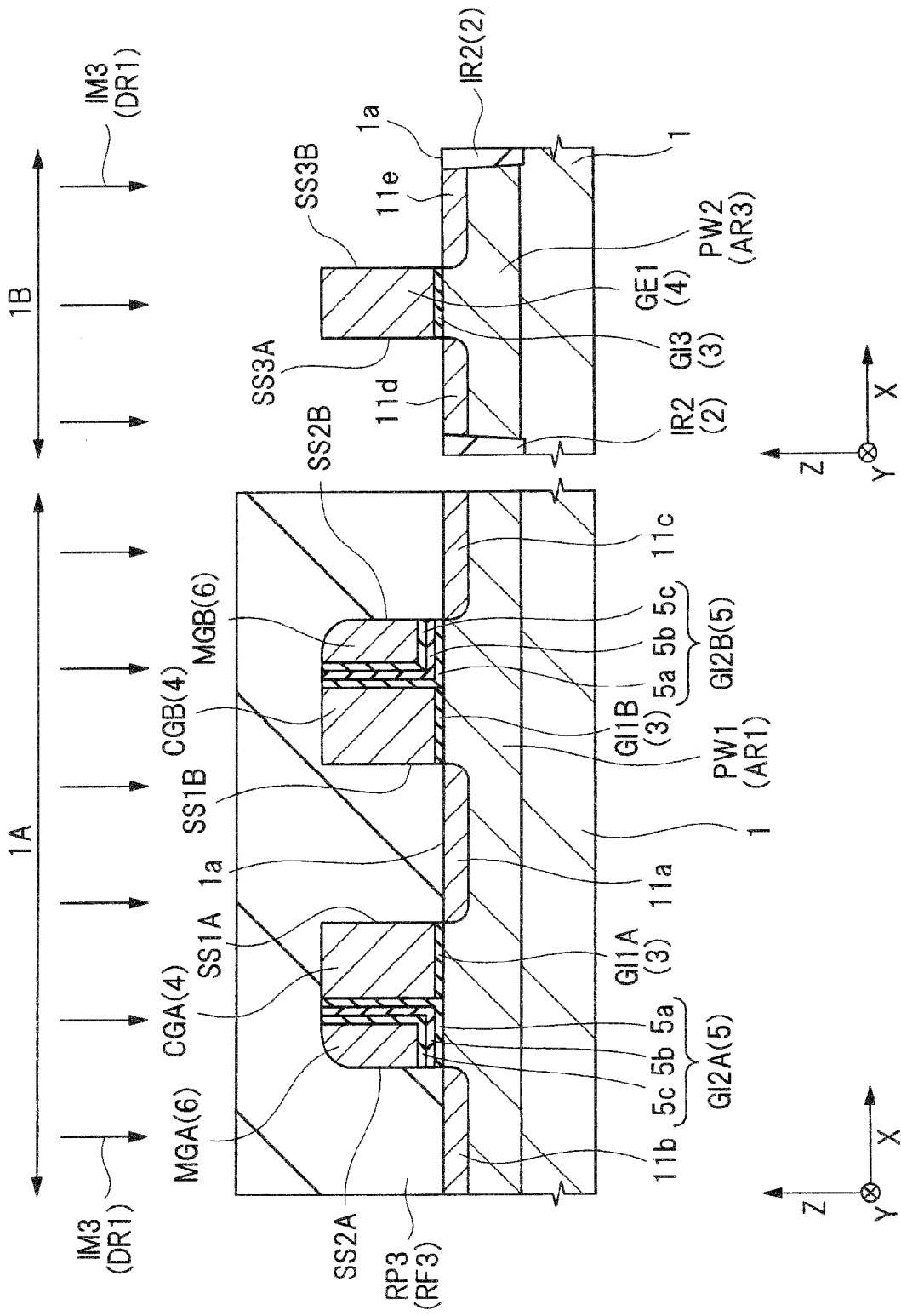
FIG. 19 is a main-portion cross-sectional view of the semiconductor device in Embodiment 1 during the manufacturing process thereof.

Next, as shown in FIGS. 17 to 19, the n$^-$-type semiconductor regions 11a, 11b, 11c, 11d, and 11e are formed (Step S11 in FIG. 9). In Step S11, using, e.g., photolithography and an ion implantation method, in the upper-layer portions of the p-type wells PW1 and PW2, the n$^-$-type semiconductor regions 11a, 11b, 11c, 11d, and 11e are formed.

In Step S11, first, as shown in FIG. 17, a resist film RF1 as a mask film is formed so as to cover the entire main surface 1a of the semiconductor substrate 1. Then, in the area of the memory cell region 1A where the n$^-$-type semiconductor region 11a is formed, an opening OP1 is formed to extend through the resist film RF1 and reach the p-type well PW1. Thus, a resist pattern RP1 made of the resist film RF1 formed with the opening OP1 is formed. That is, the opening OP1 is formed to extend through the resist film RF1 and reach the portion of the p-type well PW1 which is located between the control gate electrodes CGA and CGB.

At this time, the portion of the p-type well PW1 which is located in the area of the memory cell region 1A other than the area thereof where the n$^-$-type semiconductor region 11a is to be formed and the main surface 1a of the semiconductor substrate 1 located in the peripheral circuit region 1B are covered with the resist film RF1. That is, in the memory cell region 1A, the portion of the p-type well PW1 which is located opposite to the control gate electrode CGA relative to the memory gate electrode MGA interposed therebetween and the portion of the p-type well PW1 which is located opposite to the control gate electrode CGB relative to the memory gate electrode MGB interposed therebetween are covered with the resist film RF1.

Next, using the resist pattern RP1 as a mask, n-type impurity ions IM1 such as, e.g., arsenic (As) or phosphorus (P) ions are implanted. As a result, the n$^-$-type semiconductor region 11a is formed in the upper-layer portion of the part of the p-type well PW1 which is located between the control gate electrodes CGA and CGB, i.e., the part of the p-type well PW1 which is located opposite to the memory gate electrode MGA relative to the control gate electrode CGA interposed therebetween and located opposite to the memory gate electrode MGB relative to the control gate electrode CGB interposed therebetween. Then, the resist pattern RP1 is removed.

Preferably, each of the side surface SS1A of the control gate electrode CGA closer to the control gate electrode CGB and the side surface SS1B of the control gate electrode CGB closer to the control gate electrode CGA are exposed in the opening OP1. This allows the n$^-$-type semiconductor region 11a to be formed by self-alignment with the side surface SS1A of the control gate electrode CGA and the side surface SS1B of the control gate electrode CGB.

More preferably, the impurity ions IM1 are implanted from a direction DR1 perpendicular to the main surface 1a of the semiconductor substrate 1. By doing so, even when the side surface SS1A of the control gate electrode CGA has surface roughness in a depth direction corresponding to the gate length direction (X-axis direction), the n$^-$-type semiconductor region 11a is formed by self-alignment with the side surface SS1A of the control gate electrode CGA. Also, even when the side surface SS1B of the control gate electrode CGB has surface roughness in a depth direction corresponding to the gate length direction (X-axis direction), the n$^-$-type semiconductor region 11a is formed by self-alignment with the side surface SS1B of the control gate electrode CGB. As a result, at any position in the gate width direction (Y-axis direction), it is possible to reduce hot carriers or suppress a short-channel effect in each of the control transistors CTA and CTB.

Note that, in the present specification, a direction perpendicular to the main surface 1a of the semiconductor substrate 1 is defined to include, not only the direction perpendicular to the main surface 1a of the semiconductor substrate 1, but also a direction having an angle of not more than 2° between itself and the direction perpendicular to the main surface 1a of the semiconductor substrate 1.

In Step S11, next, as shown in FIG. 18, a resist film RF2 is formed as a mask film so as to cover the entire main surface 1a of the semiconductor substrate 1. Then, in the areas of the memory cell region 1A where the n⁻-type semiconductor regions 11b and 11c are formed, openings OP2 are formed to extend through the resist film RF2 and reach the p-type well PW1. Thus, a resist pattern RP2 made of the resist film RF2 formed with the openings OP2 is formed. That is, an opening OP2A as the opening OP2 is formed to extend through the resist film RF2 and reach the portion of p-type well PW1 which is located opposite to the control gate electrode CGA relative to the memory gate electrode MGA interposed therebetween. On the other hand, an opening OP2B as the opening OP2 is formed to extend through the resist film RF2 and reach the portion of the p-type well PW1 which is located opposite to the control gate electrode CGB relative to the memory gate electrode MGB interposed therebetween.

At this time, the n⁻-type semiconductor region 11a in the memory cell region 1A and the main surface 1a of the semiconductor substrate 1 in the peripheral circuit region 1B are covered with the resist film RF2. That is, in the memory cell region 1A, the portion of the p-type well PW1 which is located between the control gate electrodes CGA and CGB is covered with the resist film RF2.

Next, using the resist pattern RP2 as a mask, n-type impurity ions IM2 such as, e.g., arsenic (As) or phosphorus (P) ions are implanted. As a result, the n⁻-type semiconductor region 11b is formed in the upper-layer portion of the part of the p-type well PW1 which is located opposite to the control gate electrode CGA relative to the memory gate electrode MGA interposed therebetween. On the other hand, the n⁻-type semiconductor region 11c is formed in the upper-layer portion of the part of the p-type well PW1 which is located opposite to the control gate electrode CGB relative to the memory gate electrode MGB interposed therebetween. Then, the resist pattern RP2 is removed.

Preferably, the side surface SS2A of the memory gate electrode MGA opposite to the side surface thereof closer to the control gate electrode CGA is exposed in the opening OP2A, while the side surface SS2B of the memory gate electrode MGB opposite to the side surface thereof closer to the control gate electrode CGB is exposed in the opening OP2B. Thus, the n⁻-type semiconductor region 11b is formed by self-alignment with the side surface SS2A of the memory gate electrode MGA and the n⁻-type semiconductor region 11c is formed by self-alignment with the side surface SS2B of the memory gate electrode MGB.

More preferably, the impurity ions IM2 are implanted from the direction DR1 perpendicular to the main surface 1a of the semiconductor substrate 1. By doing so, even when the side surface SS2A of the memory gate electrode MGA has surface roughness in a depth direction corresponding to the gate length direction (X-axis direction), the n⁻-type semiconductor region 11b is formed by self-alignment with the side surface SS2A of the memory gate electrode MGA. Also, even when the side surface SS2B of the memory gate electrode MGB has surface roughness in a depth direction corresponding to the gate length direction (X-axis direction), the n⁻-type semiconductor region 11c is formed by self-alignment with the side surface SS2B of the memory gate electrode MGB. As a result, at any position in the gate width direction (Y-axis direction), it is possible to reduce hot carriers or suppress a short-channel effect in each of the memory transistors MTA and MTB.

Note that, by performing the steps shown in FIGS. 17 and 18, using the control gate electrode CGA and the memory gate electrode MGA as a mask, n-type impurity ions are implanted into the semiconductor substrate 1 and, using the control gate electrode CGB and the memory gate electrode MGB as a mask, n-type impurity ions are implanted into the semiconductor substrate 1.

In Step S11, next, as shown in FIG. 19, a resist film RF3 as a mask film is formed so as to cover the entire main surface 1a of the semiconductor substrate 1. Then, from the peripheral circuit region 1B, the resist film RF3 is removed to form a resist pattern RP3 made of the portion of the resist film RF3 which is left in the memory cell region 1A. At this time, the n⁻-type semiconductor regions 11a, 11b, and 11c are covered with the resist film RF3.

Next, using the resist pattern RP3 as a mask, n-type impurity ions IM3 such as, e.g., arsenic (As) or phosphorus (P) ions are implanted. At this time, in the peripheral circuit region 1B, using the gate electrode GE1 as a mask, the n-type impurity ions IM3 are implanted into the semiconductor substrate 1.

As a result, in the peripheral circuit region 1B, the n⁻-type semiconductor region 11d is formed by self-alignment with the side surface SS3A of the gate electrode GE1 which is located on one side thereof, while the n⁻-type semiconductor region 11e is formed by self-alignment with the side surface SS3B of the gate electrode GE1 which is located on the side thereof opposite to the one side. That is, the n⁻-type semiconductor region 11d is formed in the upper-layer portion of the part of the p-type well PW2 which is located on the one side of the gate electrode GE1. On the other hand, the n⁻-type semiconductor region 11e is formed in the upper-layer portion of the part of the p-type well PW2 which is located on the side of the gate electrode GE1 opposite to the one side. Then, the resist pattern RP3 is removed.

Preferably, the impurity ions IM3 are implanted from the direction DR1 perpendicular to the main surface 1a of the semiconductor substrate 1. By doing so, even when the side surface SS3A of the gate electrode GE1 has surface roughness in a depth direction corresponding to the gate length direction (X-axis direction), the n⁻-type semiconductor region 11d is formed by self-alignment with the side surface SS3A of the gate electrode GE1. Also, even when the side surface SS3B of the gate electrode GE1 has surface roughness in a depth direction corresponding to the gate length direction (X-axis direction), the n⁻-type semiconductor region 11e is formed by self-alignment with the side surface SS3B of the gate electrode GE1. As a result, at any position in the gate width direction (Y-axis direction), it is possible to reduce hot carriers or suppress a short-channel effect in the MISFET Q1.

The order in which the steps of forming the individual n⁻-type semiconductor regions 11a, 11b, 11c, 11d, and 11e are performed is not limited to the order shown above. Accordingly, the steps of forming the individual n⁻-type semiconductor regions 11a, 11b, 11c, 11d, and 11e may be performed in any order.

Figure 20:
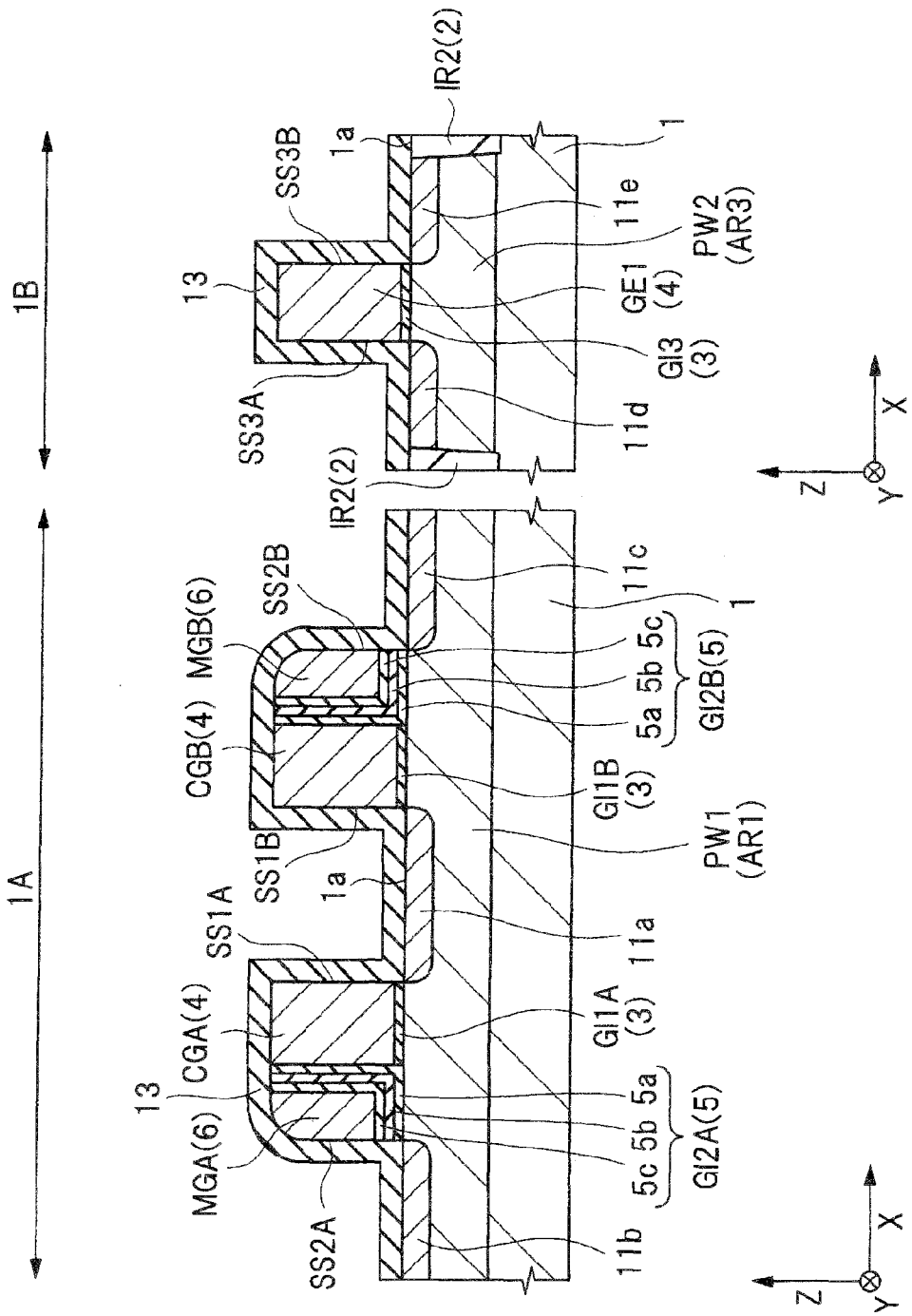
FIG. 20 is a main-portion cross-sectional view of the semiconductor device in Embodiment 1 during the manufacturing process thereof.
Figure 21:
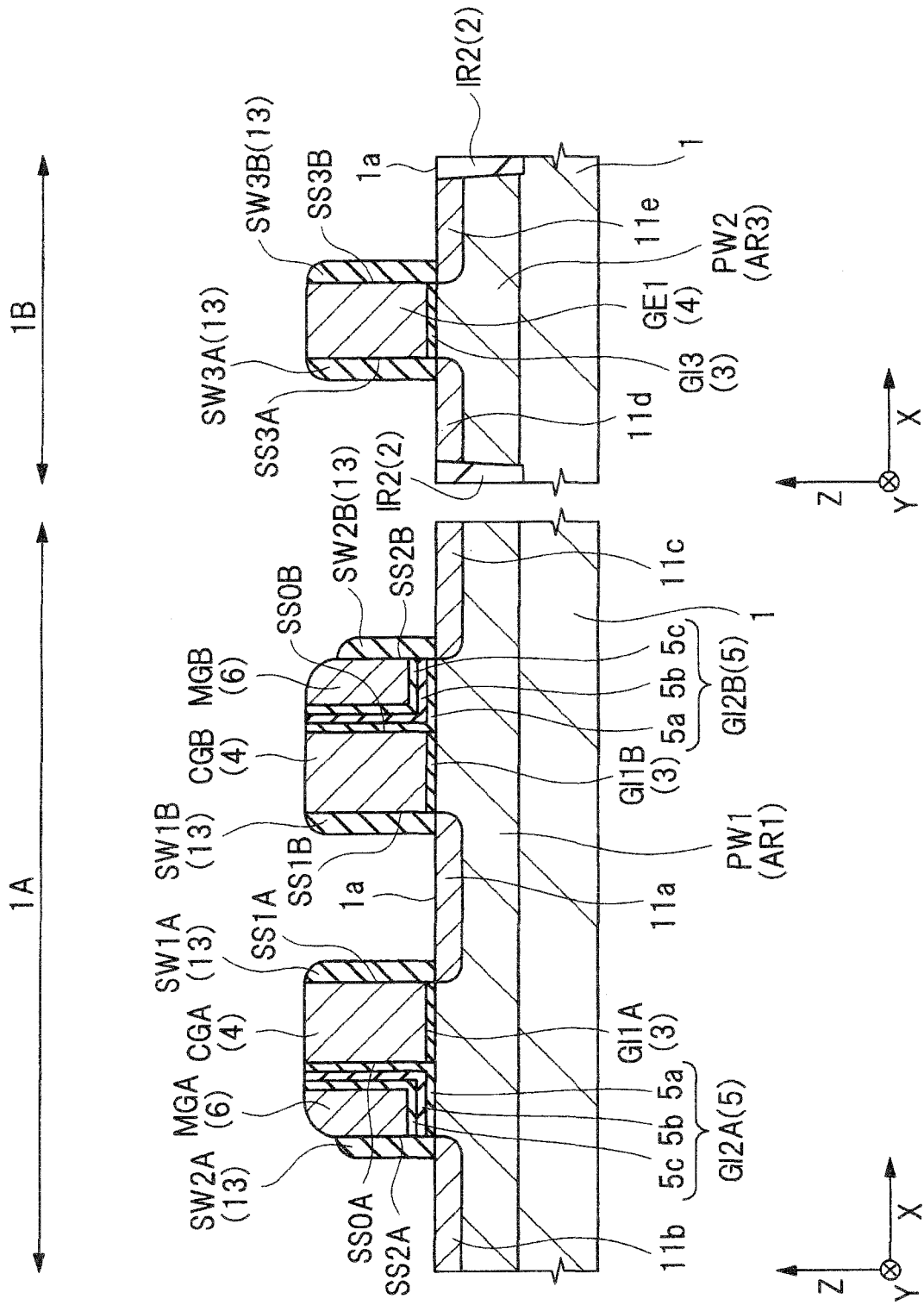
FIG. 21 is a main-portion cross-sectional view of the semiconductor device in Embodiment 1 during the manufacturing process thereof.

Next, as shown in FIGS. 20 and 21, over the side surface SS1A of the control gate electrode CGA, the sidewall spacer SW1A is formed while, over the side surface SS2A of the memory gate electrode MGA, the sidewall spacer SW2A is formed (Step S12 in FIG. 9).

First, as shown in FIG. 20, over the entire main surface 1a of the semiconductor substrate 1, the insulating film 13 is formed. The insulating film 13 is made of an insulating film such as a silicon dioxide film, a silicon nitride film, or a laminated film thereof.

Next, as shown in FIG. 21, the formed insulating film 13 is etched back by, e.g., anisotropic etching.

By thus selectively leaving the insulating film 13 over the side surface SS1A of the control gate electrode CGA opposite to the side thereof closer to the memory gate electrode MGA, i.e., the side surface SS1A opposite to the side surface SS0A, the sidewall spacer SW1A made of the insulating film 13 is formed. Also, by selectively leaving the insulating film 13 over the side surface SS2A of the memory gate electrode MGA opposite to the side thereof closer to the control gate electrode CGA, the sidewall spacer SW2A made of the insulating film 13 is formed.

On the other hand, by selectively leaving the insulating film 13 over the side surface SS1B of the control gate electrode CGB opposite to the side surface thereof closer to the memory gate electrode MGB, i.e., the side surface SS1B opposite to the side surface SS0B, the sidewall spacer SW1B made of the insulating film 13 is formed. Also, by selectively leaving the insulating film 13 over the side surface SS2B of the memory gate electrode MGB opposite to the side surface thereof closer to the control gate electrode CGB, the sidewall spacer SW2B made of the insulating film 13 is formed.

Additionally, by selectively leaving the insulating film 13 over the side surface SS3A of the gate electrode GE1, the sidewall spacer SW3A made of the insulating film 13 is formed. Also, by selectively leaving the insulating film 13 over the side surface SS3B of the gate electrode GE1 opposite to the side surface SS3A, the sidewall spacer SW3B made of the insulating film 13 is formed.

Next, as shown in FIGS. 22 to 27, the $n^+$-type semiconductor regions 12a, 12b, 12c, 12d, and 12e are formed (Step S13 in FIG. 9). In Step S13, using, e.g., photolithography and an ion implantation method, the $n^+$-type semiconductor regions 12a, 12b, 12c, 12d, and 12e are formed in the upper-layer portions of the p-type wells PW1 and PW2.

Figure 22:
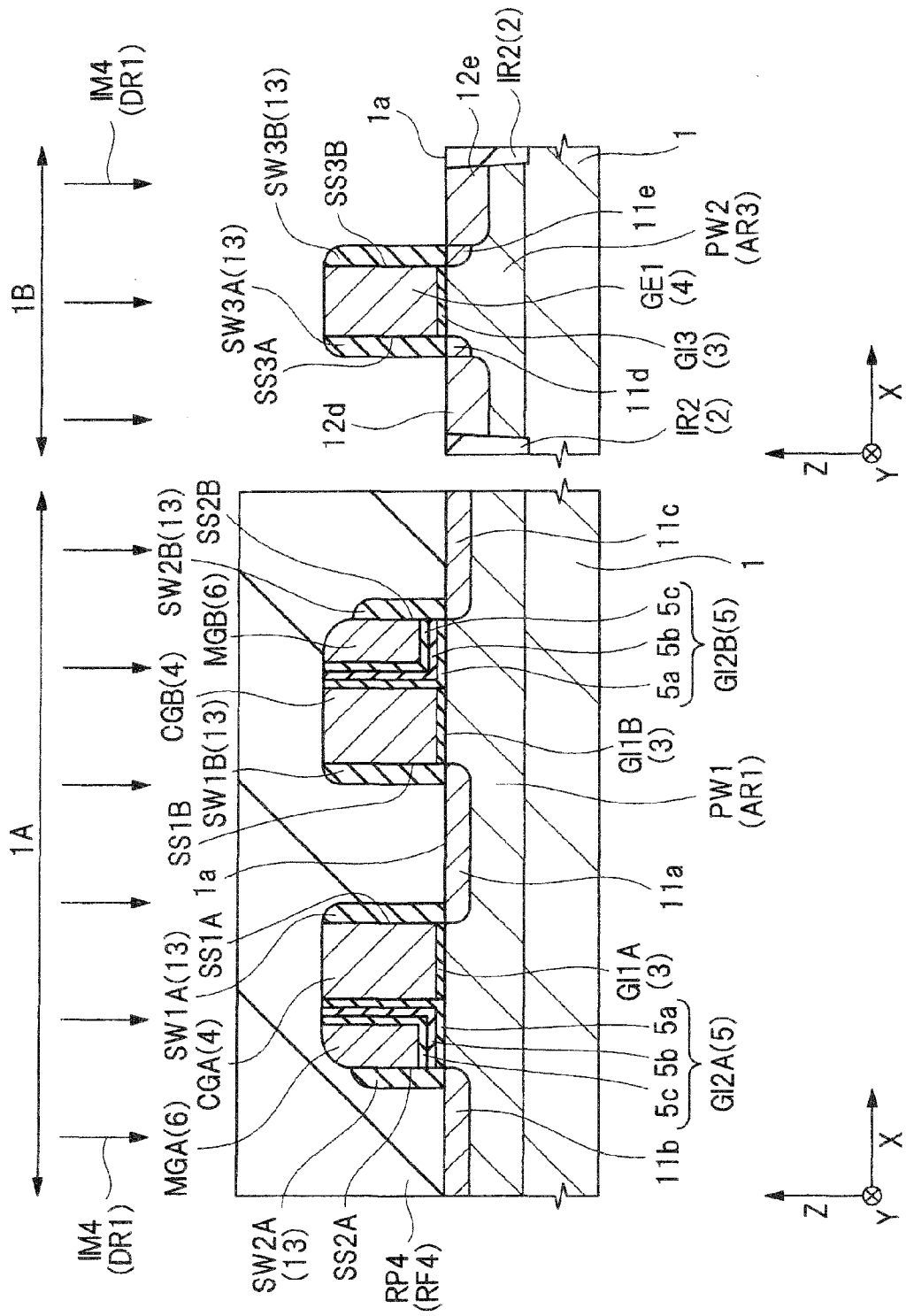
FIG. 22 is a main-portion cross-sectional view of the semiconductor device in Embodiment 1 during the manufacturing process thereof.

In Step S13, first, as shown in FIG. 22, in the peripheral circuit region 1B, impurity ions are implanted into the p-type well PW2 (Step S21 in FIG. 10).

In Step S21, first, a resist film RF4 is formed so as to cover the entire main surface 1a of the semiconductor substrate 1. Then, in the peripheral circuit region 1B, the resist film RF4 is removed to form a resist pattern RP4 made of the portion of the resist film RF4 which is left in the memory cell region 1A. At this time, the $n^-$-type semiconductor regions 11a, 11b, and 11c in the memory cell region 1A are covered with the resist film RF4.

In Step S21, next, using the resist pattern RP4 as a mask, n-type impurity ions IM4 such as, e.g., arsenic (As) or phosphorus (P) ions are implanted. At this time, in the peripheral circuit region 1B, using the gate electrode GE1 and the sidewall spacers SW3A and SW3B as a mask, the n-type impurity ions IM4 are implanted into the semiconductor substrate 1.

Thus, in the peripheral circuit region 1B, the $n^+$-type semiconductor region 12d is formed by self-alignment with the side surface of the sidewall spacer SW3A formed over the side surface SS3A of the gate electrode GE1. On the other hand, the $n^+$-type semiconductor region 12e is formed by self-alignment with the side surface of the sidewall spacer SW3B formed over the side surface SS3B of the gate electrode GE1.

That is, the $n^+$-type semiconductor region 12d is formed in the upper-layer portion of the part of the p-type well PW2 which is located opposite to the gate electrode GE1 relative to the sidewall spacer SW3A interposed therebetween. On the other hand, the $n^+$-type semiconductor region 12e is formed in the upper-layer portion of the part of the p-type well PW2 which is located opposite to the gate electrode GE1 relative to the sidewall spacer SW3B interposed therebetween. The $n^+$-type semiconductor region 12d is in contact with the $n^-$-type semiconductor region 11d. An n-type impurity concentration in the $n^+$-type semiconductor region 12d is higher than an n-type impurity concentration in the $n^-$-type semiconductor region 11d. The $n^+$-type semiconductor region 12e is in contact with the $n^-$-type semiconductor region 11e. An n-type impurity concentration in the $n^+$-type semiconductor region 12e is higher than an n-type impurity concentration in the $n^-$-type semiconductor region 11e.

Then, the resist pattern RP4 is removed.

Note that the impurity ions IM4 are implanted from, e.g., the direction DR1 perpendicular to the main surface 1a of the semiconductor substrate 1.

Figure 23:
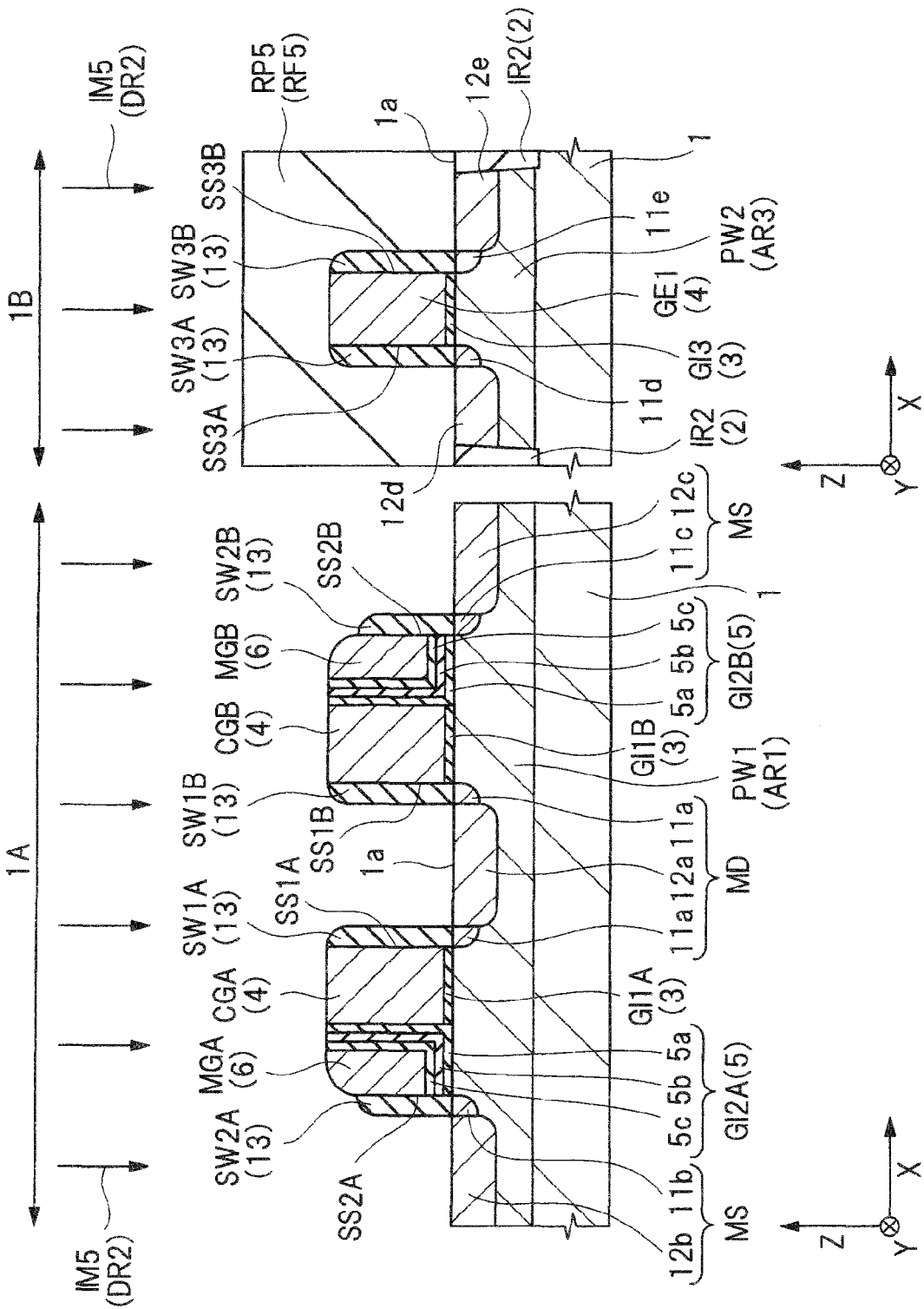
FIG. 23 is a main-portion cross-sectional view of the semiconductor device in Embodiment 1 during the manufacturing process thereof.
Figure 24:
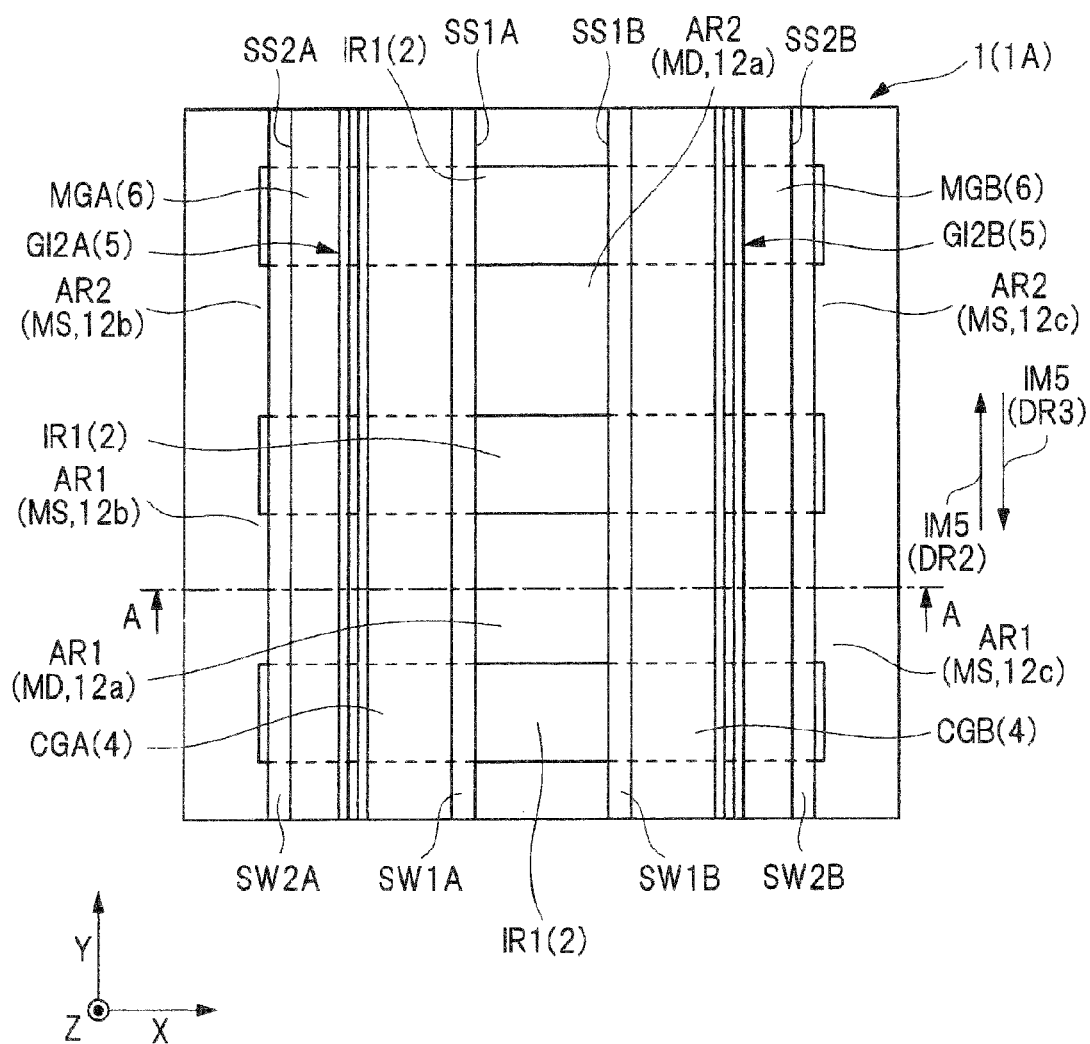
FIG. 24 is a main-portion cross-sectional view of the semiconductor device in Embodiment 1 during the manufacturing process thereof.

In Step S13, next, as shown in FIGS. 23 and 24, in the memory cell region 1A, impurity ions are implanted into the p-type well PW1 (Step S22 in FIG. 10).

In Step S22, first, a resist film RF5 is formed so as to cover the entire main surface 1a of the semiconductor substrate 1. Then, in the memory cell region 1A, the resist film RF5 is removed to form a resist pattern RP5 made of the portion of the resist film RF5 which is left in the peripheral circuit region 1B. At this time, the $n^-$-type semiconductor regions 11d and 11e and the $n^+$-type semiconductor regions 12d and 12e in the peripheral circuit region 1B are covered with the resist film RF5.

In Step S22, next, using the resist pattern RP5 as a mask, n-type impurity ions IM5 such as, e.g., arsenic (As) or phosphorus (P) ions are implanted. At this time, in the memory cell region 1A, using the control gate electrodes CGA and CGB, the memory gate electrodes MGA and MGB, and the sidewall spacers SW1A, SW1B, SW2A, and SW2B as a mask, the n-type impurity ions IM5 are implanted into the semiconductor substrate 1.

As a result, in the memory cell region 1A, the $n^+$-type semiconductor region 12a is formed by self-alignment with the side surface of the sidewall spacer SW1A formed over the side surface SS1A of the control gate electrode CGA and the side surface of the sidewall spacer SW1B formed over the side surface SS1B of the control gate electrode CGB. Also, in the memory cell region 1A, the $n^+$-type semiconductor region 12b is formed by self-alignment with the side surface of the sidewall spacer SW2A formed over the side surface SS2A of the memory gate electrode MGA. Additionally, the $n^+$-type semiconductor region 12c is formed by self-alignment with the side surface of the sidewall spacer SW2B formed over the side surface SS2B of the memory gate electrode MGB.

That is, the $n^+$-type semiconductor region 12a is formed in the upper-layer portion of the part of the p-type well PW1 which is located between the sidewall spacer SW1A formed over the side surface SS1A of the control gate electrode CGA and the sidewall spacer SW1B formed over the side surface SS1B of the control gate electrode CGB. Also, the $n^+$-type semiconductor region 12b is formed in the upper-layer portion of the part of the p-type well PW1 which is located opposite to the memory gate electrode MGA relative to the sidewall spacer SW2A interposed therebetween. Additionally, the $n^+$-type semiconductor region 12c is formed in the upper-layer portion of the part of the p-type well PW1 which is located opposite to the memory gate electrode MGB relative to the sidewall spacer SW2B interposed therebetween.

The $n^+$-type semiconductor region 12a is in contact with the $n^-$-type semiconductor region 11a. An n-type impurity concentration in the $n^+$-type semiconductor region 12a is higher than an n-type impurity concentration in the $n^-$-type semiconductor region 11a. The $n^+$-type semiconductor region 12b is in contact with the $n^-$-type semiconductor region 11b. An n-type impurity concentration in the $n^+$-type semiconductor region 12b is higher than an n-type impurity concentration in the $n^-$-type semiconductor region 11b. The $n^+$-type semiconductor region 12c is in contact with the $n^-$-type semiconductor region 11c. An n-type impurity concentration in the n$^+$-type semiconductor region 12c is higher than an n-type impurity concentration in the n$^-$-type semiconductor region 11c.

Then, the resist pattern RP5 is removed.

Preferably, as shown in FIGS. 24 and 25, the impurity ions IM5 are implanted from a direction DR2 inclined relative to the direction DR1 perpendicular to the main surface 1a of the semiconductor substrate 1 in the gate width direction (Y-axis direction).

By doing so, even when the side surface of the sidewall spacer SW1A has surface roughness in a depth direction corresponding to the gate length direction (X-axis direction), it is possible to reduce variations in the position of the end portion of the n$^+$-type semiconductor region 12a closer to the control gate electrode CGA in the gate length direction (X-axis direction) among different positions in the gate width direction (Y-axis direction). Also, even when the side surface of the sidewall spacer SW2A has surface roughness in a depth direction corresponding to the gate length direction (X-axis direction), it is possible to reduce variations in the position of the end portion of the n$^+$-type semiconductor region 12b closer to the memory gate electrode MGA in the gate length direction (X-axis direction) among different positions in the gate width direction (Y-axis direction).

Preferably, the process in Step S22 includes the step of implanting the impurity ions IM5 made of phosphorus (P) from the direction DR2 included relative to the direction DR1 perpendicular to the main surface 1a of the semiconductor substrate 1 in the gate width direction (Y-axis direction), and the step of implanting impurity ions made of arsenic (As) from the direction DR1 perpendicular to the main surface 1a of the semiconductor substrate 1. The diffusion coefficient of phosphorus in the p-type well PW1 is larger than the diffusion coefficient of arsenic in the p-type well PW1. Accordingly, the influence exerted by the impurity ions IM5 made of phosphorus on variations in the positions of the end portions of the n$^+$-type semiconductor regions 12a and 12b in the gate length direction (X-axis direction) is larger than the influence exerted by the impurity ions made of arsenic on variations in the positions of the end portions of the n$^+$-type semiconductor regions 12a and 12b in the gate length direction (X-axis direction). Therefore, it is preferable to implant the impurity ions IM5 made of phosphorus from the direction DR2 inclined relative to the direction DR1 perpendicular to the main surface 1a of the semiconductor substrate 1 in the gate width direction (Y-axis direction).

In such a case, as implantation conditions when the impurity ions IM5 made of phosphorus are implanted, an implantation energy is set to 10 keV and a dose is set to $2\times10^{15}$ cm$^{-2}$. Also, as implantation conditions when the impurity ions made of arsenic are implanted, an implantation energy is set to 20 keV and a dose is set to $2\times10^{15}$ cm$^{-2}$. Note that the implantation energy and the dose can be varied in accordance with a device structure.

More preferably, impurity ions can be implanted from two different directions. That is, as shown in FIGS. 24 to 26, it is possible to perform the step of implanting impurity ions from the direction DR2 inclined relative to and on one side of the direction DR1 perpendicular to the main surface 1a of the semiconductor substrate 1 in the gate width direction (Y-axis direction), and the step of implanting impurity ions from a direction DR3 inclined relative to and on the side of the direction DR1 opposite to the one side in the gate width direction (Y-axis direction).

As a result, even when the indentations formed on the side surface of the sidewall spacer SW1A have asymmetrical shapes relative to a plane (XZ-plane) perpendicular to the gate width direction (Y-axis direction), it is possible to reduce variations in the position of the end portion of the n$^+$-type semiconductor region 12a closer to the control gate electrode CGA in the gate length direction (X-axis direction) among different positions in the gate width direction. Also, even when the indentations formed on the side surface of the sidewall spacer SW2A have asymmetrical shapes relative to the plane (XZ-plane) perpendicular to the gate width direction (Y-axis direction), it is possible to reduce variations in the position of the end portion of the n$^+$-type semiconductor region 12b closer to the memory gate electrode MGA in the gate length direction (X-axis direction) among different positions in the gate width direction.

Here, the wording "the direction DR2 is a direction inclined relative to and on one side of the direction DR1 in the Y-axis direction" means that, as shown in FIG. 25, in a cross section viewed from a direction extending from the negative side toward the positive side in the X-axis direction, the direction DR2 is a direction obtained by clockwise rotating the direction DR1 by an angle θ1 (0°<θ1<90°). Also, the wording "the direction DR3 is a direction inclined relative to and on the side of the direction DR1 opposite to the one side in the Y-axis direction" means that, as shown in FIG. 26, in a cross section viewed from a direction extending from the negative side toward the positive side in the X-axis direction, the direction DR3 is a direction obtained by counterclockwise rotating the direction DR1 by an angle θ2 (0°<θ2<90°). A preferred range of θ1 is 10° to 50°. A preferred range of θ2 is 10° to 50°.

The direction DR2 in which the impurity ions IM5 are implanted may also be a direction inclined relative to the direction DR1 perpendicular to the main surface 1a of the semiconductor substrate 1 in the gate length direction (X-axis direction), not in the gate width direction (Y-axis direction). In such a case also, variations in the position of the end portion of the n$^+$-type semiconductor region 12a closer to the control gate electrode CGA in the gate length direction (X-axis direction) among different positions in the gate width direction (Y-axis direction) can more significantly be reduced than in the case where the impurity ions IM5 are implanted from the direction DR1 perpendicular to the main surface 1a of the semiconductor substrate 1. Also, variations in the position of the end portion of the n$^+$-type semiconductor region 12b closer to the memory gate electrode MGA in the gate length direction (X-axis direction) among different positions in the gate width direction (Y-axis direction) can more significantly be reduced than in the case where the impurity ions IM5 are implanted from the direction DR1 perpendicular to the main surface 1a of the semiconductor substrate 1.

Note that the sidewall spacers SW1A and SW1B are disposed substantially symmetrically relative to the semiconductor region MD interposed therebetween, while the sidewall spacers SW2A and SW2B are disposed substantially symmetrically relative to the semiconductor region MS interposed therebetween. Accordingly, when the direction DR2 is a direction inclined in the gate length direction (X-axis direction), the region into which the impurity ions IM5 are implanted using the sidewall spacer SW1A as a mask and the region into which the impurity ions IM5 are implanted using the sidewall spacer SW1B as a mask are not disposed symmetrically relative to the semiconductor region MD interposed therebetween. Also, when the direction DR2 is a direction inclined in the gate length direction (X-axis direction), the region into which the impurity ions IM5 are implanted using the sidewall spacer SW2A as a mask and the region into which the impurity ions IM5 are implanted using the sidewall spacer SW2B as a mask are not disposed symmetrically relative to the semiconductor region MS interposed therebetween. Therefore, the direction DR2 in which the impurity ions IM5 are implanted is preferably a direction inclined relative to the direction DR1 perpendicular to the main surface 1a of the semiconductor substrate 1 in the gate width direction (Y-axis direction).

Note that the same applies also to the effect of reducing variations in the position of the end portion of the $n^+$-type semiconductor region 12a closer to the control gate electrode CGB and variations in the position of the end portion of the $n^+$-type semiconductor region 12c closer to the memory gate electrode MGB, though the illustration and detailed description thereof is omitted.

Thus, the $n^-$-type semiconductor region 11a and the $n^+$-type semiconductor region 12a having an impurity concentration higher than that thereof form the n-type semiconductor region MD functioning as the drain region of each of the memory cells MCA and MCB (see FIG. 27 described later). Also, the $n^-$-type semiconductor region 11b and the $n^+$-type semiconductor region 12b having an impurity concentration higher than that thereof form the n-type semiconductor region MS functioning as the source region of the memory cell MCA. Additionally, the $n^-$-type semiconductor region 11c and the $n^+$-type semiconductor region 12c having an impurity concentration higher than that thereof form the n-type semiconductor region MS functioning as the source region of the memory cell MCB.

Then, activation anneal as heat treatment for activating the impurities introduced into the $n^-$-type semiconductor regions 11a, 11b, 11c, 11d, and 11e, the $n^+$-type semiconductor regions 12a, 12b, 12c, 12d, and 12e, and the like is performed.

Figure 27:
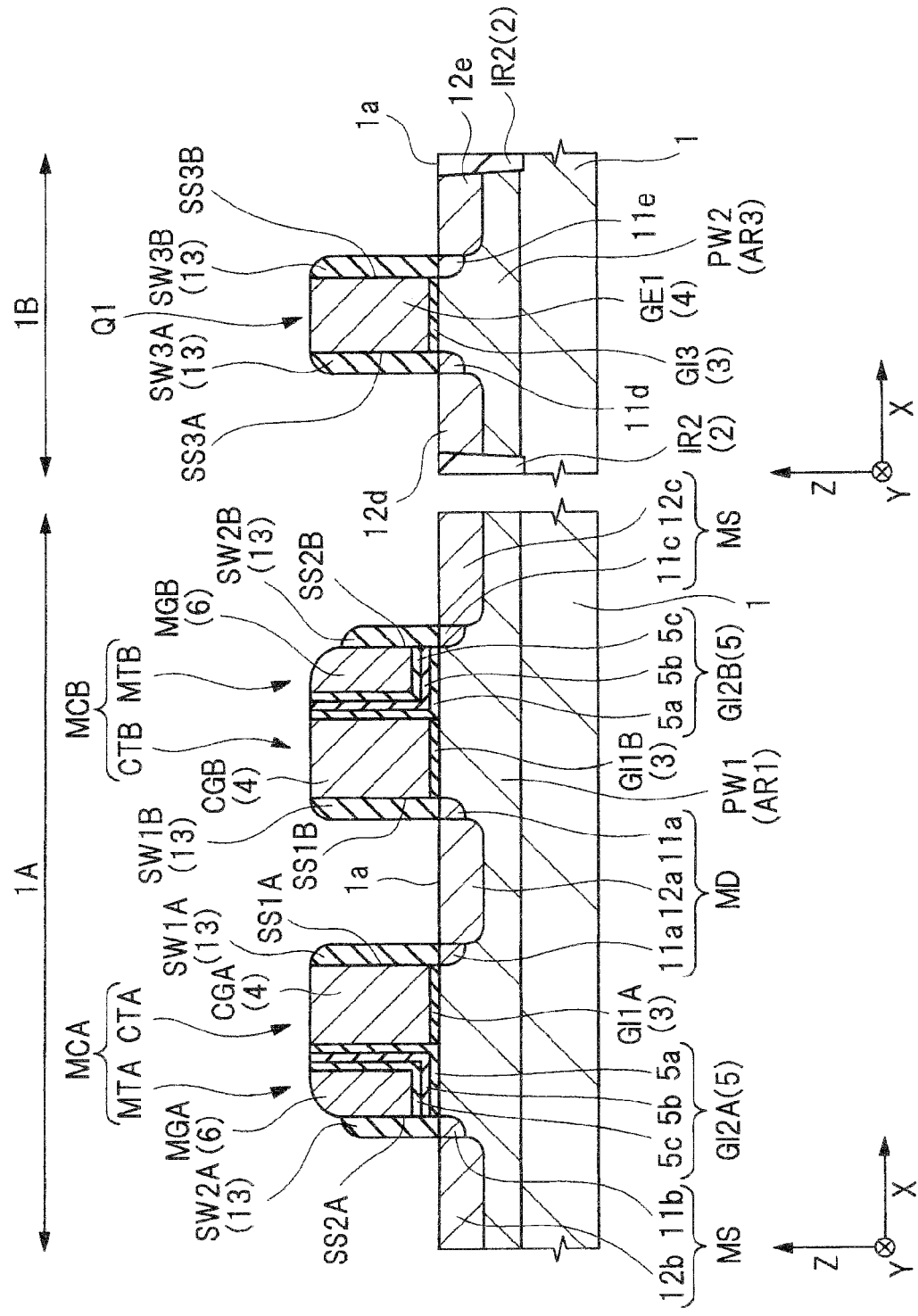
FIG. 27 is a main-portion cross-sectional view of the semiconductor device in Embodiment 1 during the manufacturing process thereof.

As a result, as shown in FIG. 27, in the memory cell region 1A, the control transistor CTA and the memory transistor MTA are formed. The control transistor CTA and the memory transistor MTA form the memory cell MCA as a nonvolatile memory. That is, the control gate electrode CGA, the gate insulating film GI1A, the memory gate electrode MGA, the gate insulating film GI2A, the semiconductor region MS, and the semiconductor region MD form the memory cell MCA as the nonvolatile memory.

Also, as shown in FIG. 27, in the memory cell region 1A, the control transistor CTB and the memory transistor MTB are formed. The control transistor CTB and the memory transistor MTB form the memory cell MCB as the nonvolatile memory. That is, the control gate electrode CGB, the gate insulating film GI1B, the memory gate electrode MGB, the gate insulating film GI2B, the semiconductor region MS, and the semiconductor region MD form the memory cell MCB as the nonvolatile memory.

On the other hand, as shown in FIG. 27, in the peripheral circuit region 1B, the MISFET Q1 is formed. That is, the gate electrode GE1, the gate insulating film GI3, the $n^-$-type semiconductor regions 11d and 11e, and the $n^+$-type semiconductor regions 12d and 12e form the MISFET Q1.

The order in which the step of implanting impurity ions to form the $n^+$-type semiconductor regions 12a, 12b, and 12c in the memory cell region 1A, and the step of implanting impurity ions to form the $n^+$-type semiconductor regions 12d and 12e in the peripheral circuit region 1B are performed is not limited to the order shown above. Accordingly, the step of implanting impurity ions to form the $n^+$-type semiconductor regions 12a, 12b, and 12c in the memory cell region 1A and the step of implanting impurity ions to form the $n^+$-type semiconductor regions 12d and 12e in the peripheral circuit region 1B may be performed in either order.

Next, as shown in FIG. 5, the metal silicide layers 14 are formed (Step S14 in FIG. 9). In Step S14, over the entire main surface 1a of the semiconductor substrate 1, a metal film is formed so as to cover the control gate electrodes CGA and CGB, the memory gate electrodes MGA and MGB, the gate electrode GE1, and the sidewall spacers SW1A, SW1B, SW2A, SW2B, SW3A, and SW3B. The metal film is made of, e.g., a cobalt (Co) film, a nickel (Ni) film, a nickel-platinum alloy film, or the like and can be formed using a sputtering method or the like. Then, heat treatment is performed on the semiconductor substrate 1 to cause the respective upper-layer portions of the $n^+$-type semiconductor regions 12a, 12b, 12c, 12d, and 12e to react with the metal film. Thus, over the $n^+$-type semiconductor regions 12a, 12b, 12c, 12d, and 12e, the respective metal silicide layers 14 are formed.

Each of the metal silicide layers 14 can be, e.g., a cobalt silicide layer, a nickel silicide layer, or a platinum-added nickel silicide layer. Then, the unreacted metal film is removed. By performing such a so-called salicide process, as shown in FIG. 5, over the $n^+$-type semiconductor regions 12a, 12b, 12c, 12d, and 12e, the respective metal silicide layers 14 can be formed. Note that, over the control gate electrodes CGA and CGB, the memory gate electrodes MGA and MGB, and the gate electrode GE1 also, the respective metal silicide layers 14 can be formed.

Next, as shown in FIG. 5, over the entire main surface 1a of the semiconductor substrate 1, the insulating film 15 and the interlayer insulating film 16 are formed (Step S15 in FIG. 9). In Step S15, first, over the main surface 1a of the semiconductor substrate 1, the insulating film 15 is formed so as to cover the control gate electrodes CGA and CGB, the memory gate electrodes MGA and MGB, the gate electrode GE1, and the sidewall spacers SW1A, SW1B, SW2A, SW2B, SW3A, and SW3B. The insulating film 15 is made of, e.g., a silicon nitride film. The insulating film 15 can be formed by, e.g., a CVD method.

Next, as shown in FIG. 5, over the insulating film 15, the interlayer insulating film 16 is formed. The interlayer insulating film 16 is made of a single-layer silicon dioxide film, a laminated film including a silicon nitride film and a silicon dioxide film, or the like. After the interlayer insulating film 16 is formed by, e.g., a CVD method, the upper surface of the interlayer insulating film 16 is planarized.

Next, as shown in FIGS. 2 and 5, the plugs PG1, PG2, and PG3 are formed to extend through the interlayer insulating film (Step S16 in FIG. 9). Note that, by way of example, the following will describe the case where, among the plugs PG1, PG2, and PG3, the plugs PG1 and PG3 are formed.

First, using a resist pattern (not shown) formed over the interlayer insulating film 16 using photolithography as an etching mask, the interlayer insulating film 16 is dry-etched to be formed with contact holes. Then, in the contact holes, the plugs PG1 and PG3 each made of a conductor film are formed.

To form the plugs PG1 and PG3, e.g., over the interlayer insulating film 16 including the inner surfaces of the contact holes, a barrier conductor film made of, e.g., a titanium (Ti) film, a titanium nitride (TiN) film, or a laminated film thereof is formed. Then, over the barrier conductor film, a main conductor film made of a tungsten (W) film or the like is formed so as to be embedded in the contact holes. The unneeded main conductor film and the unneeded barrier conductor film over the interlayer insulating film 16 are removed by a CMP (Chemical Mechanical Polishing) method, an etch-back method, or the like. Thus, the plugs PG1 and PG3 can be formed. Note that, in FIG. 5, for simpler illustration, the barrier conductor film and the main conductor film which are included in the plugs PG1 and PG3 are integrally shown.

The plugs PG1 are formed individually over the $n^+$-type semiconductor regions 12a, 12b, and 12c, the control gate electrodes CGA and CGB, and the memory gate electrodes MGA and MGB and electrically coupled individually to the $n^+$-type semiconductor regions 12a, 12b, and 12c, the control gate electrodes CGA and CGB, and the memory gate electrodes MGA and MGB. The plugs PG3 are formed respectively over the $n^+$-type semiconductor regions 12d and 12e and the gate electrode GE1 and electrically coupled respectively to the $n^+$-type semiconductor regions 12d and 12e and the gate electrode GE1.

In this manner, as shown in FIG. 5, the semiconductor device in Embodiment 1 is manufactured. Note that, over the interlayer insulating film 16 in which the plugs PG1 and PG3 are embedded, wires each using, e.g., copper (Cu) for a main conductive film can be formed using, e.g., a damascene technique. However, the description thereof is omitted herein.

<About Positions of End Portions of $n^+$-Type Semiconductor Regions in Memory Cell Region>

Next, the positions of the end portions of the $n^+$-type semiconductor regions 12a and 12b when, in the memory cell region 1A, the side surfaces of the sidewall spacers SW1A and SW2A have surface roughness in a depth direction corresponding to the gate length direction (X-axis direction) will be described in comparison to those in a method of manufacturing a semiconductor device in Comparative Example 1. Note that the same applies also to the positions of the end portions of the $n^+$-type semiconductor regions 12a and 12b when the side surfaces of the sidewall spacers SW1B and SW2B have surface roughness in a depth direction corresponding to the gate length direction (X-axis direction), though the description thereof is omitted below.

Figure 28:
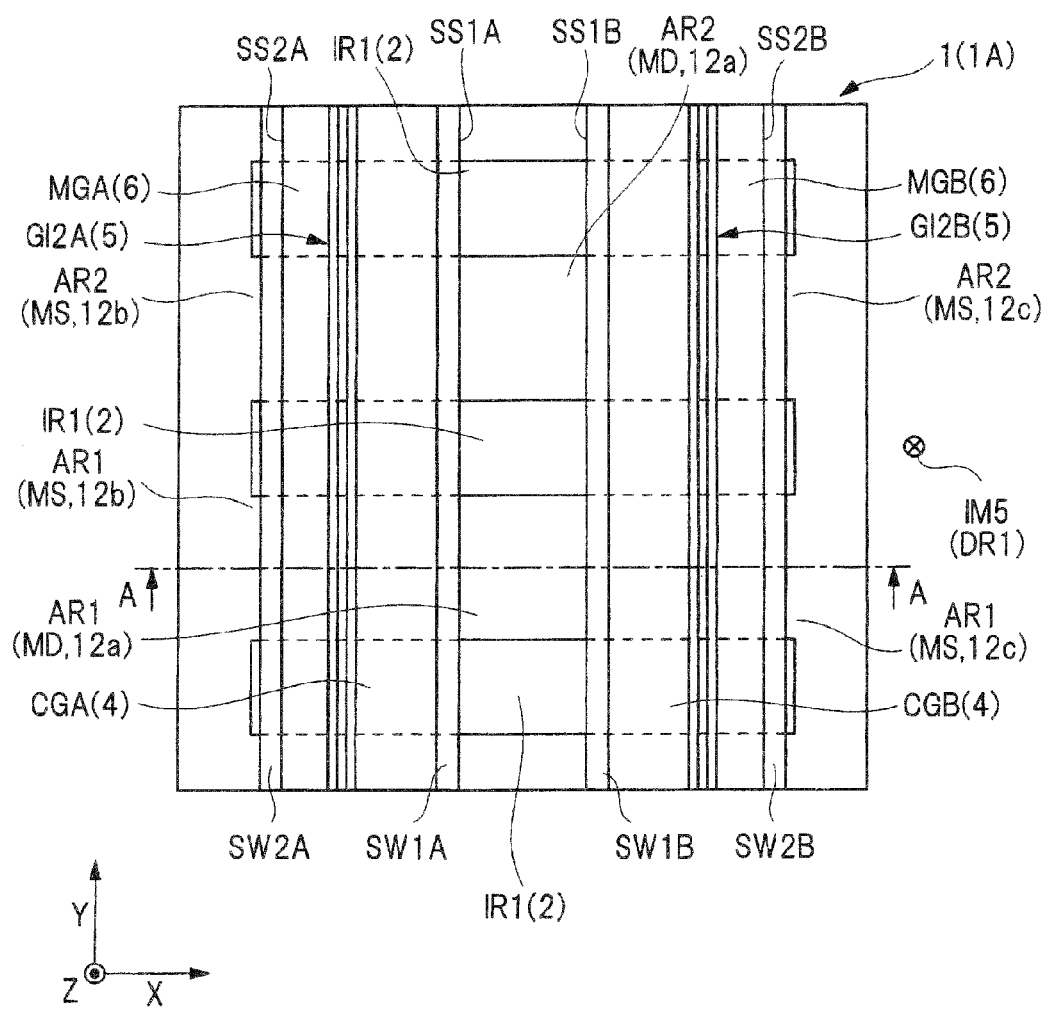
FIG. 28 is a main-portion plan view of a semiconductor device in Comparative Example 1 during the manufacturing process thereof.
Figure 29:
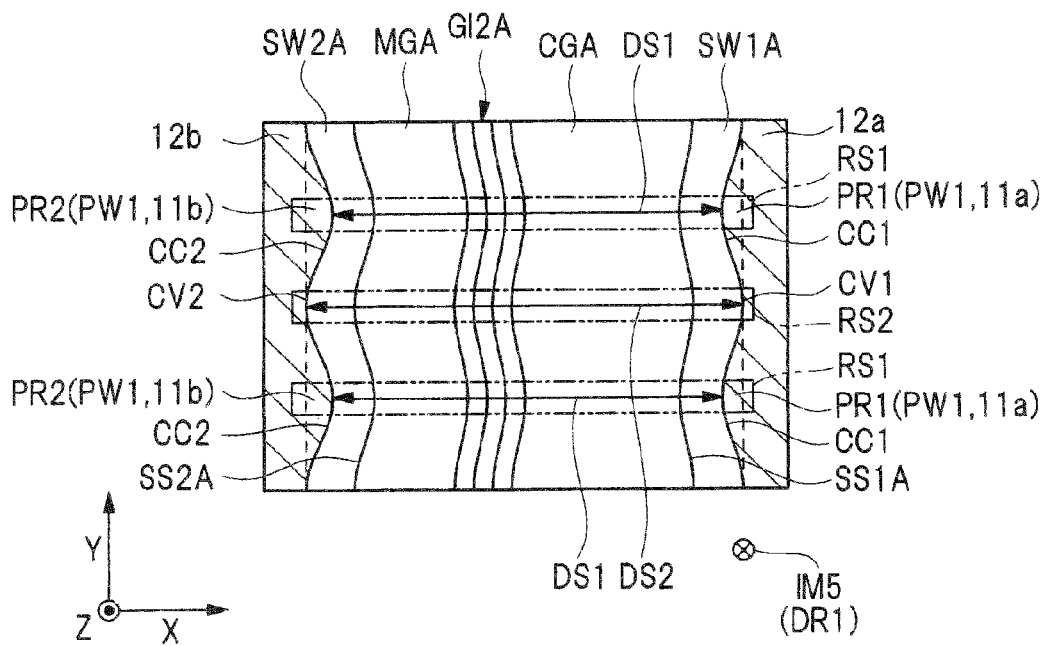
FIG. 29 is a main-portion plan view of the semiconductor device in Comparative Example 1 during the manufacturing process thereof.
Figure 30:
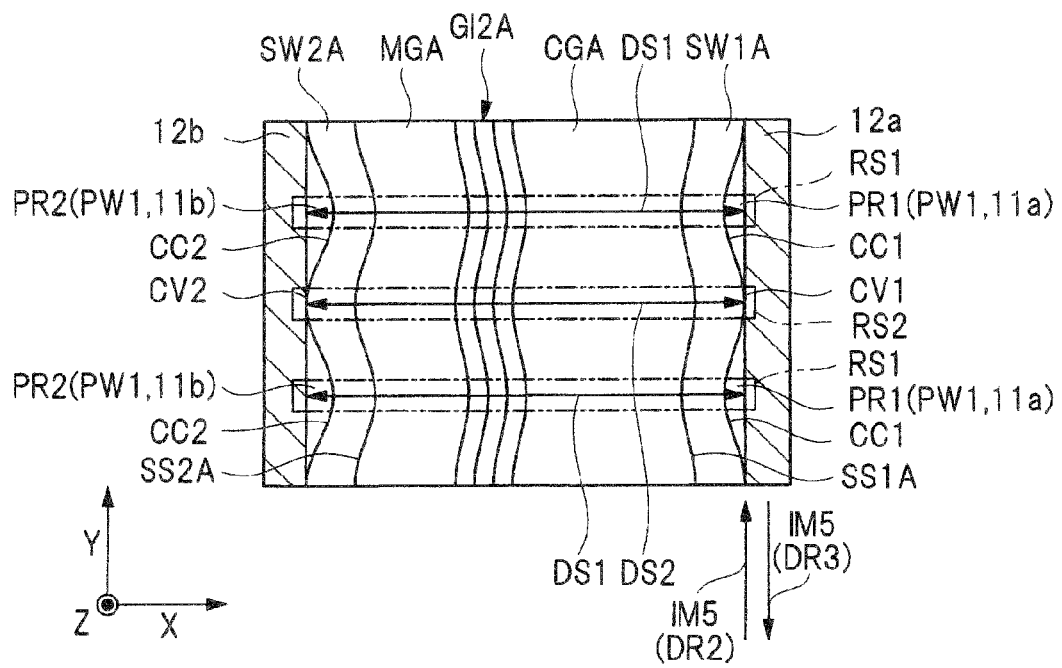
FIG. 30 is a main-portion plan view of the semiconductor device in Embodiment 1 during the manufacturing process thereof.

FIGS. 28 and 29 are main-portion plan views of the semiconductor device in Comparative Example 1 during the manufacturing process thereof. FIG. 30 is a main-portion plan view of the semiconductor device in Embodiment 1 during the manufacturing process thereof. FIG. 29 shows the periphery of each of the control gate electrode CGA and the memory gate electrode MGA in the plan view shown in FIG. 28 in enlarged relation. FIG. 30 shows the periphery of each of the control gate electrode CGA and the memory gate electrode MGA in the plan view shown in FIG. 24 in enlarged relation. In FIGS. 29 and 30, the regions into which the impurity ions IM5 are implanted are hatched.

In the method of manufacturing the semiconductor device in Comparative Example 1, steps corresponding to Step S1 in FIG. 8 to Step S16 in FIG. 9 are performed to manufacture the semiconductor device in Comparative Example 1.

In the manufacturing process of the semiconductor device in Comparative Example 1, unlike in the manufacturing process of the semiconductor device in Embodiment 1, when a step corresponding to the step described using FIG. 23, which is a part of a step corresponding to Step S13 in FIG. 9, is performed, as shown in FIGS. 28 and 29, the impurity ions IM5 are implanted from the direction DR1 perpendicular to the main surface 1a of the semiconductor substrate 1.

As the memory cell is reduced in size, the gate length of the control gate electrode CGA decreases. In such a case, when the conductive film 4 is patterned to form the control gate electrode CGA in a step corresponding to Step S5, the side surfaces of the resist pattern formed over the conductive film 4 may not be flat but have surface roughness in a depth direction corresponding to the gate length direction (X-axis direction). When the side surfaces of the resist pattern have surface roughness, the side surface of the control gate electrode CGA resulting from patterning carried out by performing etching using the resist pattern as an etching mask also has surface roughness in a direction corresponding to the gate length direction (X-axis direction).

For example, the side surfaces of a second pattern formed over the side surfaces of a first pattern having surface roughness after the formation of the first pattern have surface roughness larger than the surface roughness of the side surfaces of the first pattern. Accordingly, the side surface of the memory gate electrode MGA formed over the side surface of the control gate electrode CGA via the gate insulating film GI2A has surface roughness larger than the surface roughness of the side surface of the control gate electrode CGA. Also, the side surface of the sidewall spacer SW1A formed over the side surface SS1A of the control gate electrode CGA has surface roughness larger than the surface roughness of the side surface SS1A of the control gate electrode CGA. Also, the side surface of the sidewall spacer SW2A formed over the side surface SS2A of the memory gate electrode MGA has surface roughness larger than the surface roughness of the side surface SS2A of the memory gate electrode MGA.

In Comparative Example 1, as shown in FIG. 29, when the side surface of the sidewall spacer SW1A is not flat but have recessed portions CC1 each formed in a depth direction corresponding to the gate length direction (X-axis direction), the impurity ions IM5 are implanted also into the p-type well PW1 of each of the portions PR1 overlapping the recessed portions CC1 in plan view, i.e., into the $n^-$-type semiconductor regions 11a. Also, when the side surface of the sidewall spacer SW2A is not flat but have recessed portions CC2 each formed in a depth direction corresponding to the gate length direction (X-axis direction), the impurity ions IM5 are implanted also into the p-type well PW1 of each of the portions PR2 overlapping the recessed portions CC2 in plan view, i.e., into the $n^-$-type semiconductor region 11b.

A consideration will be given to a case where, e.g., as shown in FIG. 29, the recessed portions CC1 and the recessed portions CC2 face each other and a protruding portion CV1 and a protruding portion CV2 face each other. Here, the regions where the recessed portions CC1 and CC2 face each other and the gate length is locally shorter are referred to as regions RS1, and the region where the protruding portions CV1 and CV2 face each other and the gate length is locally longer is referred to as a region RS2. It is also assumed that the distance between the $n^+$-type semiconductor regions 12a and 12b in the gate length direction (X-axis direction) in each of the regions RS1 is a distance DS1 and the distance between the $n^+$-type semiconductor regions 12a and 12b in the gate length direction (X-axis direction) in the region RS2 is a distance DS2. In such a case, in Comparative Example 1, the distance DS1 is smaller than the distance DS2.

Here, a consideration will be given to a case where the distance between each of the $n^-$-type semiconductor regions 11a and the $n^-$-type semiconductor region 11b each functioning as an extension region in the LDD structure in the gate length direction (X-axis direction) is reduced. In such a case, the density of impurity ions in each of the $n^-$-type semiconductor regions 11a and 11b is high to a degree, but the implantation depth of the impurity ions is shallow. Consequently, a punch-through due to the diffusion of the impurity ions is less likely to occur.

On the other hand, a consideration will be given to a case where the distance between the $n^+$-type semiconductor regions 12a and 12b each functioning as the source region or the drain region has been reduced. In such a case, in each of the $n^+$-type semiconductor regions 12a and 12b, the implantation depth of the impurity ions is deep. Accordingly, a punch-through due to the diffusion of the impurity ions is more likely to occur. That is, the distance between the $n^+$-type semiconductor regions 12a and 12b is equal to an effective gate length. As a result, in a region where the distance between the n⁺-type semiconductor regions 12a and 12b, i.e., the effective gate length has locally been reduced such as, e.g., the region RS1 shown in FIG. 29, a short-channel effect becomes conspicuous in which a punch-through is more likely to occur as a result of a reduction in effective gate length.

Accordingly, variations in threshold voltage among the plurality of control transistors CTA (see FIG. 5) individually included in the plurality of memory cells MCA (see FIG. 5) increase to increase variations in threshold voltage among the plurality of memory transistors MTA (see FIG. 5) individually included in the plurality of memory cells MCA. As a result, in the semiconductor device including the plurality of memory cells MCA, a failure occurs when data is written to degrade the performance of the semiconductor device.

On the other hand, in the manufacturing process of the semiconductor device in Embodiment 1, when the step (Step S22 in FIG. 10) described using FIG. 23 is performed, as shown in FIGS. 23 to 25 and 30, the impurity ions IM5 are implanted from the direction DR2 inclined relative to the direction DR1 perpendicular to the main surface 1a of the semiconductor substrate 1 in the gate width direction (Y-axis direction).

In Embodiment 1, as shown in FIG. 30, when the side surface of the sidewall spacer SW1A is not flat and the recessed portions CC1 are formed in a depth direction corresponding to the gate length direction (X-axis direction), the impurity ions IM5 are not implanted into the p-type well PW1 of each of the portions PR1 overlapping the recessed portions CC1 in plan view, i.e., into the n⁻-type semiconductor regions 11a. Also, when the side surface of the sidewall spacer SW2A is not flat and the recessed portions CC2 are formed in a depth direction corresponding to the gate length direction (X-axis direction), the impurity ions IM5 are not implanted into the p-type well PW1 of each of the portions PR2 overlapping the recessed portions CC2 in plan view, i.e., into the n⁻-type semiconductor region 11b.

In the same manner as in FIG. 29, as shown in FIG. 30, the regions where the recessed portions CC1 and CC2 face each other in the gate length direction (X-axis direction) and the gate length is locally shorter are assumed to be the regions RS1. Also, the region where the protruding portions CV1 and CV2 face each other and the gate length is locally longer is assumed to be the region RS2. It is also assumed that the distance between the n⁺-type semiconductor regions 12a and 12b in the gate length direction (X-axis direction) in each of the regions RS1 is the distance DS1 and the distance between the n⁺-type semiconductor regions 12a and 12b in the gate length direction (X-axis direction) in the region RS2 is the distance DS2. In such a case, in Embodiment 1, the distance DS1 can be set equal to the distance DS2. That is, in Embodiment 1, impurity ions are implanted from the direction DR2 inclined in the gate width direction (Y-axis direction) to prevent the surface roughness of the side surfaces of the sidewall spacers SW1A and SW2A from affecting the positions of the end portions of the n⁺-type semiconductor regions 12a and 12b.

Consequently, even in the region where the gate length is locally shorter such as, e.g., the region RS1 shown in FIG. 30, it is possible to prevent or inhibit the distance between the n⁺-type semiconductor regions 12a and 12b, i.e., the effective gate length from being locally reduced. Therefore, it is possible to suppress a short-channel effect in which, in the memory cell MCA, a punch-through is likely to occur as a result of a reduction in effective gate length.

That is, in Embodiment 1, even in the regions RS1 where a punch-through is likely to occur in Comparative Example 1, the likelihood of the occurrence of a punch-through can be reduced. This can reduce variations in threshold voltage among the plurality of control transistors CTA (see FIG. 5) individually included in the plurality of memory cells MCA (see FIG. 5) and reduce variations in threshold voltage among the plurality of memory transistors MTA (see FIG. 5) included in the plurality of memory cells MCA. As a result, it is possible to prevent or inhibit the occurrence of a failure when data is written in the semiconductor device having the plurality of memory cells MCA and improve the performance of the semiconductor device.

A consideration will be given to a case where, when the step described using FIGS. 17 and 18, which is a part of Step S11 in FIG. 9, is performed, impurity ions are implanted from a direction inclined relative to the direction DR1 perpendicular to the main surface 1a of the semiconductor substrate 1 in the gate width direction (Y-axis direction). In such a case, the impurity ions implanted into the n⁻-type semiconductor regions 11a and 11b are less likely to be diffused. Accordingly, in the regions RS1 shown in FIG. 30, the end portions of the n⁻-type semiconductor regions 11a closer to the control gate electrode CGA may be further away from the side surface SS1A of the control gate electrode CGA in plan view or the end portion of the n⁻-type semiconductor region 11b closer to the memory gate electrode MGA may be further away from the side surface SS2A of the memory gate electrode MGA in plan view. As a result, the resistance of the upper-layer portion of the part of the p-type well PW1 which is adjacent to the side surface SS1A of the control gate electrode CGA or adjacent to the side surface SS2A of the memory gate electrode MGA in plan view increases. This may reduce an ON current flowing through the control transistor CTA and the memory transistor MTA.

On the other hand, in Embodiment 1, when the step described using FIGS. 17 to 18, which is a part of Step S11 in FIG. 9, is performed, impurity ions are implanted from the direction DR1 perpendicular to the main surface 1a of the semiconductor substrate 1. This can prevent or inhibit, in each of the regions RS1 shown in FIG. 30, the end portions of the n⁻-type semiconductor regions 11a closer to the control gate electrode CGA from being further away from the side surface SS1A of the control gate electrode CGA. This can also prevent or inhibit, in each of the regions RS1 shown in FIG. 30, the end portion of the n⁻-type semiconductor region 11b closer to the memory gate electrode MGA from being further away from the side surface SS2A of the memory gate electrode MGA. As a result, it is possible to reduce the resistance of the upper-layer portion of the part of the p-type well PW1 which is adjacent to the side surface SS1A of the control gate electrode CGA or adjacent to the side surface SS2A of the memory gate electrode MGA in plan view and increase the ON current flowing through the control transistor CTA and the memory transistor MTA.

Note that, in Embodiment 1, the distance between the end portion of the n⁺-type semiconductor region 12a closer to the control gate electrode CGA and the side surface SS1A of the control gate electrode CGA in the gate length direction is different between, e.g., the regions RS1 and RS2. Also, the distance between the end portion of the n⁺-type semiconductor region 12b closer to the memory gate electrode MGA and the side surface SS2A of the memory gate electrode MGA in the gate length direction is different between, e.g., the regions RS1 and RS2. However, since the impurity ions implanted into the n⁺-type semiconductor regions 12a and 12b are readily diffused, the influence exerted by the foregoing different distances related to the n$^+$-type semiconductor regions 12a and 12b on the ON current flowing through the control transistor CTA and the memory transistor MTA and on the ON resistance is small.

<About Main Characteristic Features and Effects of Embodiment 1>

In Embodiment 1, in the manufacturing process of the semiconductor device including the split-gate memory cell MCA, using the control gate electrode CGA and the memory gate electrode MGA which are formed over the semiconductor substrate as a mask, n-type impurity ions are implanted from the direction DR1 perpendicular to the main surface 1a of the semiconductor substrate 1. Then, using the control gate electrode CGA, the memory gate electrode MGA, and the sidewall spacers SW1A and SW2A as a mask, the n-type impurity ions IM5 are implanted from the direction DR2 inclined relative to the direction DR1 perpendicular to the main surface 1a of the semiconductor substrate 1.

This can prevent the surface roughness of the side surfaces of the sidewall spacers SW1A and SW2A from affecting the positions of the end portions of the n$^+$-type semiconductor regions 12a and 12b. That is, even when the side surfaces of the sidewall spacers SW1A and SW2A have surface roughness in the memory cell MCA, it is possible to prevent or inhibit the distance between the n$^+$-type semiconductor regions 12a and 12b in the gate length direction from being locally reduced and suppress the short-channel effect. This can reduce variations in threshold voltage among the plurality of control transistors CTA individually included in the plurality of memory cells MCA and reduce variations in threshold voltage among the plurality of memory transistors MTA included in the plurality of memory cells MCA. Therefore, it is possible to prevent or inhibit the occurrence of a failure when data is written in the semiconductor device including the plurality of memory cells MCA and improve the performance of the semiconductor device.

Embodiment 1 has effects as shown below in addition to the effects described above.

In the manufacturing process of each of the split-gate memory cells MCA, the control gate electrode CGA is formed first, and then the memory gate electrode MGA is formed so as to be adjacent to the control gate electrode CGA. Subsequently, over the side surface SS1A of the control gate electrode CGA opposite to the side surface thereof closer to the memory gate electrode MGA, the sidewall spacer SW1A is formed. Over the side surface SS2A of the memory gate electrode MGA opposite to the side surface thereof closer to the control gate electrode CGA, the sidewall spacer SW2A is formed. Consequently, the respective side surfaces of the control gate electrode CGA, the memory gate electrode MGA, the sidewall spacer SW1A, and the sidewall spacer SW2A have increasing surface roughness in the order they are listed. Accordingly, the surface roughness of the side surface of, e.g., the sidewall spacer SW2A is larger than the surface roughness of each of the side surfaces of the sidewall spacers SW3A and SW3B formed over the side surfaces of the gate electrode GE1 of the MISFET Q1.

As a result, the effect of preventing the surface roughness of the side surface of a sidewall spacer from affecting the positions of the end portions of the source region and the drain region by implanting impurity ions from a direction inclined in the gate width direction is larger in the memory cell region 1A than in the peripheral circuit region 1B.

Preferably, as shown in FIGS. 22 and 23, Step S21 of implanting the impurity ions to form the n$^+$-type semiconductor region 12d in the peripheral circuit region 1B and Step S22 of implanting the impurity ions to form the n$^+$-type semiconductor regions 12a and 12b in the memory cell region 1A are performed as different steps. This can prevent the n$^+$-type semiconductor regions 12d and 12e formed in the peripheral circuit region 1B from being affected when impurity ions are implanted from a direction inclined relative to a direction perpendicular to the main surface 1A of the semiconductor substrate 1.

Although the implantation of the impurity ions from each of the two directions DR2 and DR3 has been described using FIGS. 25 and 26, when only the implantation from the direction DR2 is performed, the number of steps in the manufacturing process can be reduced. This can minimize the influence of a reduced throughput due to the implantation of impurity ions from a direction inclined in the gate width direction.

Note that, in Embodiment 1, the description has been given of the example in which, when the source region or the drain region is formed by self-alignment with the sidewall formed over the side surface of the control gate electrode or the memory gate electrode extending in one direction, impurity ions are implanted from a direction inclined relative to a direction perpendicular to the main surface of the semiconductor substrate in the gate width direction. Likewise, when, in a MISFET or floating-type memory cell, a source region or a drain region is formed by self-alignment with the sidewall formed over the side surface of a gate electrode extending in one direction also, impurity ions can be implanted from a direction inclined relative to a direction perpendicular to the main surface of the semiconductor substrate in the gate width direction.

Embodiment 2

In the method of manufacturing the semiconductor device in Embodiment 1, when the n$^+$-type semiconductor regions 12a and 12b are formed in the memory cell region 1A, impurity ions are implanted from a direction inclined relative to a direction perpendicular to the main surface 1a of the semiconductor substrate 1. By contrast, in a method of manufacturing a semiconductor device in Embodiment 2, even when the n$^+$-type semiconductor regions 12d and 12e are formed in the peripheral circuit region 1B, impurity ions are implanted from a direction inclined relative to a direction perpendicular to the main surface 1a of the semiconductor substrate 1.

Note that the structure of the semiconductor device in Embodiment 2 is the same as the structure of the semiconductor device in Embodiment 1.

<Manufacturing Process of Semiconductor Device>

Figure 31:
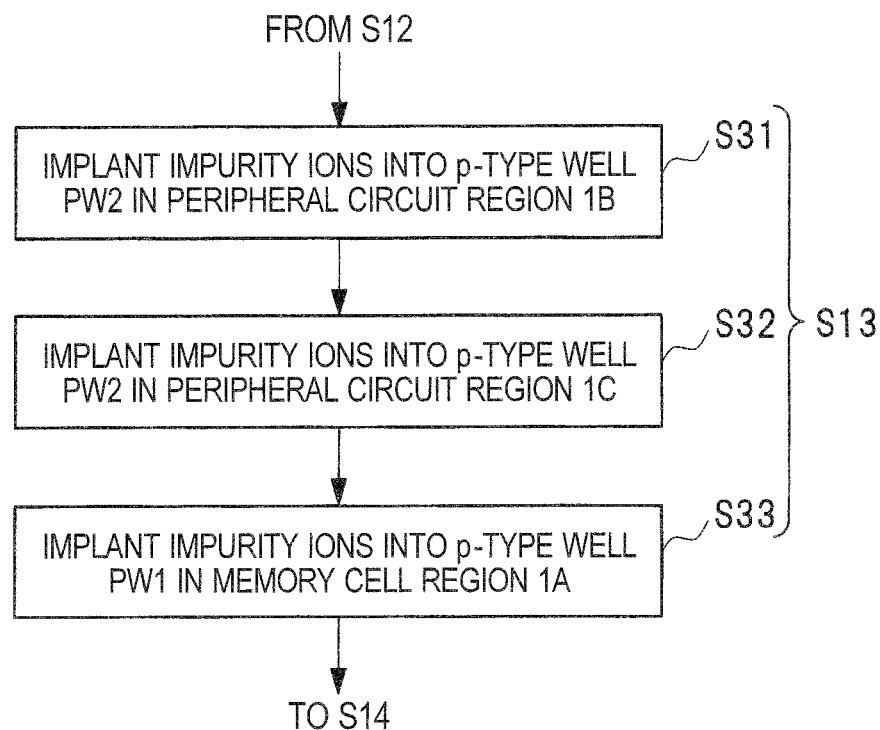
FIG. 31 is a process flow chart showing a part of the manufacturing process of a semiconductor device in Embodiment 2.

Next, a description will be given of the method of manufacturing the semiconductor device in Embodiment 2. FIG. 31 is a process flow chart showing a part of the manufacturing process of the semiconductor device in Embodiment 2. FIGS. 32, 33, 35, 37, and 38 are main-portion cross-sectional views of the semiconductor device in Embodiment 2 during the manufacturing process thereof. FIGS. 34 and 36 are main-portion plan views of the semiconductor device in Embodiment 2 during the manufacturing process thereof.

FIG. 31 shows the process included in Step S13 in FIG. 9. In FIGS. 32, 33, 35, 37, and 38, in addition to an element structure corresponding to a cross section along the line A-A in FIG. 2 in the memory cell region 1A and an element structure corresponding to a cross section along the line B-B in FIG. 3 in the peripheral circuit region 1B, an element structure corresponding to a cross section along the line C-C in FIG. 4 in the peripheral circuit region 1C is shown in combination.

Figure 32:
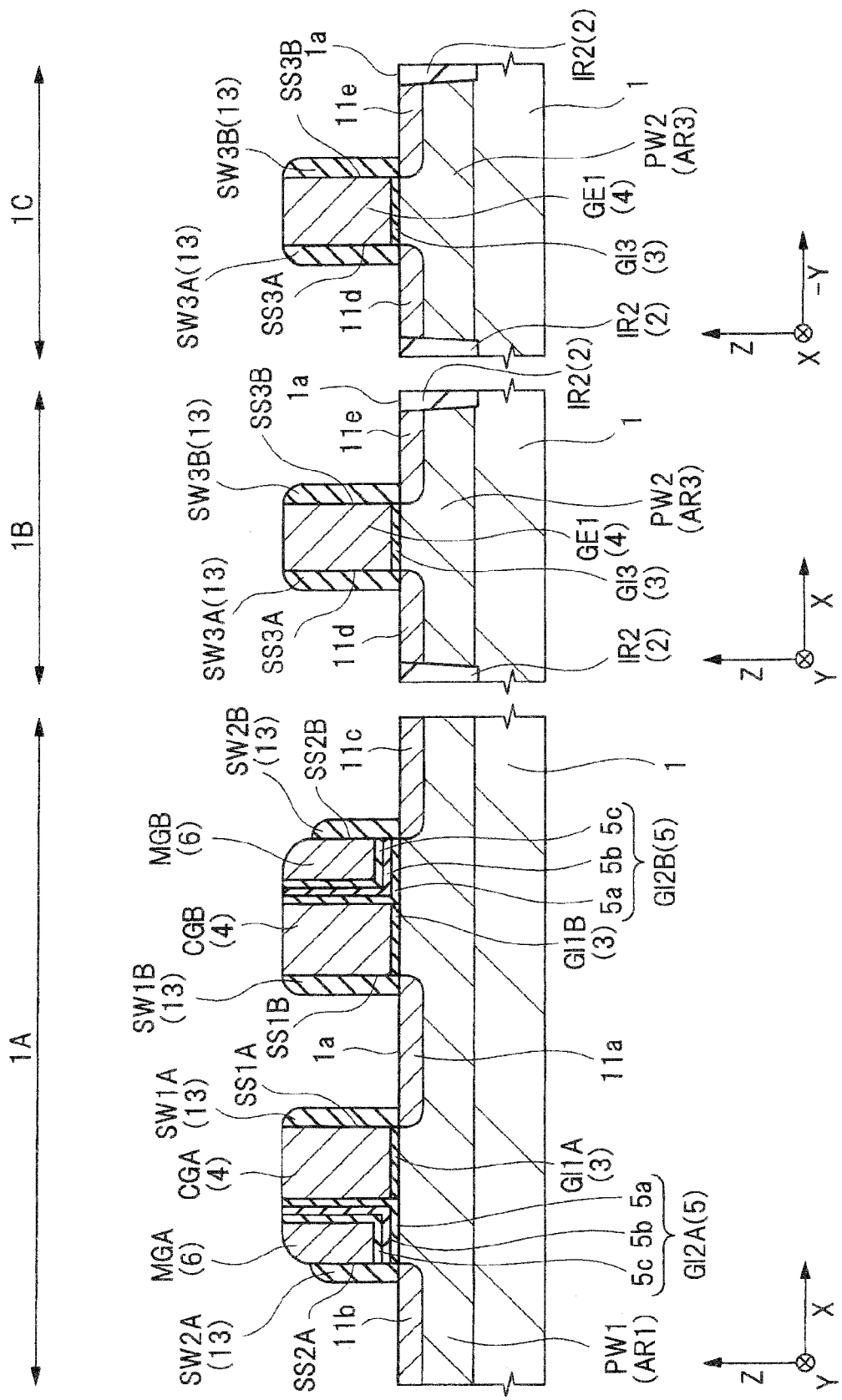
FIG. 32 is a main-portion cross-sectional view of the semiconductor device in Embodiment 2 during the manufacturing process thereof.

In Embodiment 2, first, in the same manner as in Embodiment 1, Steps S1 to S12 in FIG. 8 are performed. FIG. 32 shows a main-portion cross-sectional view of the semiconductor device after Steps S1 to S12 in FIG. 8 are performed.

In Step S5 among the foregoing steps in FIG. 8, in the peripheral circuit region 1C also, in the same manner as in the peripheral circuit region 1B, over the p-type well PW2, i.e., over the main surface 1a of the semiconductor substrate 1, the gate electrode GE1 is formed via the gate insulating film GI3. Also, as shown in FIG. 4, in the peripheral circuit region 1C, the gate electrode GE1 extends in the X-axis direction over the active region AR3 in plan view.

In Step S11 in FIG. 9, in the peripheral circuit region 1C also, in the same manner as in the peripheral circuit region 1B, using the gate electrode GE1 as a mask, n-type impurity ions are implanted into the semiconductor substrate 1. In Step S12 in FIG. 9, in the peripheral circuit region 1C also, in the same manner as in the peripheral circuit region 1B, over the side surface SS3A of the gate electrode GE1, the sidewall spacer SW3A made of the insulating film 13 is formed and, over the side surface SS3B of the gate electrode GE1 opposite to the side surface SS3A, the sidewall spacer SW3B made of the insulating film 13 is formed.

Next, Step S13 in FIG. 9 is performed to form the n$^+$-type semiconductor regions 12a, 12b, 12c, 12d, and 12e, as shown in FIGS. 33 to 38. In Step S13, using, e.g., photolithography and an ion implantation method, in the upper-layer portions of the p-type wells PW1 and PW2, the n$^+$-type semiconductor regions 12a, 12b, 12c, 12d, and 12e are formed.

Figure 33:
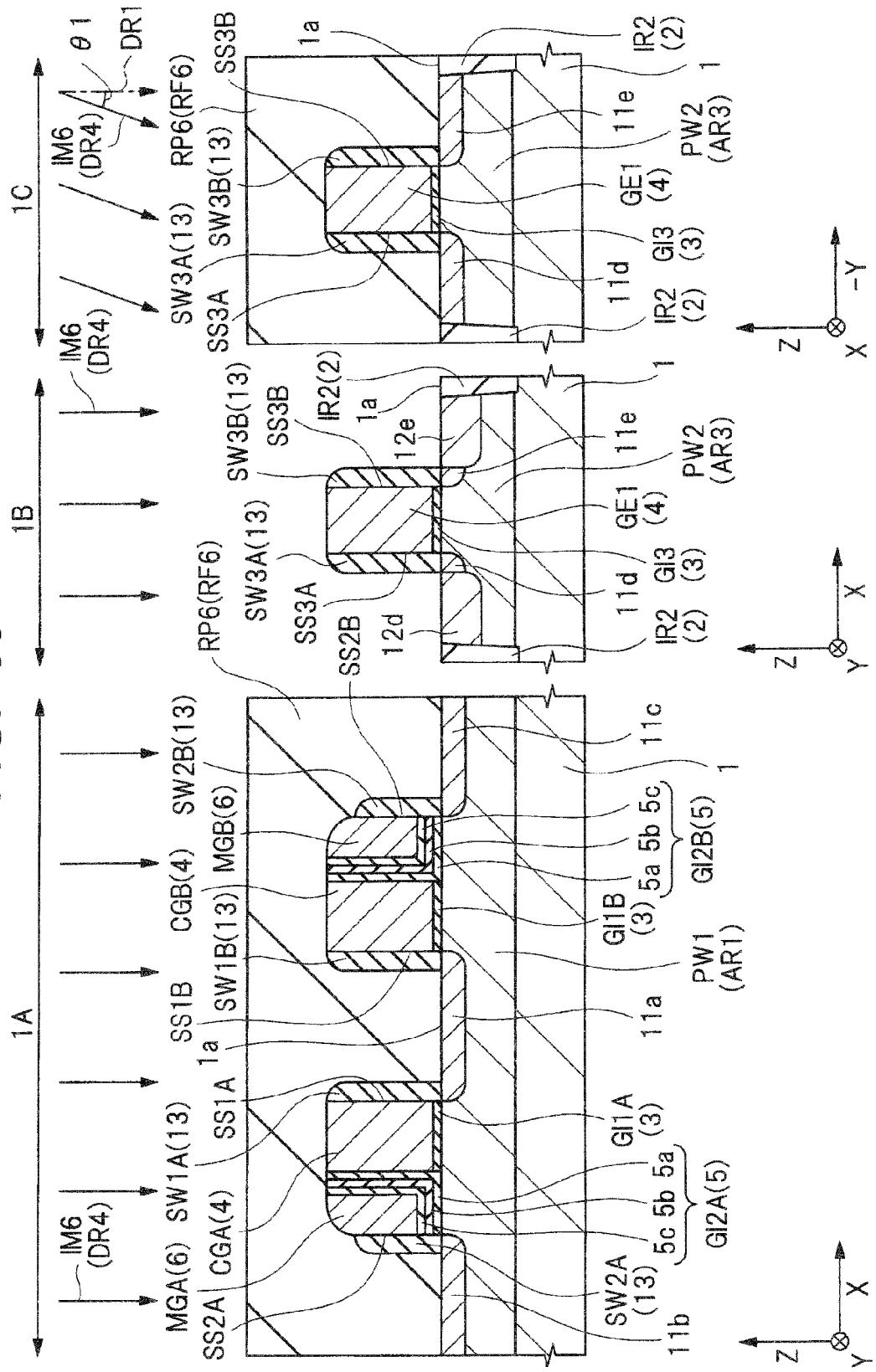
FIG. 33 is a main-portion cross-sectional view of the semiconductor device in Embodiment 2 during the manufacturing process thereof.
Figure 34:
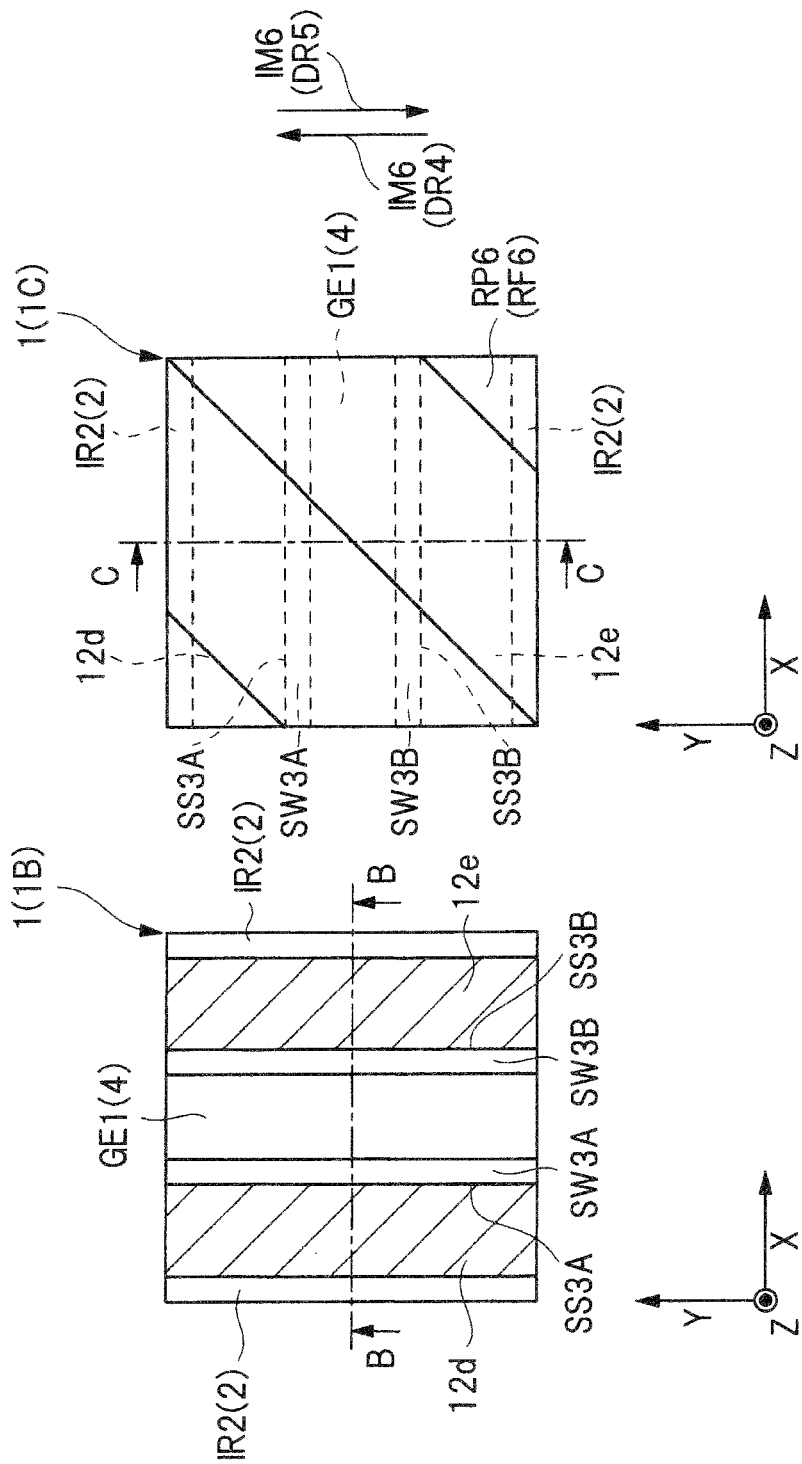
FIG. 34 is a main-portion plan view of the semiconductor device in Embodiment 2 during the manufacturing process thereof.

In Step S13, first, as shown in FIGS. 33 and 34, in the peripheral circuit region 1B, impurity ions are implanted into the p-type well PW2 (Step S31 in FIG. 31).

In Step S31, first, a resist film RF6 is formed so as to cover the entire main surface 1a of the semiconductor substrate 1. Then, from the peripheral circuit region 1B, the resist film RF6 is removed to form a resist pattern RP6 made of the portion of the resist film RF6 which is left in the memory cell region 1A and the peripheral circuit region 1C. At this time, the n$^-$-type semiconductor regions 11a, 11b, and 11c in the memory cell region 1A and the n$^-$-type semiconductor regions 11d and 11e in the peripheral circuit region 1C are covered with the resist film RF6.

In Step S31, next, in a state where the main surface 1a of the semiconductor substrate 1 located in the memory cell region 1A and the peripheral circuit region 1C is covered with the resist film RF6, using the resist pattern RP6 as a mask, n-type impurity ions IM6 such as, e.g., arsenic (As) or phosphorus (P) ions are implanted. At this time, in the peripheral circuit region 1B, using the gate electrode GE1 and the sidewall spacers SW3A and SW3B as a mask, the impurity ions IM6 are implanted into the semiconductor substrate 1.

Thus, in the peripheral circuit region 1B, the n$^+$-type semiconductor region 12d is formed by self-alignment with the side surface of the sidewall spacer SW3A formed over the side surface SS3A of the gate electrode GE1, and the n$^+$-type semiconductor region 12e is formed by self-alignment with the side surface of the sidewall spacer SW3B formed over the side surface SS3B of the gate electrode GE1.

That is, in the peripheral circuit region 1B, the n$^+$-type semiconductor region 12d is formed in the upper-layer portion of the part of the p-type well PW2 which is located opposite to the gate electrode GE1 relative to the sidewall spacer SW3A interposed therebetween. Also, in the peripheral circuit region 1B, the n$^+$-type semiconductor region 12e is formed in the upper-layer portion of the part of the p-type well PW2 which is located opposite to the gate electrode GE1 relative to the sidewall spacer SW3B interposed therebetween. Then, the resist pattern RP6 is removed.

Preferably, as shown in FIGS. 33 and 34, the impurity ions IM6 are implanted from a direction DR4 inclined relative to the direction DR1 perpendicular to the main surface 1a of the semiconductor substrate 1 in the gate width direction (Y-axis direction).

As a result, even when the side surface of the sidewall spacer SW3A has surface roughness in a depth direction corresponding to the gate length direction (X-axis direction) in the peripheral circuit region 1B, it is possible to reduce variations in the position of the end portion of the n$^+$-type semiconductor region 12d closer to the gate electrode GE1 in the gate length direction (X-axis direction) among different positions in the gate width direction (Y-axis direction). Also, even when the side surface of the sidewall spacer SW3B has surface roughness in a depth direction corresponding to the gate length direction (X-axis direction) in the peripheral circuit region 1B, it is possible to reduce variations in the position of the end portion of the n$^+$-type semiconductor region 12e closer to the gate electrode GE1 in the gate length direction (X-axis direction) among different positions in the gate width direction (Y-axis direction).

Note that, similarly to Step S22 in FIG. 10, Step S31 may also include the step of implanting the impurity ions IM6 made of phosphorus (P) from the direction DR4 inclined relative to the direction DR1 perpendicular to the main surface 1a of the semiconductor substrate 1 in the gate width direction (Y-axis direction), and the step of implanting impurity ions made of arsenic (As) from the direction DR1 perpendicular to the main surface 1a of the semiconductor substrate 1.

More preferably, in the same manner as described using FIGS. 24 to 26 in Embodiment 1, impurity ions can be implanted from two different directions. That is, as shown in FIGS. 33 and 34, it is possible to perform the step of implanting impurity ions from the direction DR4 inclined relative to and on one side of the direction DR1 perpendicular to the main surface 1a of the semiconductor substrate 1 in the gate width direction (Y-axis direction), and the step of implanting impurity ions from the direction DR5 inclined relative to and on the side of the direction DR1 opposite to the one side in the gate width direction (Y-axis direction).

By doing so, even when the indentations formed on the side surface of the sidewall spacer SW3A have asymmetrical shapes relative to a plane (XZ-plane) perpendicular to the gate width direction (Y-axis direction), it is possible to reduce variations in the position of the end portion of the n$^+$-type semiconductor region 12d closer to the gate electrode GE1 in the gate length direction (X-axis direction) among different positions in the gate width direction. Also, even when the indentations formed on the side surface of the sidewall spacer SW3B have asymmetrical shapes relative to the plane (XZ-plane) perpendicular to the gate width direction (Y-axis direction), it is possible to reduce variations in the position of the end portion of the n$^+$-type semiconductor region 12e closer to the gate electrode GE1 in the gate length direction (X-axis direction) among different positions in the gate width direction.

Note that the angle formed between the directions DR4 and DR1 can be set similarly to the angle $\theta 1$ formed between the directions DR2 and DR1 described using FIG. 25. The angle formed between the directions DR5 and DR1 can be set similarly to the angle $\theta 2$ formed between the directions DR3 and DR1 described using FIG. 26.

Figure 35:
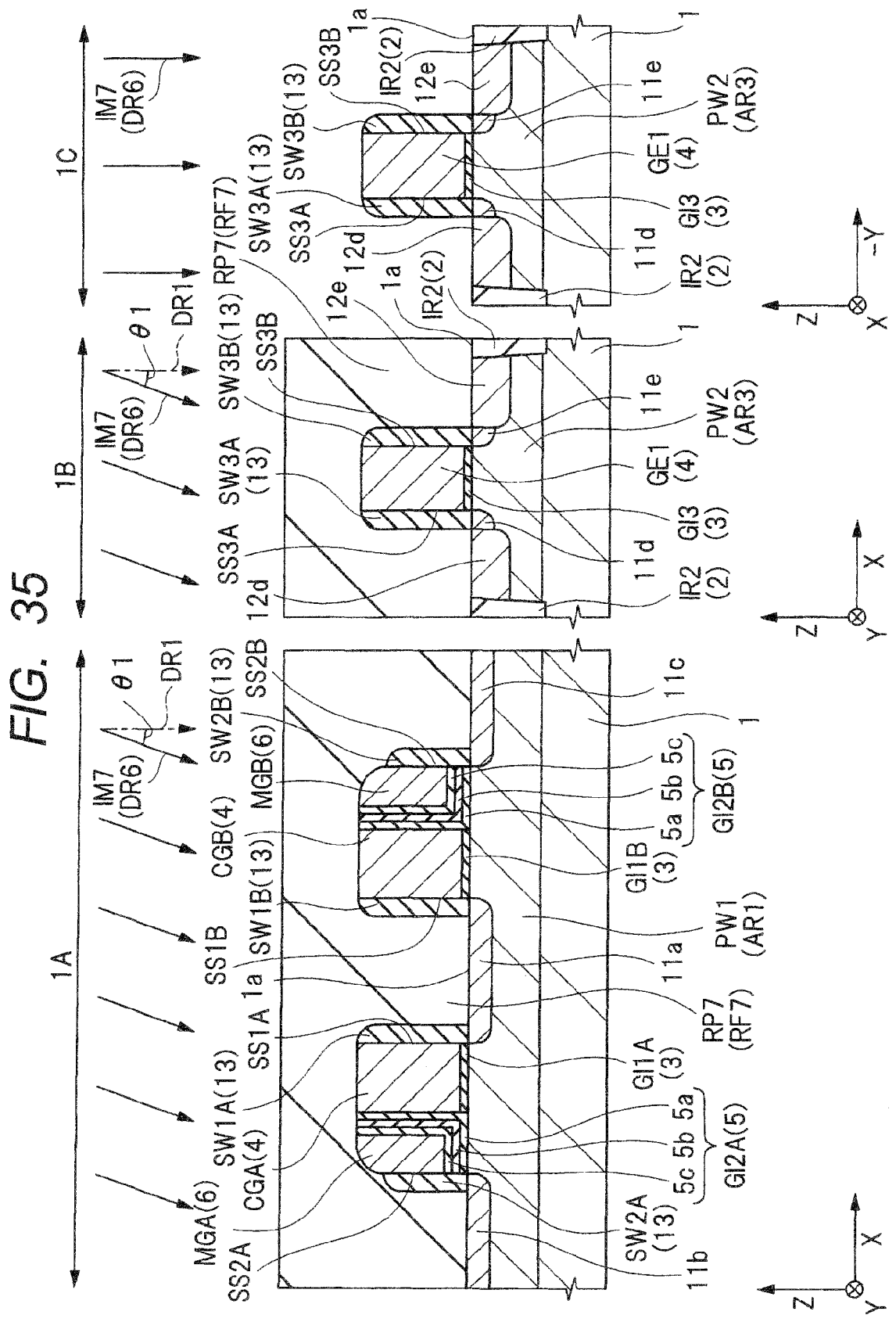
FIG. 35 is a main-portion cross-sectional view of the semiconductor device in Embodiment 2 during the manufacturing process thereof.
Figure 36:
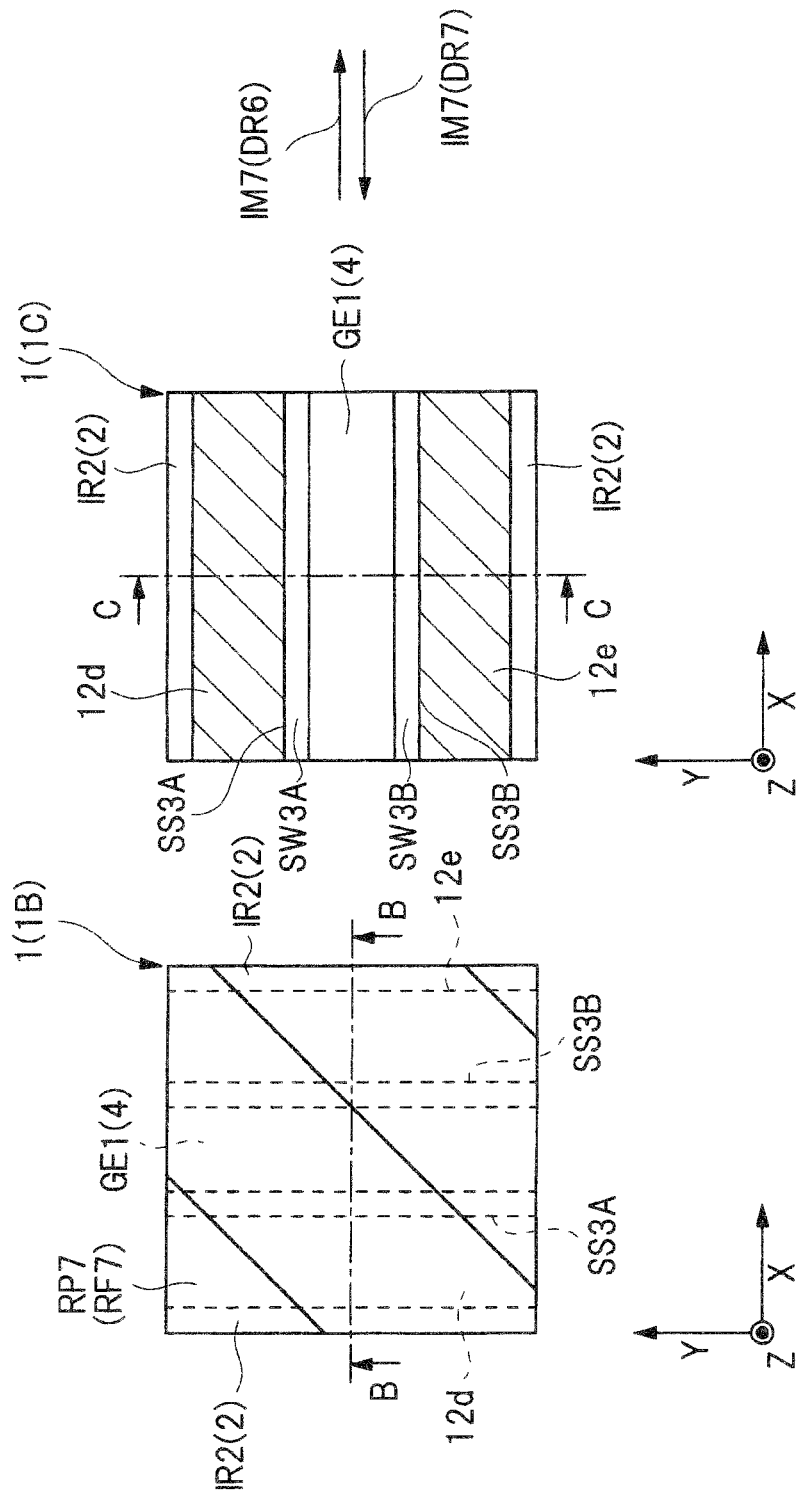
FIG. 36 is a main-portion cross-sectional view of the semiconductor device in Embodiment 2 during the manufacturing process thereof.

In Step S13, next, as shown in FIGS. 35 and 36, impurity ions are implanted into the p-type well PW2 in the peripheral circuit region 1C (Step S32 in FIG. 31).

In Step S32, first, a resist film RF7 is formed so as to cover the entire main surface 1a of the semiconductor substrate 1. Then, from the peripheral circuit region 1C, the resist film RF7 is removed to form a resist pattern RP7 made of the portion of the resist film RF7 which is left in the memory cell region 1A and the peripheral circuit region 1B. At this time, the n$^-$-type semiconductor regions 11a, 11b, and 11c in the memory cell region 1A and the n$^-$-type semiconductor regions 11d and 11e and the n$^+$-type semiconductor regions 12d and 12e in the peripheral circuit region 1B are covered with the resist film RF7.

In Step S32, next, in a state where the main surface 1a of the semiconductor substrate 1 located in the memory cell region 1A and the peripheral circuit region 1B is covered with the resist film RF7, using the resist pattern RP7 as a mask, n-type impurity ions IM7 such as, e.g., arsenic (As) or phosphorus (P) ions are implanted. At this time, in the peripheral circuit region 1C, using the gate electrode GE1 and the sidewall spacers SW3A and SW3B as a mask, the n-type impurity ions IM7 are implanted into the semiconductor substrate 1.

As a result, in the peripheral circuit region 1C, the n$^+$-type semiconductor region 12d is formed by self-alignment with the side surface of the sidewall spacer SW3A formed over the side surface SS3A of the gate electrode GE1, and the n$^+$-type semiconductor region 12e is formed by self-alignment with the side surface of the sidewall spacer SW3B formed over the side surface SS3B of the gate electrode GE1.

That is, in the peripheral circuit region 1C, the n$^+$-type semiconductor region 12d is formed in the upper-layer portion of the part of the p-type well PW2 which is located opposite to the gate electrode GE1 relative to the sidewall spacer SW3A interposed therebetween. Also, in the peripheral circuit region 1C, the n$^+$-type semiconductor region 12e is formed in the upper-layer portion of the part of the p-type well PW2 which is located opposite to the gate electrode GE1 relative to the sidewall spacer SW3b interposed therebetween. Then, the resist pattern RP7 is removed.

Preferably, as shown in FIGS. 35 and 36, the impurity ions IM7 are implanted from a direction DR6 inclined relative to the direction DR1 perpendicular to the main surface 1a of the semiconductor substrate 1 in the gate width direction (X-axis direction).

As a result, even when the side surface of the sidewall spacer SW3A has surface roughness in a depth direction corresponding to the gate length direction (Y-axis direction) in the peripheral circuit region 1C, it is possible to reduce variations in the position of the end portion of the n$^+$-type semiconductor region 12d closer to the gate electrode GE1 in the gate length direction (Y-axis direction) among different positions in the gate width direction (X-axis direction). Also, even when the side surface of the sidewall spacer SW3B has surface roughness in a depth direction corresponding to the gate length direction (Y-axis direction) in the peripheral circuit region 1C, it is possible to reduce variations in the position of the end portion of the n$^+$-type semiconductor region 12e closer to the gate electrode GE1 in the gate length direction (Y-axis direction) among different positions in the gate width direction (X-axis direction).

Note that, similarly to Step S22 in FIG. 10, Step S32 may also include the step of implanting the impurity ions IM7 made of phosphorus (P) from the direction DR6 inclined relative to the direction DR1 perpendicular to the main surface 1a of the semiconductor substrate 1 in the gate width direction (X-axis direction), and the step of implanting the impurity ions IM7 made of arsenic (As) from the direction DR1 perpendicular to the main surface 1a of the semiconductor substrate 1.

More preferably, in the same manner as described using FIGS. 24 to 26 in Embodiment 1, impurity ions can be implanted from two different directions. That is, as shown in FIGS. 35 and 36, it is possible to perform the step of implanting impurity ions from the direction DR6 inclined relative to and on one side the direction DR1 perpendicular to the main surface 1a of the semiconductor substrate 1 in the gate width direction (X-axis direction), and the step of implanting impurity ions from a direction DR7 inclined relative to and on the side of the direction DR1 opposite to the one side in the gate width direction (X-axis direction).

By doing so, even when the indentations formed on the side surface of the sidewall spacer SW3A have asymmetrical shapes relative to a plane (YZ-plane) perpendicular to the gate width direction (X-axis direction), it is possible to reduce variations in the position of the end portion of the n$^+$-type semiconductor region 12d closer to the gate electrode GE1 in the gate length direction (Y-axis direction) among different positions in the gate width direction. Also, even when the indentations formed on the side surface of the sidewall spacer SW3B have asymmetrical shapes relative to the plane (YZ-plane) perpendicular to the gate width direction (X-axis direction), it is possible to reduce variations in the position of the end portion of the n$^+$-type semiconductor region 12e closer to the gate electrode GE1 in the gate length direction (Y-axis direction) among different positions in the gate width direction.

Note that the angle formed between the directions DR6 and DR1 can be set similarly to the angle θ1 formed between the directions DR2 and DR1 described using FIG. 25. The angle formed between the directions DR7 and DR1 can be set similarly to the angle θ2 formed between the directions DR3 and DR1 described using FIG. 26.

Figure 37:
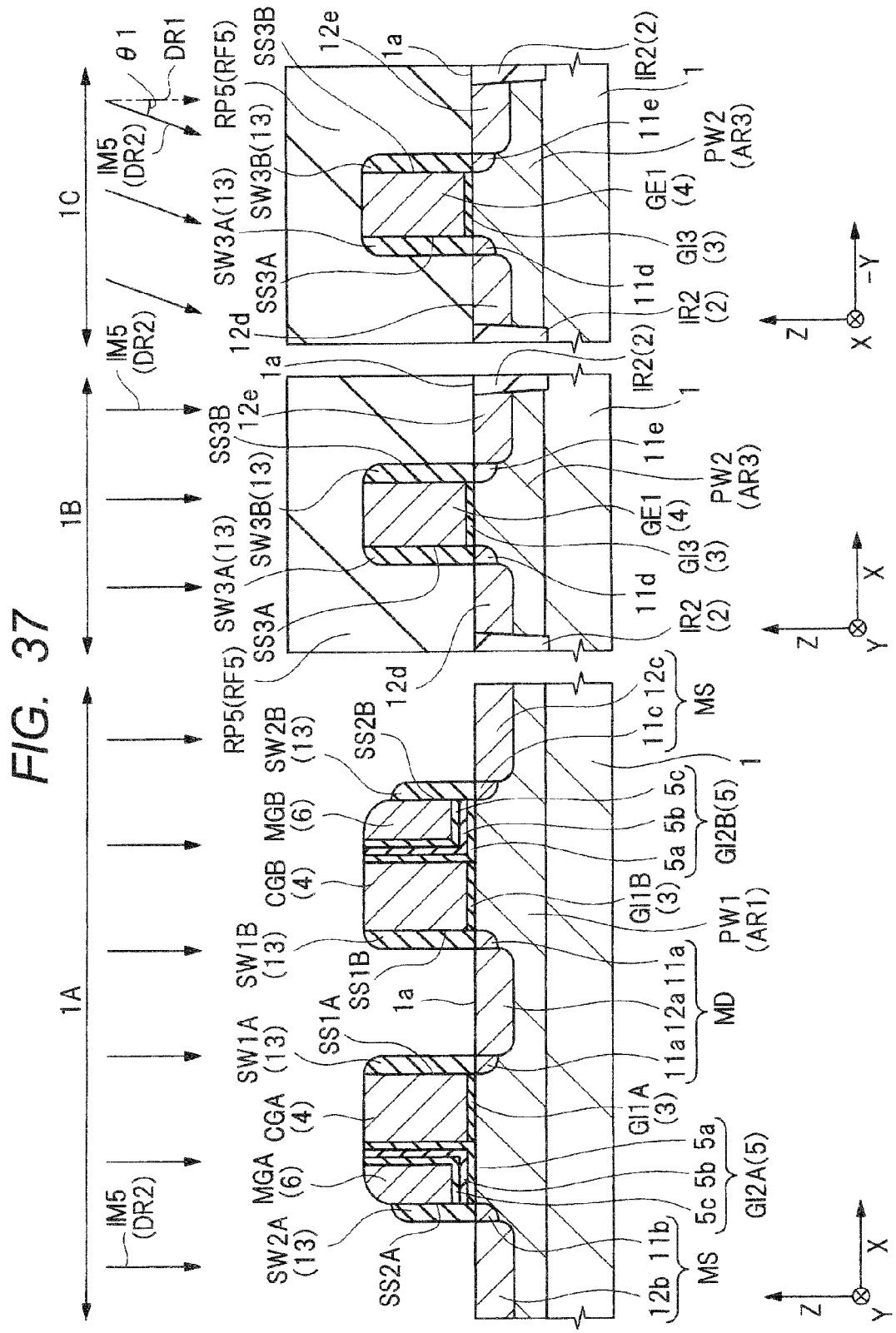
FIG. 37 is a main-portion cross-sectional view of the semiconductor device in Embodiment 2 during the manufacturing process thereof.

In Step S13, next, the same step as Step S22 in FIG. 10 is performed to implant impurity ions into the p-type well PW1 in the memory cell region 1A, as shown in FIG. 37 (Step S33 in FIG. 31).

Figure 38:
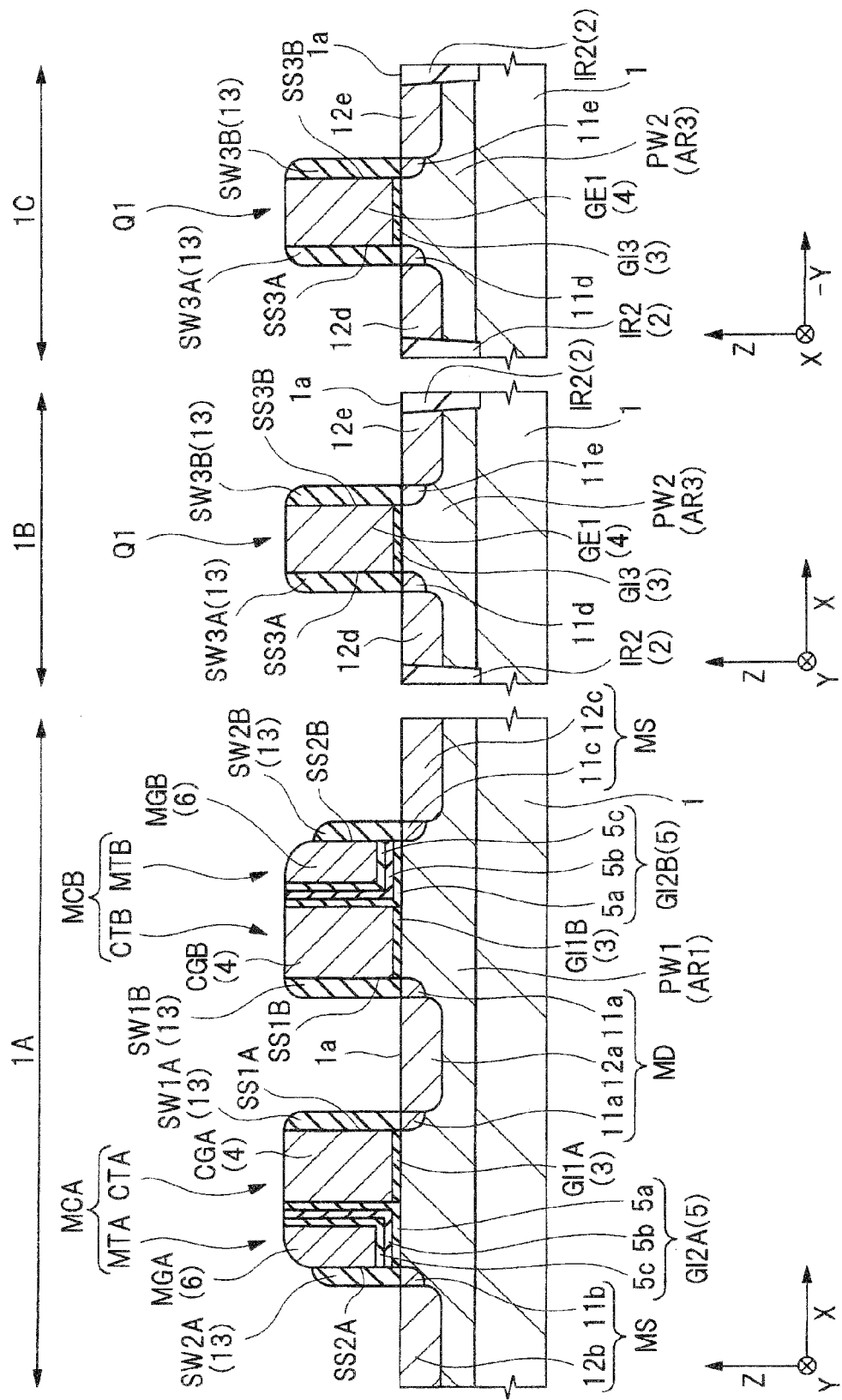
FIG. 38 is a main-portion cross-sectional view of the semiconductor device in Embodiment 2 during the manufacturing process thereof.

Then, activation anneal as heat treatment for activating the impurities introduced into the n$^-$-type semiconductor regions 11a, 11b, 11c, 11d, and 11e, the n$^+$-type semiconductor regions 12a, 12b, 12c, 12d, and 12e, and the like is performed. Thus, as shown in FIG. 38, in the memory cell region 1A, the memory cells MCA and MCB as nonvolatile memories are formed while, in each of the peripheral circuit regions 1B and 1C, the MISFET Q1 is formed.

Note that the step of implanting impurity ions in the memory cell region 1A, the step of implanting impurity ions in the peripheral circuit region 1B, and the step of implanting impurity ions in the peripheral circuit region 1C may also be performed in any order.

Then, in the same manner as in Embodiment 1, Steps S14 to S16 in FIG. 9 are performed to thus manufacture the semiconductor device in Embodiment 2.

<About Position of End Portion of n$^-$-Type Semiconductor Region>

Next, the position of the end portion of the n$^-$-type semiconductor region 12d closer to the gate electrode GE1 when each of the side surfaces of the sidewall spacers SW3A and SW3B has surface roughness in a depth direction corresponding to the gate length direction in the peripheral circuit region 1B will be described in comparison to that in the method of manufacturing the semiconductor device in Embodiment 1. Note that the same applies also to the peripheral circuit region 1C, though the description thereof is omitted below.

Figure 39:
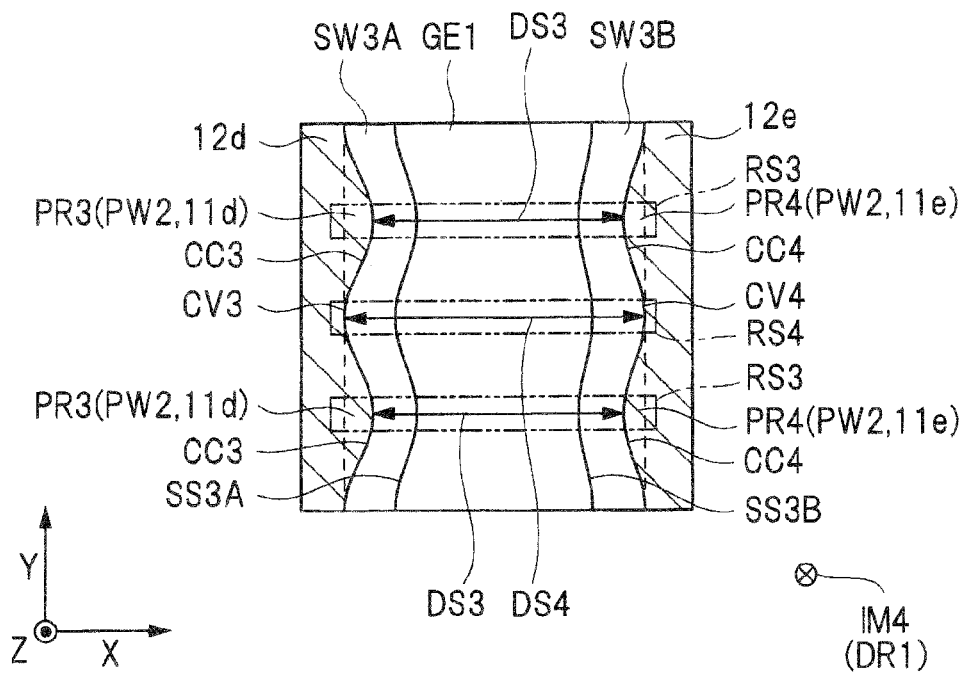
FIG. 39 is a main-portion plan view of the semiconductor device in Embodiment 1 during the manufacturing process thereof.
Figure 40:
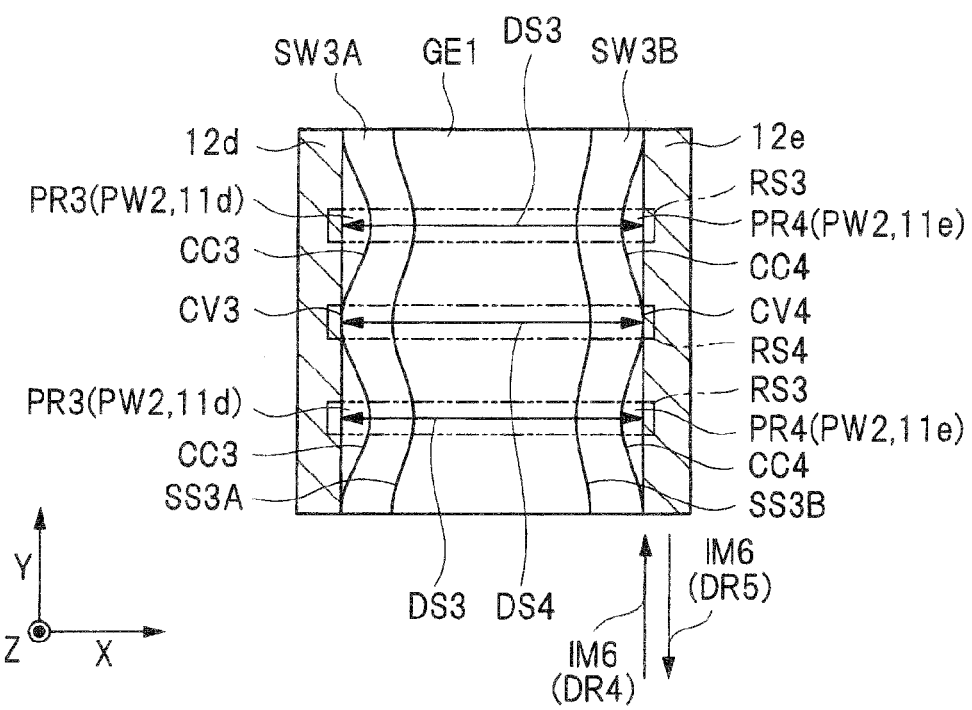
FIG. 40 is a main-portion plan view of the semiconductor device in Embodiment 2 during the manufacturing process thereof.

FIG. 39 is a main-portion plan view of the semiconductor device in Embodiment 1 during the manufacturing process thereof. FIG. 40 is a main-portion plan view of the semiconductor device in Embodiment 2 during the manufacturing process thereof. FIGS. 39 and 40 show the periphery of the gate electrode GE1 in enlarged relation. In FIG. 39, the region into which the impurity ions IM4 are implanted is hatched. In FIG. 40, the region into which the impurity ions IM6 are implanted is hatched.

In the manufacturing process of the semiconductor device in Embodiment 1, when a step corresponding to the step described using FIG. 22, which is a part of a step corresponding to Step S13 in FIG. 9, is performed, the impurity ions IM4 are implanted from the direction DR1 perpendicular to the main surface 1a of the semiconductor substrate 1.

In such a case, when the side surface of the sidewall spacer SW3A is not flat but have recessed portions CC3 each formed in a depth direction corresponding to the gate length direction (X-axis direction) as shown in FIG. 39, the impurity ions IM4 are implanted also into the p-type well PW2 of each of portions PR3 overlapping the recessed portions CC3 in plan view, i.e., into the $n^-$-type semiconductor region 11d. Also, when the side surface of the sidewall spacer SW3A is not flat but have recessed portions CC4 each formed in a depth direction corresponding to the gate length direction (X-axis direction), the impurity ions IM4 are implanted also into the p-type well PW2 of each of portions PR4 overlapping the recessed portions CC4 in plan view, i.e., into the $n^-$-type semiconductor region 11e.

A consideration will be given to a case where, e.g., as shown in FIG. 39, the recessed portions CC3 and the recessed portions CC4 face each other and a protruding portion CV3 and a protruding portion CV4 face each other. Here, the regions where the recessed portions CC3 and CC4 face each other and the gate length is locally shorter are referred to regions RS3, and the region where the protruding portions CV3 and CV4 face each other and the gate length is locally longer is referred to as a region RS4. It is also assumed that the distance between the $n^+$-type semiconductor regions 12d and 12e in the gate length direction (X-axis direction) in each of the regions RS3 is a distance DS3 and the distance between the $n^+$-type semiconductor regions 12d and 12e in the gate length direction (X-axis direction) in the region RS4 is a distance DS4. In such a case, in Embodiment 1, the distance DS3 is smaller than the distance DS4.

On the other hand, in the manufacturing process of the semiconductor device in Embodiment 2, when the step (Step S31 in FIG. 31) described using FIGS. 33 and 34 is performed, the impurity ions IM6 are implanted from the direction DR4 inclined relative to the direction DR1 perpendicular to the main surface 1a of the semiconductor substrate 1 in the gate width direction (Y-axis direction).

As shown in FIG. 40, when the side surface of the sidewall spacer SW3A is not flat but have the recessed portions CC3 formed in a depth direction corresponding to the gate length direction (X-axis direction), the impurity ions IM6 are not implanted into the p-type well PW2 of each of the portions PR3 overlapping the recessed portions CC3 in plan view, i.e., into the $n^-$-type semiconductor region 11d. Also, when the side surface of the sidewall spacer SW3B is not flat but have the recessed portions CC4 formed in a depth direction corresponding to the gate length direction (X-axis direction), the impurity ions IM6 are not implanted into the p-type well PW2 of each of the portions PR4 overlapping the recessed portions CC4 in plan view, i.e., into the $n^-$-type semiconductor region 11e.

In the same manner as in FIG. 39, as shown in FIG. 40, the regions where the recessed portions CC3 and CC4 face each other in the gate length direction (X-axis direction) and the gate length is locally shorter are assumed to be the regions RS3. On the other hand, the region where the protruding portions CV3 and CV4 face each other in the gate length direction (X-axis direction) and the gate length is locally longer is assumed to be the region RS4. It is also assumed that the distance between the $n^+$-type semiconductor regions 12d and 12e in the gate length direction (X-axis direction) in each of the regions RS3 is the distance DS3 and the distance between the $n^+$-type semiconductor regions 12d and 12e in the gate length direction (X-axis direction) in the region RS4 is the distance DS4. In such a case, in Embodiment 2, the distance DS3 can be set equal to the distance DS4. That is, in Embodiment 2, even in the peripheral circuit region 1B, impurity ions are implanted from the direction DR4 inclined in the gate width direction (Y-axis direction) to prevent the surface roughness of the side surfaces of the sidewall spacers SW3A and SW3B from affecting the positions of the end portions of the $n^+$-type semiconductor regions 12d and 12e.

Consequently, even in the region where the gate length is locally shorter such as, e.g., the region RS3 shown in FIG. 40, it is possible to prevent or inhibit the distance between the $n^+$-type semiconductor regions 12d and 12e, i.e., the effective gate length from being locally shortened. Therefore, it is possible to suppress a short-channel effect in which, in the MISFET Q1 (see FIG. 38), a punch-through is likely to occur as a result of a reduction in effective gate length. This can reduce variations in threshold voltage among the plurality of MISFETs Q1.

Also, in Embodiment 2, Step S13 includes Step S31 of implanting impurity ions into the p-type well PW2 located on both sides of the gate electrode GE1 extending in the Y-axis direction in plan view, and Step S32 of implanting impurity ions into the p-type well PW2 located on both sides of the gate electrode GE1 extending in the X-axis direction in plan view.

In each of Steps S31 and S32, in each of a plurality of regions where the gate electrodes GE1 extend in different directions in plan view, impurity ions are implanted from a direction inclined relative to the direction DR1 perpendicular to the main surface 1a of the semiconductor substrate 1 in the gate width direction in each of the regions. In the region into which the impurity ions are implanted, a direction obtained by projecting the direction from which the impurity ions are implanted on the main surface 1a of the semiconductor substrate 1 is parallel with the direction in which the gate electrode GE extends. On the other hand, in the region other than the region into which the impurity ions are implanted, i.e., in the region where the gate electrode GE1 extends in a direction crossing the direction obtained by projecting the direction from which the impurity ions are implanted on the main surface 1a of the semiconductor substrate 1, the main surface 1a of the semiconductor substrate 1 is covered with a resist film.

As a result, in either of the region where the gate electrode GE extending in a given direction is placed and the region where the gate electrode GE1 extending in a direction crossing the given direction is placed, it is possible to prevent or inhibit the distance between the $n^+$-type semiconductor regions 12d and 12e in the gate length direction from being locally reduced.

<Main Characteristic Features and Effects of Embodiment 2>

In Embodiment 2 also, in the same manner as in Embodiment 1, in the manufacturing process of the semiconductor device including the split-gate memory cell MCA, using the control gate electrode CGA and the memory gate electrode MGA which are formed over the semiconductor substrate 1 as a mask, n-type impurity ions are implanted from the direction DR1 perpendicular to the main surface 1a of the semiconductor substrate 1. Then, using the control gate electrode CGA, the memory gate electrode MGA, and the sidewall spacers SW1A and SW2A as a mask, from the direction DR2 inclined relative to the direction DR1 perpendicular to the main surface 1a of the semiconductor substrate 1, the n-type impurity ions IM5 are implanted.

This achieves the same effects as achieved in Embodiment 1, such as allowing prevention or inhibition of a local reduction in the distance between the n$^+$-type semiconductor regions 12a and 12b in the gate length direction in the memory cell MCA.

On the other hand, in Embodiment 2, unlike in Embodiment 1, in the peripheral circuit region 1B also, using the gate electrode GE1 and the sidewall spacers SW2A and SW3B as a mask, the n-type impurity ions IM6 are implanted from the direction DR4 inclined relative to the direction DR1 perpendicular to the main surface 1a of the semiconductor substrate 1 in the gate width direction.

This can prevent the surface roughness of the side surfaces of the sidewall spacers SW3A and SW3B from affecting the positions of the end portions of the n$^+$-type semiconductor regions 12d and 12e. That is, even when the side surfaces of the sidewall spacers SW3A and SW3B have surface roughness in the MISFET Q1, it is possible to inhibit or prevent the distance between the n$^+$-type semiconductor regions 12d and 12e in the gate length direction from being locally reduced and suppress a short-channel effect. Therefore, it is possible to reduce variations in threshold voltage among the plurality of MISFETs Q1 formed in the peripheral circuit region 1B.

Note that, in Embodiment 2, the description has been given of the example in which, when the source region or the drain region is formed by self-alignment with the sidewall formed over the side surface of the gate electrode in the MISFET, impurity ions are implanted from a direction inclined relative to a direction perpendicular to the main surface of the semiconductor substrate in the gate width direction. Likewise, when a source region or a drain region is formed by self-alignment with a sidewall formed over a side surface of a gate electrode in a floating-type memory cell having a structure similar to that of a MISFET also, impurity ions can be implanted from a direction inclined relative to a direction perpendicular to the main surface of a semiconductor substrate in the gate width direction.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising the steps of:
    (a) providing a semiconductor substrate;
    (b) forming a first gate electrode over a first main surface of the semiconductor substrate via a first gate insulating film;
    (c) forming a first insulating film having an internal charge storage portion over the first main surface of the semiconductor substrate and a top surface of the first gate electrode;
    (d) forming a first conductive film over the first insulating film;
    (e) etching back the first conductive film to leave the first conductive film over a first side surface of the first gate electrode via the first insulating film and thus form a second gate electrode;
    (f) removing a part of the first insulating film which is uncovered with the second gate electrode to leave the first insulating film between the second gate electrode and the semiconductor substrate and between the first and second gate electrodes;
    (g) after the step (f), implanting first impurity ions having a first conductivity type into the semiconductor substrate using the first and second gate electrodes as a mask;
    (h) after the step (g), forming a first sidewall spacer made of a second insulating film over a second side surface of the first gate electrode opposite to the first side surface and forming a second sidewall spacer made of a third insulating film over a third side surface of the second gate electrode opposite to a side surface thereof closer to the first gate electrode; and
    (i) implanting second impurity ions having the first conductivity type into the semiconductor substrate using the first and second gate electrodes and the first and second sidewall spacers as a mask,
    wherein, in the step (g), the first impurity ions are implanted from a first direction perpendicular to the first main surface of the semiconductor substrate, and
    wherein, in the step (i), the second impurity ions are implanted from a second direction inclined relative to the first direction.

2. The method of manufacturing the semiconductor device according to claim 1,
    wherein, in the step (b), the first gate electrode is formed to extend in a third direction in plan view,
    wherein, in the step (e), the second gate electrode is formed over the first side surface located on a first side of the first gate electrode in a fourth direction crossing the third direction in plan view to extend in the third direction, and
    wherein, in the step (i), the second impurity ions are implanted from the second direction inclined relative to the first direction in the third direction.

3. The method of manufacturing the semiconductor device according to claim 2,
    wherein the step (i) includes the steps of:
    (i1) implanting the second impurity ions from the second direction inclined relative to and on a second side of the first direction in the third direction; and
    (i2) implanting the second impurity ions from a fifth direction inclined relative to and on a side of the first direction opposite to the second side in the third direction.

4. The method of manufacturing the semiconductor device according to claim 1,
    wherein the first conductivity type is an n-type conductivity type, and
    wherein the step (i) includes the steps of:
    (i3) implanting the second impurity ions made of phosphorus from the second direction, and
    (i4) implanting third impurity ions made of arsenic from the first direction.

5. The method of manufacturing the semiconductor device according to claim 1,
    wherein, in the step (b), the first gate electrode is formed over a first region of the first main surface of the semiconductor substrate,
    wherein, in the step (c), the first insulating film is formed over the first region, wherein, in the step (g), the first impurity ions are implanted into the first region, and wherein, in the step (i), the second impurity ions are implanted into the first region, the method of manufacturing the semiconductor device further comprising the steps of:

(j) forming a third gate electrode over a second region of the first main surface of the semiconductor substrate via a second gate insulating film;

(k) implanting fourth impurity ions having a second conductivity type into the second region of the semiconductor substrate using the third gate electrode as a mask;

(l) after the step (k), forming a third sidewall spacer made of a fourth insulating film over a fourth side surface of the third gate electrode and forming a fourth sidewall spacer made of a fifth insulating film over a fifth side surface of the third gate electrode opposite to the fourth side surface; and (m) implanting fifth impurity ions having the second conductivity type into the second region of the semiconductor substrate using the third gate electrode, the third sidewall spacer, and the fourth sidewall spacer as a mask, wherein, in the step (k), the fourth impurity ions are implanted from the first direction.

6. The method of manufacturing the semiconductor device according to claim 5, wherein, in the step (m), the fifth impurity ions are implanted from the first direction.

7. The method of manufacturing the semiconductor device according to claim 5, wherein, in the step (j), the third gate electrode is formed to extend in a sixth direction in plan view, and wherein, in the step (m), the fifth impurity ions are implanted from a seventh direction inclined relative to the first direction in the sixth direction.

8. The method of manufacturing the semiconductor device according to claim 7, wherein the step (m) includes the steps of:

(m1) implanting the fifth impurity ions from the seventh direction inclined relative to and on a third side of the first direction in the sixth direction; and (m2) implanting the fifth impurity ions from an eighth direction inclined relative to and on a side of the first direction opposite to the third side in the sixth direction.

9. The method of manufacturing the semiconductor device according to claim 7, further comprising the steps of:

(n) forming a fourth gate electrode over a third region of the first main surface of the semiconductor substrate via a third gate insulating film;

(o) implanting sixth impurity ions having a third conductivity type into the third region of the semiconductor substrate using the fourth gate electrode as a mask;

(p) after the step (o), forming a fifth sidewall spacer made of a sixth insulating film over a sixth side surface of the fourth gate electrode and forming a sixth sidewall spacer made of a seventh insulating film over a seventh side surface of the fourth gate electrode opposite to the sixth side surface; and (q) implanting seventh impurity ions having the third conductivity type into the third region of the semiconductor substrate using the fourth gate electrode and the fifth and sixth sidewall spacers as a mask, wherein, in the step (n), the fourth gate electrode is formed to extend in a ninth direction crossing the sixth direction in plan view, wherein the step (m) includes the steps of:

(m3) after the step (p), forming a first mask film so as to cover the third region of the first main surface of the semiconductor substrate therewith; and (m4) implanting the fifth impurity ions into the second region of the semiconductor substrate using the third gate electrode and the third and fourth sidewall spacers as a mask in a state where the third region of the first main surface of the semiconductor substrate is covered with the first mask film, wherein the step (q) includes the steps of:

(q1) after the step (l), forming a second mask film so as to cover the second region of the first main surface of the semiconductor substrate therewith; and (q2) implanting the seventh impurity ions into the third region of the semiconductor substrate using the fourth gate electrode and the fifth and sixth sidewall spacers as a mask in a state where the second region of the first main surface of the semiconductor substrate is covered with the second mask film, and wherein, in the step (q2), the seventh impurity ions are implanted from a tenth direction inclined relative to the first direction in the ninth direction.

10. The method of manufacturing the semiconductor device according to claim 9, wherein the step (q2) includes the steps of:

(q3) implanting the seventh impurity ions from the tenth direction inclined relative to and on a fourth side of the first direction in the ninth direction; and (q4) implanting the seventh impurity ions from an eleventh direction inclined relative to and on a side of the first direction opposite to the fourth side in the ninth direction.

11. The method of manufacturing the semiconductor device according to claim 5, wherein, in the step (a), the semiconductor substrate having a sixth semiconductor region having a fifth conductivity type opposite to the second conductivity type and formed in the second region of the first main surface is provided, wherein, in the step (j), the third gate electrode is formed over the sixth semiconductor region via the second gate insulating film, wherein, in the step (k), a seventh semiconductor region having the second conductivity type is formed in an upper-layer portion of a part of the sixth semiconductor region which is located on a fifth side of the third gate electrode, and an eighth semiconductor region having the second conductivity type is formed in an upper-layer portion of a part of the sixth semiconductor region which is located on a side of the third gate electrode opposite to the fifth side, wherein, in the step (m), a ninth semiconductor region having the second conductivity type is formed in an upper-layer portion of a part of the sixth semiconductor region which is located opposite to the third gate electrode relative to the third sidewall spacer interposed therebetween, and a tenth semiconductor region having the second conductivity type is formed in an upper-layer portion of a part of the sixth semiconductor region which is located opposite to the third gate electrode relative to the fourth sidewall spacer interposed therebetween, wherein the ninth semiconductor region is in contact with the seventh semiconductor region, wherein the tenth semiconductor region is in contact with the eighth semiconductor region, wherein an impurity concentration of the second conductivity type in the ninth semiconductor region is higher than an impurity concentration of the second conductivity type in the seventh semiconductor region, and wherein an impurity concentration of the second conductivity type in the tenth semiconductor region is higher than an impurity concentration of the second conductivity type in the eighth semiconductor region.

12. The method of manufacturing the semiconductor device according to claim 1, wherein, in the step (a), the semiconductor substrate having a first semiconductor region having a fourth conductivity type opposite to the first conductivity type and formed in the first main surface is provided, wherein, in the step (b), the first gate electrode is formed over the first semiconductor region via the firs gate insulating film, wherein, in the step (g), a second semiconductor region having the first conductivity type is formed in an upper-layer portion of a part of the first semiconductor region which is located opposite to the second gate electrode relative to the first gate electrode interposed therebetween, and a third semiconductor region having the first conductivity type is formed in an upper-layer portion of a part of the first semiconductor region which is located opposite to the first gate electrode relative to the second gate electrode interposed therebetween, wherein, in the step (i), a fourth semiconductor region having the first conductivity type is formed in an upper-layer portion of a part of the first semiconductor region which is located opposite to the first gate electrode relative to the first sidewall spacer interposed therebetween, and a fifth semiconductor region having the first conductivity type is formed in an upper-layer portion of a part of the first semiconductor region which is located opposite to the second gate electrode relative to the second sidewall spacer interposed therebetween, wherein the fourth semiconductor region is in contact with the second semiconductor region, wherein the fifth semiconductor region is in contact with the third semiconductor region, wherein an impurity concentration of the first conductivity type in the fourth semiconductor region is higher than an impurity concentration of the first conductivity type in the second semiconductor region, and wherein an impurity concentration of the first conductivity type in the fifth semiconductor region is higher than an impurity concentration of the first conductivity type in the third semiconductor region.

13. The method of manufacturing the semiconductor device according to claim 1, wherein, in the step (f), a fourth gate insulating film including respective parts of the first insulating film which are left between the second gate electrode and the semiconductor substrate and between the first and second gate electrodes is formed.

14. The method of manufacturing the semiconductor device according to claim 1, wherein the first insulating film includes a first silicon dioxide film, a first silicon nitride film over the first silicon dioxide film, and a second silicon dioxide film over the first silicon nitride film, and wherein the step (c) includes the steps of:

(c1) forming the first silicon dioxide film over the first main surface of the semiconductor substrate and the top surface of the first gate electrode;

(c2) forming the first silicon nitride film over the first silicon dioxide film; and (c3) forming the second silicon dioxide film over the first silicon nitride film.

15. The method of manufacturing the semiconductor device according to claim 1, wherein the semiconductor device includes a nonvolatile memory, and wherein the nonvolatile memory is formed of the first and second gate electrodes.

\* \* \* \* \*